(12) United States Patent
Ahn

(10) Patent No.: US 12,230,737 B2
(45) Date of Patent: Feb. 18, 2025

(54) DISPLAY DEVICE AND METHOD OF REPAIRING THE SAME

(71) Applicant: Samsung Display Co., LTD., Yongin-si (KR)

(72) Inventor: Ho Kyun Ahn, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 549 days.

(21) Appl. No.: 17/550,416

(22) Filed: Dec. 14, 2021

(65) Prior Publication Data

US 2022/0293822 A1    Sep. 15, 2022

(30) Foreign Application Priority Data

Mar. 11, 2021    (KR) .................... 10-2021-0031851

(51) Int. Cl.
*H01L 33/38* (2010.01)
*G09G 3/32* (2016.01)
(Continued)

(52) U.S. Cl.
CPC .............. *H01L 33/382* (2013.01); *G09G 3/32* (2013.01); *H01L 27/156* (2013.01);
(Continued)

(58) Field of Classification Search
CPC .............. H01L 25/0753; H01L 27/1244; H01L 27/156; H01L 33/62; H01L 2933/0016;
(Continued)

(56) References Cited

U.S. PATENT DOCUMENTS

2019/0157340 A1    5/2019 Liao et al.
2019/0279972 A1    9/2019 Lin et al.
(Continued)

FOREIGN PATENT DOCUMENTS

KR    10-2020-0079379    7/2020
KR    10-2020-0091347    7/2020
(Continued)

OTHER PUBLICATIONS

International Search Report corresponding to International Application No. PCT/KR2022/003197 dated Jun. 14, 2022.
(Continued)

*Primary Examiner* — Fazli Erdem
*Assistant Examiner* — Alden Tennison
(74) *Attorney, Agent, or Firm* — KILE PARK REED & HOUTTEMAN PLLC

(57) ABSTRACT

A display device includes a first pixel disposed in a display area, wherein the first pixel includes first and second electrodes disposed in the display area and spaced apart from each other; a first light emitting element group including light emitting elements disposed between the first electrode and the second electrode; a first contact electrode disposed on the first electrode and connected to the light emitting elements; a second contact electrode disposed on the second
(Continued)

electrode and connected to the light emitting elements; a first electrode contact portion disposed on the first electrode and connected to the first electrode; a second electrode contact portion disposed on the second electrode and connected to the second electrode; a first repair pattern connecting the second contact electrode and the first electrode contact portion; and a second repair pattern connecting the first contact electrode and the second electrode contact portion.

16 Claims, 25 Drawing Sheets

(51) Int. Cl.
    *G09G 3/3233*     (2016.01)
    *H01L 25/075*     (2006.01)
    *H01L 27/12*     (2006.01)
    *H01L 27/15*     (2006.01)
    *H01L 33/00*     (2010.01)
    *H01L 33/62*     (2010.01)

(52) U.S. Cl.
    CPC ............ *H01L 33/005* (2013.01); *H01L 33/62* (2013.01); *G09G 2300/0426* (2013.01); *G09G 2300/0842* (2013.01); *G09G 2330/08* (2013.01); *H01L 2933/0016* (2013.01); *H01L 2933/0066* (2013.01)

(58) Field of Classification Search
CPC .... H01L 2933/0066; G09G 2300/0426; G09G 2330/08; G09G 2330/10
See application file for complete search history.

(56) References Cited

U.S. PATENT DOCUMENTS

| | | |
|---|---|---|
| 2020/0119055 A1 | 4/2020 | Zhao et al. |
| 2020/0235128 A1 | 7/2020 | Shin et al. |
| 2021/0057610 A1 | 2/2021 | Yang et al. |
| 2022/0077227 A1 | 3/2022 | Kang et al. |
| 2022/0149079 A1 | 5/2022 | Kang et al. |

FOREIGN PATENT DOCUMENTS

| | | | | |
|---|---|---|---|---|
| KR | 10-2020-0098767 | | 8/2020 | |
| WO | WO-2020017719 A1 | * | 1/2020 | ......... H01L 25/0753 |
| WO | WO-2020032335 A1 | * | 2/2020 | ............... G09G 3/32 |
| WO | 2021/071148 | | 4/2021 | |

OTHER PUBLICATIONS

Written Opinion corresponding to International Application No. PCT/KR2022/003197, dated Jun. 14, 2022.

* cited by examiner

ED: ED2

ED: ED1, ED2
EDG1_1: SEDG1, SEDG2, SEDG3, SEDG4

ED: ED1, ED2
EDG2_1: SEDG1_D, SEDG2, SEDG3, SEDG4

DISPLAY DEVICE AND METHOD OF REPAIRING THE SAME

CROSS-REFERENCE TO RELATED APPLICATION(S)

This application claims priority to and the benefit of Korean Patent Application No. 10-2021-0031851 under 35 U.S.C. § 119, filed on Mar. 11, 2021, in the Korean Intellectual Property Office (KIPO), the entire contents of which are incorporated herein by reference.

BACKGROUND

1. Technical Field

The disclosure relates to a display device and a method of repairing the same.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a light emitting material and an inorganic light emitting diode using an inorganic material as a light emitting material.

SUMMARY

Aspects of the disclosure provide a display device whose display quality is improved by repairing a defective pixel in which a plurality of light emitting elements are misaligned by changing a current direction in the defective pixel.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, there is provided a display device comprising a substrate including a display area and a non-display area; and a first pixel disposed in the display area. The first pixel may include a first electrode and a second electrode disposed in the display area and spaced apart from each other; a first light emitting element group including a plurality of light emitting elements disposed between the first electrode and the second electrode; a first contact electrode disposed on the first electrode and electrically connected to an end of each of the plurality of light emitting elements; a second contact electrode disposed on the second electrode and electrically connected to another end of each of the plurality of light emitting elements; a first electrode contact portion disposed on the first electrode and electrically connected to the first electrode; a second electrode contact portion disposed on a second electrode and electrically connected to the second electrode; a first repair pattern electrically connecting the second contact electrode and the first electrode contact portion; and a second repair pattern electrically connecting the first contact electrode and the second electrode contact portion.

Each of the plurality of light emitting elements of the first light emitting element group may include a first semiconductor layer disposed at a first end of the each of the plurality of light emitting elements; a second semiconductor layer spaced apart from the first semiconductor layer and is disposed at a second end of the each of the plurality of light emitting elements; and an element active layer disposed between the first semiconductor layer and the second semiconductor layer.

The plurality of light emitting elements may be aligned such that the first end of each of the plurality of light emitting elements is oriented in a same direction.

The display device may further comprise a second pixel disposed in the display area. The second pixel may include a third electrode and a fourth electrode disposed in the display area and spaced apart from each other; a second light emitting element group including a plurality of light emitting elements disposed between the third electrode and the fourth electrode; a third contact electrode disposed on the third electrode and electrically connected to an end of each of the plurality of light emitting elements of the second light emitting element group; a fourth contact electrode disposed on the fourth electrode and electrically connected to another end of each of the plurality of light emitting elements of the second light emitting element group; a third electrode contact portion disposed on the third electrode and electrically connected to the third electrode; a fourth electrode contact portion disposed on the fourth electrode and electrically connected to the fourth electrode; a first connection pattern electrically connecting the third contact electrode and the third electrode contact portion; and a second connection pattern electrically connecting the fourth contact electrode and the fourth electrode contact portion.

Each of the plurality of light emitting elements of the second light emitting element group may include a first semiconductor layer disposed at a first end of the each of the plurality of light emitting elements of the second light emitting element group; a second semiconductor layer disposed at a second end of the each of the plurality of light emitting elements of the second light emitting element group; and an element active layer disposed between the first semiconductor layer and the second semiconductor layer.

The first end of each of the plurality of light emitting elements of the first light emitting element group may be electrically connected to the first contact electrode, and the first end of each of at least some of the plurality of light emitting elements of the second light emitting element group may be electrically connected to the fourth contact electrode.

The display device may further comprise a first power line to which a first power voltage is applied; a transistor electrically connected to the first power line; and a second power line to which a second power voltage lower than the first power voltage is applied. The first electrode may be electrically connected to the transistor, and the second electrode may be electrically connected to the second power line.

The display device may further comprise a first insulating layer disposed on the first electrode and the second electrode. The first insulating layer may include a first opening exposing a part of the first electrode; and a second opening exposing a part of the second electrode.

The first electrode contact portion may electrically contact a top surface of the first electrode exposed by the first opening; and the second electrode contact portion may electrically contact a top surface of the second electrode exposed by the second opening.

The first contact electrode may electrically contact the end of each of the plurality of the light emitting elements without contacting the first electrode, and the second contact electrode may electrically contact another end of each of the plurality of the light emitting elements without contacting the second electrode.

The first contact electrode, the second contact electrode, the first electrode contact portion, and the second electrode contact portion may be spaced apart from each other.

The first contact electrode and the first electrode contact portion may be disposed on a same layer, and the second contact electrode and the second electrode contact portion may be disposed on a same layer.

The first repair pattern may be disposed on the second contact electrode and the first electrode contact portion, and the second repair pattern may be disposed on the first contact electrode and the second electrode contact portion.

The display device may further comprise a repair auxiliary pattern disposed between the second contact electrode and the first electrode contact portion. The repair auxiliary pattern may be integral with the second contact electrode and may be spaced apart from the first electrode contact portion.

The first repair pattern may be disposed on the first electrode contact portion and the repair auxiliary pattern.

The first repair pattern and the second repair pattern may be spaced apart from each other.

According to an embodiment, a method of repairing a display device which includes a substrate including a display area and a non-display area; a first electrode and a second electrode disposed in the display area and spaced apart from each other; a plurality of light emitting elements disposed between the first electrode and the second electrode; a first contact electrode disposed on the first electrode and electrically connected to an end of each of the plurality of light emitting elements; a second contact electrode disposed on the second electrode and electrically connected to another end of each of the plurality of light emitting elements; a first electrode contact portion disposed on the first electrode and electrically connected to the first electrode; a second electrode contact portion disposed on the second electrode and electrically connected to the second electrode; a first connection pattern disposed on the first electrode and electrically connecting the first contact electrode and the first electrode contact portion; and a second connection pattern disposed on the second electrode and electrically connecting the second contact electrode and the second electrode contact portion, the method comprising separating the first contact electrode and the first electrode contact portion from each other, and the second contact electrode and the second electrode contact portion from each other.

The separating of the first contact electrode and the first electrode contact portion from each other, and the second contact electrode and the second electrode contact portion from each other may comprise removing the first connection pattern and the second connection pattern.

The method may further comprise forming a first repair pattern electrically connecting the first electrode contact portion and the second contact electrode, and a second repair pattern electrically connecting the second electrode contact portion and the first contact electrode.

Each of the plurality of light emitting elements may include a first semiconductor layer disposed at a first end of each of the plurality of light emitting elements; a second semiconductor layer spaced apart from the first semiconductor layer; and an element active layer disposed between the first semiconductor layer and the second semiconductor layer, and the plurality of light emitting elements may be aligned such that the first end of each of the plurality of light emitting elements is oriented in a same direction.

According to another embodiment of the disclosure, there is provided a method of repairing a display device which includes: a substrate including a display area and a non-display area; first and second electrodes disposed in the display area and spaced apart from each other; a plurality of light emitting elements disposed between the first electrode and the second electrode; a first contact electrode disposed on the first electrode and electrically connected to an end of each of the plurality of light emitting elements; a second contact electrode disposed on the second electrode and electrically connected to another end of each of the plurality of light emitting elements; a first electrode contact portion disposed on the first electrode and electrically connected to the first electrode; a second electrode contact portion disposed on the second electrode and electrically connected to the second electrode; a first connection pattern disposed on the first electrode and configured to connect the first contact electrode and the first electrode contact portion; and a second connection pattern disposed on the second electrode and configured to connect the second contact electrode and the second electrode contact portion, the method comprising separating the first contact electrode and the first electrode contact portion from each other, and the second contact electrode and the second electrode contact portion from each other.

In the display device according to one embodiment, it is possible to repair the defective pixel in which all the plurality of light emitting elements arranged in the emission area are aligned in a reverse direction such that a current flows through the plurality of light emitting elements aligned in the reverse direction by changing the current direction in the defective pixel in the opposite direction. Therefore, it is possible to minimize the phenomenon that the defective pixel is displayed as a dark spot due to the reverse alignment of the plurality of light emitting elements and to improve the display quality of the display device.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
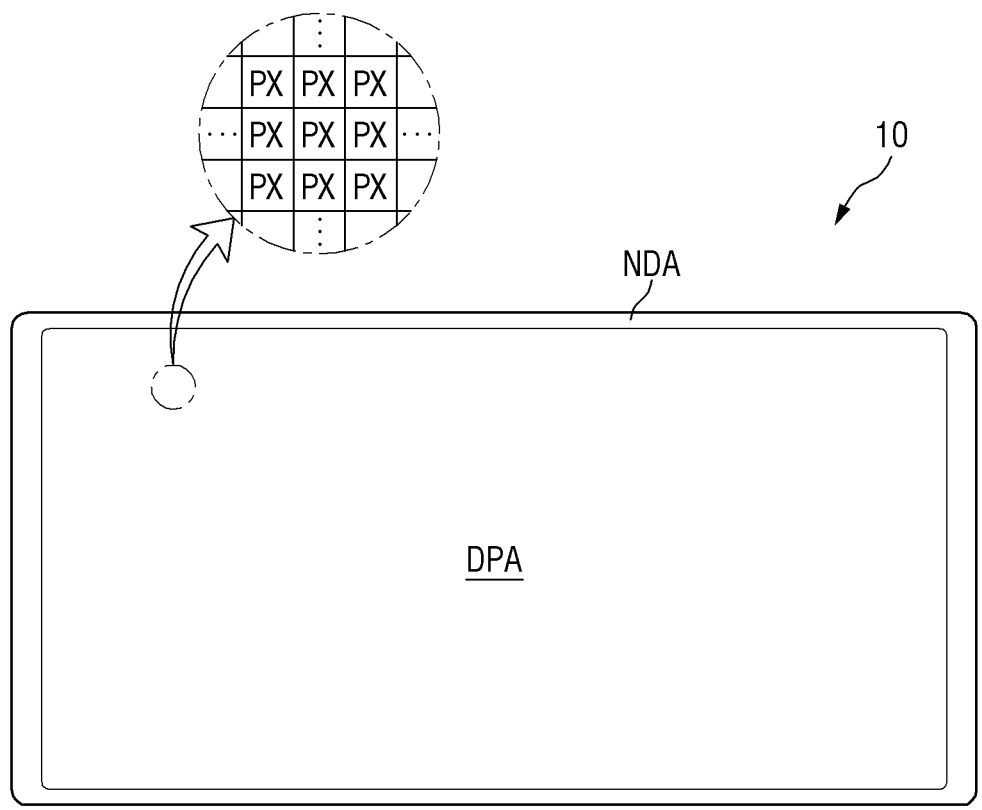
FIG. 1 is a schematic plan view of a display device according to an embodiment.

FIG. 1 is a schematic plan view of a display device according to an embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet of things (IoT) device, a mobile phone, a smartphone, a tablet personal computer (PC), an electronic watch, a smartwatch, a watch-phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel which provides a display screen. Examples of the display panel may include an inorganic light emitting diode display panel, an organic light emitting display panel, a quantum dot light emitting display panel, a plasma display panel, and a field emission display panel. In the following description, a case where an inorganic light emitting diode display panel is applied as a display panel will be described, but the disclosure is not limited thereto, and other display panels may be applied within the same scope of the technical spirit.

Hereinafter, a first direction DR1, a second direction DR2, and a third direction DR3 are defined in drawings illustrating an embodiment of the display device 10. The first direction DR1 and the second direction DR2 may be directions perpendicular to each other in a plane. The third direction DR3 may be a direction perpendicular to a plane defined by the first direction DR1 and the second direction DR2. The third direction DR3 is perpendicular to each of the first direction DR1 and the second direction DR2. In the embodiment describing the display device 10, the third direction DR3 indicates a thickness direction (or a display direction) of the display device 10.

The display device 10 may have a rectangular shape including long and short sides that are longer in in the first direction DR1 than in the second direction DR2 in a plan view. A corner portion where the long side and the short side of the display device 10 meet may be right-angled in a plan view. However, the disclosure is not limited thereto, and it may be rounded to have a curved shape. The shape of the display device 10 is not limited to the illustrated one and may be variously modified. For example, the display device 10 may have other shapes such as a square shape, a quadrilateral shape with rounded corners (vertices), other polygonal shapes, and a circular shape in a plan view.

A display surface of the display device 10 may be disposed on a side of the third direction DR3 which is the thickness direction. In embodiments describing the display device 10, unless otherwise noted, the term "upward" refers to the third direction DR3, which is the display direction, and the term "top surface" refers to a surface toward the side of the third direction DR3. Further, the term "downward" refers to the other side of the third direction DR3, which is an opposite direction to the display direction, and the term "bottom surface" refers to a surface toward the other side of the third direction DR3. Furthermore, "left", "right", "upper," and "lower" indicate directions when the display device 10 is viewed from above. For example, "right side" indicates a side of the first direction DR1, "left side" indicates the other side of the first direction DR1, "upper side" indicates a side of the second direction DR2, and "lower side" indicates the other side of the second direction DR2.

The display device 10 may include a display area DPA and a non-display area NDA. The display area DPA is an area where an image can be displayed, and the non-display area NDA is an area where an image is not displayed.

The shape of the display area DPA may follow the shape of the display device 10. For example, the shape of the display area DPA may have a rectangular shape similar to the overall shape of the display device 10 in a plan view. The display area DPA may substantially occupy the center of the display device 10.

The display area DPA may include pixels PX. The pixels PX may be arranged in a matrix. The shape of each pixel PX may be a rectangular or square shape in a plan view. In an embodiment, each pixel PX may include light emitting elements made of inorganic particles.

The non-display area NDA may be disposed around the display area DPA. The non-display area NDA may completely or partially surround the display area DPA. The non-display area NDA may form a bezel of the display device 10.

Figure 2:
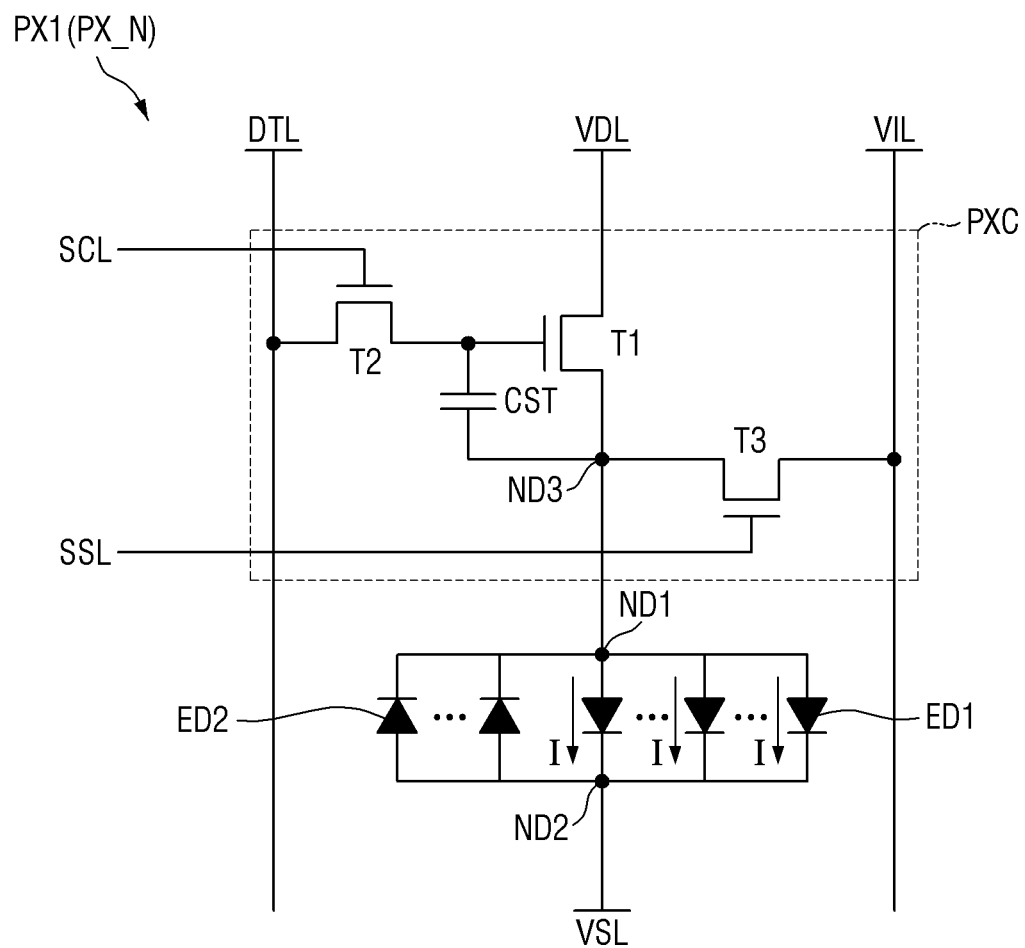
FIG. 2 is an equivalent circuit diagram of a first pixel of a display device according to an embodiment.
Figure 3:
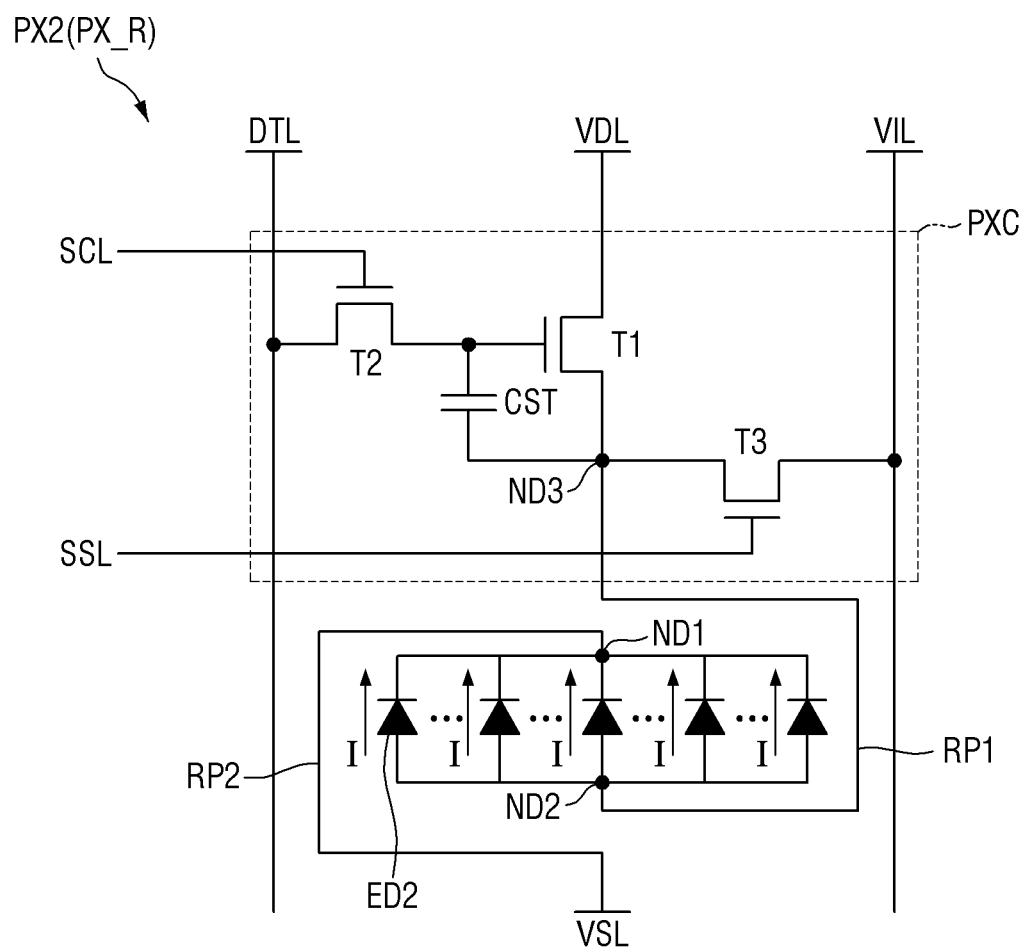
FIG. 3 is an equivalent circuit diagram of a second pixel of a display device according to an embodiment.

FIG. 2 is an equivalent circuit diagram of a first pixel of a display device according to an embodiment. FIG. 3 is an equivalent circuit diagram of a second pixel of a display device according to an embodiment.

The equivalent circuit diagram of a first pixel PX1 shown in FIG. 2 may be an equivalent circuit diagram of a normal pixel PX_N in which at least one of light emitting elements ED is aligned in a normal direction (forward direction). Further, the equivalent circuit diagram of a second pixel PX2 shown in FIG. 3 may be an equivalent circuit diagram of a repair pixel PX_R obtained by repairing a defective pixel in which the light emitting elements ED are aligned in an abnormal direction (reverse direction). Hereinafter, in this specification, for simplicity of description, the first pixel PX1 may be referred to as the normal pixel PX_N, and the second pixel PX2 may be referred to as the repair pixel PX_R.

Each pixel PX of the display device 10 includes a pixel driving circuit PXC. The pixel driving circuit PXC may include a transistor and a capacitor. The numbers of transistors and capacitors in each pixel driving circuit PXC may vary. Each pixel PX of the display device 10 according to an embodiment may include a pixel driving circuit PXC having a 3T1C structure including three transistors and a capacitor. In the following description, the case in which the pixel driving circuit PXC of each pixel PX of the display device 10 has a 3T1C structure will be described as an example of the pixel driving circuit PXC. However, the disclosure is limited thereto, and other various modified pixel structures such as a 2T1C structure, a 7T1C structure, a 6T1C structure, and the like may be applied to the pixel driving circuit PXC.

Referring to FIG. 2, the first pixel PX1 of the display device 10 may include the light emitting elements ED and the pixel driving circuit PXC. The pixel driving circuit PXC may include transistors T1, T2, and T3 and a storage capacitor CST. The transistors T1, T2, and T3 may include a first transistor T1, a second transistor T2, and a third transistor T3.

The light emitting elements ED included in the first pixel PX1 emit light in response to the current supplied through the first transistor T1. The light emitting elements ED included in the first pixel PX1 may be electrically connected in parallel between the pixel driving circuit PXC and a second voltage line VSL. The light emitting elements ED may emit light of a specific wavelength band by an electrical signal transmitted from the pixel driving circuit PXC and the second voltage line VSL.

The light emitting elements ED included in the first pixel PX1 may include first light emitting elements ED1 electrically connected in parallel to each other in the same direction between a first node ND1 and a second node ND2. In the equivalent circuit diagram of the first pixel PX1, the first node ND1 may be electrically connected to a third node ND3 of the pixel driving circuit PXC, and the second node ND2 may be electrically connected to the second voltage line VSL.

The light emitting elements ED included in the first pixel PX1 may further include second light emitting elements ED2 electrically connected in a direction opposite to that of the first light emitting elements ED1 between the first node ND1 and the second node ND2. The first light emitting elements ED1 and the second light emitting elements ED2 may be electrically connected in parallel. However, the disclosure is not limited thereto, and the light emitting elements ED included in the first pixel PX1 may include the first light emitting elements ED1 and may not include the second light emitting element ED2.

As will be described below, the light emitting element ED may have a first end that is a first conductive end and a second end that is a second conductive end. Hereinafter, in this specification, the light emitting element ED having the first end electrically connected to the first node ND1 and the second end electrically connected to the second node ND2 between the first node ND1 and the second node ND2 may be defined as the first light emitting element ED1, and the light emitting element ED having the second end electrically connected to the first node ND1 and the first end electrically connected to the second node ND2 between the first node ND1 and the second node ND2 may be defined as the second light emitting element ED2. For example, the first light emitting element ED1 may be the light emitting element ED having the first end aligned on the first node ND1 between the first node ND1 and the second node ND2, and the second light emitting element ED2 may be the light emitting element ED having the second end aligned on the first node ND1 between the first node ND1 and the second node ND2. The first node ND1 may be understood as a first contact electrode 711A (see FIG. 4) of the first pixel PX1 to be described below with reference to FIG. 4, and the second node ND2 may be understood as a second contact electrode 721A (see FIG. 4) of the first pixel PX1.

In the first light emitting elements ED1 included in the first pixel PX1, the first ends that are the first conductive ends may be commonly connected to the first node ND1 and commonly connected to the pixel driving circuit PXC through the first node ND1, and the second ends that are the second conductive ends may be commonly connected to the second node ND2 and connected to the second voltage line VSL through the second node ND2.

The first light emitting elements ED1 included in the first pixel PX1 may be electrically connected in parallel in the forward direction between the pixel driving circuit PXC and the second voltage line VSL. On the other hand, in this specification, the phrase "the light emitting element is electrically connected in the forward direction between the pixel driving circuit and the second voltage line" may mean that "the first end of the light emitting element is electrically connected to the pixel driving circuit, and the second end of the light emitting element is electrically connected to the second voltage line." Further, a current may flow through the light emitting element electrically connected in the forward direction between the pixel driving circuit and the second voltage line, and no current may flow through the light emitting element electrically connected in the reverse direction between the pixel driving circuit and the second voltage line.

The first ends of the first light emitting elements ED1 of the first pixel PX1 may be electrically connected to a first voltage line VDL through the pixel driving circuit PXC, and the second ends of the first light emitting elements ED1 may be electrically connected to the second voltage line VSL. Therefore, in case that an electrical signal is applied to each of the first voltage line VDL and the second voltage line VSL, a current I may flow through the first light emitting elements ED1 aligned in the forward direction between the first voltage line VDL and the second voltage line VSL.

On the other hand, the second light emitting elements ED2 included in the first pixel PX1 may be electrically connected in parallel in the reverse direction between the pixel driving circuit PXC and the second voltage line VSL. For example, the first ends of the second light emitting elements ED2 included in the first pixel PX1 may be electrically connected to the second voltage line VSL, and the second ends of the second light emitting elements ED2 included in the first pixel PX1 may be electrically connected to the first voltage line VDL through the pixel driving circuit PXC. Therefore, even in case that an electrical signal is applied to each of the first voltage line VDL and the second voltage line VSL, there may be substantially no current flowing through the second light emitting elements ED2 aligned in the reverse direction between the first voltage line VDL and the second voltage line VSL.

Although the first pixel PX1 includes the second light emitting elements ED2 aligned in the reverse direction between the pixel driving circuit PXC and the second voltage line VSL, since the first pixel PX1 includes the first light emitting elements ED1 aligned in the forward direction, the first light emitting elements ED1 among the light emitting elements ED arranged in the first pixel PX1 may emit light.

The first node ND1 electrically connected to the first ends of the first light emitting elements ED1 and the second ends of the second light emitting elements ED2 may be electrically connected to a source electrode of the first transistor T1, and the second node ND2 electrically connected to the second ends of the first light emitting elements ED1 and the first ends of the second light emitting elements ED2 may be electrically connected to the second voltage line VSL to which a low potential voltage (hereinafter, referred to as "second power voltage") lower than a high potential voltage (hereinafter, referred to as "first power voltage") of the first voltage line VDL is supplied.

The first transistor T1 adjusts a current flowing from the first voltage line VDL, to which the first power voltage is supplied, to the light emitting elements ED according to the voltage difference between the gate electrode and the source electrode thereof. For example, the first transistor T1 may be a driving transistor for driving the light emitting elements ED. The gate electrode of the first transistor T1 may be electrically connected to the second source/drain electrode of the second transistor T2, the source electrode of the first transistor T1 may be electrically connected to the light emitting elements ED, and the drain electrode of the first transistor T1 may be electrically connected to the first voltage line VDL to which the first power voltage is applied.

The second transistor T2 is turned on by a scan signal of the scan line SCL to electrically connect the data line DTL to the gate electrode of the first transistor T1. A gate electrode of the second transistor T2 may be electrically connected to the scan line SCL, the second source/drain electrode of the second transistor T2 may be electrically connected to the gate electrode of the first transistor T1, and the first source/drain electrode of the second transistor T2 may be electrically connected to the data line DTL.

The third transistor T3 is turned on by a sensing signal of a sensing line SSL to electrically connect an initialization voltage line VIL to the source electrode of the first transistor T1. The gate electrode of the third transistor T3 may be electrically connected to the sensing line SSL, the first source/drain electrode of the third transistor T3 may be electrically connected to the initialization voltage line VIL, and the second source/drain electrode of the third transistor T3 may be electrically connected to the source electrode of the first transistor T1.

In an embodiment, the first source/drain electrode and the second source/drain electrode of each of the second and third transistors T2 and T3 may be the source electrode and the drain electrode, respectively. However, the disclosure is not limited thereto, and the first source/drain electrode and the second source/drain electrode thereof may be the drain electrode and the source electrode, respectively.

The capacitor CST is formed between the gate electrode of the first transistor T1 and the source electrode of the first transistor T1. The capacitor CST stores the difference voltage between a gate voltage and a source voltage of the first transistor T1.

Each of the first to third transistors T1, T2, and T3 may be formed as a thin-film transistor. Although FIG. 2 mainly describes the case where the first to third transistors T1, T2, and T3 are formed as an N-type metal oxide semiconductor field effect transistor (MOSFET), the disclosure is not limited thereto. For example, the first to third transistors T1, T2, and T3 may be formed as a P-type MOSFET, or a part of the first to third transistors T1, T2, and T3 may be formed as the N-type MOSFET, and another part of the first to third transistors T1, T2, and T3 may be formed as the P-type MOSFET.

Referring to FIG. 3, the second pixel PX2 of the display device 10 may include the light emitting elements ED and the pixel driving circuit PXC. The pixel driving circuit PXC of the second pixel PX2 and the pixel driving circuit PXC of the first pixel PX1 may have substantially the same structure. Hereinafter, the differences between the equivalent circuit diagram of the second pixel PX2 and the equivalent circuit diagram of the first pixel PX1 described above with reference to FIG. 2 will be mainly described.

The light emitting elements ED included in the second pixel PX2 emit light in response to the current supplied through the first transistor T1. The light emitting elements ED included in the second pixel PX2 may be electrically connected in parallel to each other between the pixel driving circuit PXC and the second voltage line VSL. The light emitting elements ED may emit light of a specific wavelength band by an electrical signal transmitted from the pixel driving circuit PXC and the second voltage line VSL. As will be described below, the second pixel PX2 may be the repair pixel PX_R obtained by performing a repair process for solving the defective alignment of the light emitting elements ED.

The light emitting elements ED included in the second pixel PX2 may include the second light emitting elements ED2 electrically connected to each other in parallel to each other in the same direction between the first node ND1 and the second node ND2. For example, the light emitting elements ED included in the second pixel PX2 may include the second light emitting elements ED2 having the first ends electrically connected to the second node ND2 and the second ends electrically connected to the first node ND1. The second pixel PX2 subjected to the repair process may not include the first light emitting element ED1.

In the light emitting elements ED included in the second pixel PX2, the first node ND1 may be understood as a first contact electrode 711B (see FIG. 4) of the second pixel PX2 to be described below with reference to FIG. 4, and the second node ND2 may be understood as a second contact electrode 721B (see FIG. 4) of the second pixel PX2.

Unlike the equivalent circuit diagram of the first pixel PX1, in the equivalent circuit diagram of the second pixel PX2, the first node ND1 may be electrically connected to the second voltage line VSL and the second node ND2 may be electrically connected to the pixel driving circuit PXC. The first node ND1 may be electrically connected to the second voltage line VSL through a second repair line RP2, and the second node ND2 may be electrically connected to the third node ND3 of the pixel driving circuit PXC through a first repair line RP1.

The second light emitting elements ED2 included in the second pixel PX2 may be electrically connected in parallel to each other in the forward direction between the pixel driving circuit PXC and the second voltage line VLS. For example, the first ends of the second light emitting elements ED2 included in the second pixel PX2 may be electrically connected to the first voltage line VDL through the first repair line RP1 and the pixel driving circuit PXC, and the second ends of the second light emitting elements ED2 included in the second pixel PX2 may be electrically connected to the second voltage line VSL through the second repair line RP2. Therefore, in case that an electrical signal is applied to each of the first voltage line VDL and the second voltage line VSL, the current I may flow through the second light emitting elements ED2 aligned in the forward direction between the first voltage line VDL and the second voltage line VSL. The first repair line RP1 and the second repair line RP2 may correspond to a first repair pattern 810 (see FIG. 4) and a second repair pattern 820 (see FIG. 4) to be described below, respectively.

Referring to FIGS. 2 and 3, the light emitting elements ED included in the first pixel PX1 may include the first light emitting elements ED1 having the first ends aligned on the first node ND1 between the first node ND1 and the second node ND2, and the light emitting elements ED included in the second pixel PX2 may include the second light emitting elements ED2 having the first ends aligned on the second node ND2 between the first node ND1 and the second node ND2. On the other hand, although the second pixel PX2 includes only the second light emitting elements ED2 aligned in the direction opposite to the direction in which the first light emitting elements ED1 are aligned between the first node ND1 and the second node ND2, the current may flow from the second node ND2 to the first node ND1 by electrically connecting the first node ND1 of the second pixel PX2 to the second voltage line VSL and electrically connecting the second node ND2 of the second pixel PX2 to the pixel driving circuit PXC. Therefore, the second light emitting elements ED2 of the second pixel PX2 may emit light.

Figure 4:
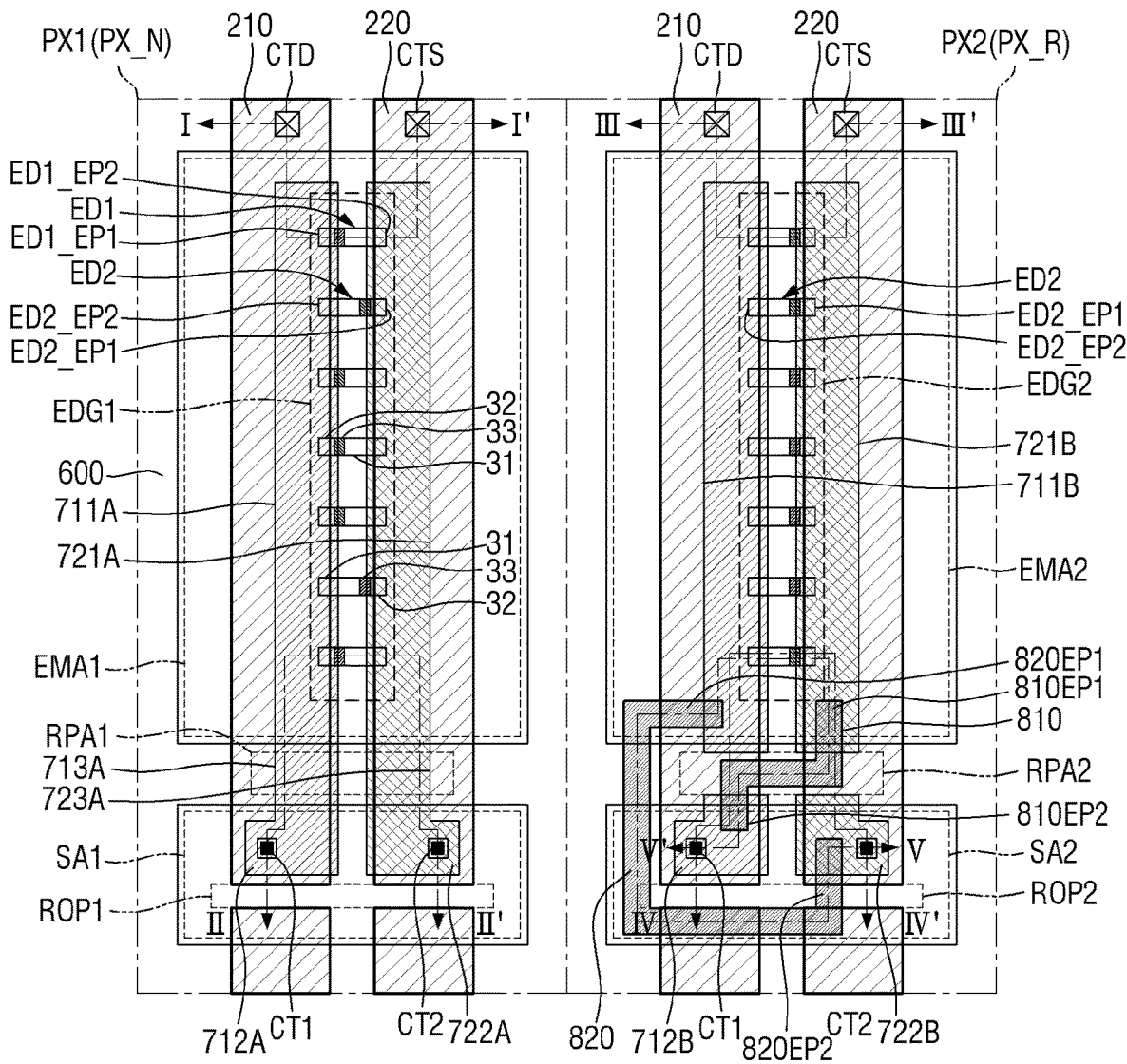
FIG. 4 is a schematic plan layout view illustrating a first pixel and a second pixel of a display device according to an embodiment.

FIG. 4 is a schematic plan layout view illustrating a first pixel and a second pixel of a display device according to an embodiment.

Referring to FIG. 4, as described above, the display device 10 may include the pixels PX, and the pixels PX may include the light emitting elements ED. The pixels PX may include the normal pixel PX_N and the repair pixel PX_R defined depending on the direction in which the light emitting elements ED are aligned between a first electrode 210 and a second electrode 220. As described above, the normal pixel PX_N may be referred to as the first pixel PX1, and the repair pixel PX_R may be referred to as the second pixel PX2.

The light emitting element ED may extend in a direction. In an embodiment, the light emitting element ED may include semiconductor layers. For example, the light emitting element ED may include a first conductive (e.g., n-type) semiconductor layer, a second conductive (e.g., p-type) semiconductor layer, and an active semiconductor layer interposed therebetween. The active semiconductor layer may receive holes and electrons from the first conductive semiconductor layer and the second conductive semiconductor layer, respectively, and the holes and electrons that have reached the active semiconductor layer may be coupled or combined to emit light.

In an embodiment, the above-described semiconductor layers may be sequentially stacked in the longitudinal direction of the light emitting element ED. The light emitting element ED may include a first semiconductor layer 31, an element active layer 33, and a second semiconductor layer 32 that are sequentially stacked each other in the longitudinal direction. The first semiconductor layer 31, the element active layer 33, and the second semiconductor layer 32 may be the first conductive semiconductor layer, the active semiconductor layer, and the second conductive semiconductor layer, respectively.

The normal pixel PX_N may be a pixel in which the light emitting elements ED arranged between the first electrode 210 and the second electrode 220 include at least one first light emitting element ED1, and the repair pixel PX_R may be a pixel in which the light emitting elements ED arranged between the first electrode 210 and the second electrode 220 include only the second light emitting elements ED2.

Hereinafter, in this specification, for simplicity of description, the first end of the light emitting element ED may be defined as an end where the second semiconductor layer 32 is located, and the second end of the light emitting element ED may be defined as an end where the first semiconductor layer 31 is located.

Hereinafter, in the drawing illustrating the cross-sectional or planar structure of the display device 10, the first light emitting element ED1 and the second light emitting element ED2 may be defined in the direction in which the first semiconductor layer 31 and the second semiconductor layer 32 are directed between the first electrode 210 and the second electrode 220. The first light emitting element ED1 may be the light emitting element ED having the first end (e.g., the end where the second semiconductor layer 32 is located) disposed on the first electrode 210 and the second end (e.g., the end where the first semiconductor layer 31 is located) disposed on the second electrode 220 between the first electrode 210 and the second electrode 220. The second light emitting element ED2 may be the light emitting element ED having the first end (e.g., the end where the second semiconductor layer 32 is located) disposed on the second electrode 220 and the second end (e.g., the end where the first semiconductor layer 31 is located) disposed on the first electrode 210 between the first electrode 210 and the second electrode 220.

The normal pixel PX_N may include a first light emitting element group EDG1 including light emitting elements ED. The first light emitting element group EDG1 may include at least one first light emitting element ED1. The first light emitting element group EDG1 may further include the second light emitting elements ED2.

The repair pixel PX_R may include a second light emitting element group EDG2 including light emitting elements ED. All the light emitting elements ED included in the second light emitting element group EDG2 may be the second light emitting elements ED2. For example, the light emitting elements ED included in the second light emitting element group EDG2 of the repair pixel PX_R may be aligned in the same direction.

In the display device 10, each pixel PX may include an emission area EMA and a non-emission area (not shown). The emission area EMA may be defined as an area in which light emitted from a light emitting element ED is emitted, and the non-emission area may be defined as an area in which light is not emitted because the light emitted from the light emitting element ED does not reach. In an embodiment, the first pixel PX1 may include a first emission area EMA1, and the second pixel PX2 may include a second emission area EMA2.

The emission area EMA may include an area in which the light emitting elements ED are disposed and an area adjacent thereto. The emission area EMA may further include a region in which the light emitted from the light emitting element ED is reflected or refracted by another member and emitted.

Each pixel PX may further include a sub-region SA disposed in the non-emission area. The light emitting element ED may not be provided in the sub-region SA. The sub-region SA may be disposed at the lower side (or the other side in the second direction DR2) from the emission area EMA within one pixel PX. The sub-region SA may be disposed between the emission areas EMA of the pixels PX disposed adjacent to each other in the second direction DR2. In an embodiment, the first pixel PX1 may include a first sub-region SA1, and the second pixel PX2 may include a second sub-region SA2.

The sub-region SA may include a separation portion ROP. The separation portion ROP of the sub-region SA may be the region where the first electrodes 210 and the second electrodes 220 of the electrode layers 200 included in different pixels PX adjacent to each other in the second direction DR2 are separated from each other. In an embodiment, the first pixel PX1 may include a first separation portion ROP1 disposed in the first sub-region SA1, and the second pixel PX2 may include a second separation portion ROP2 disposed in the second sub-region SA2.

The sub-regions SA (e.g., the first and second sub-regions SA1 and SA2) of the pixels PX may further include regions where the electrode layers 200 are electrically connected to the first electrode contact portions 712A and 712B and the second electrode contact portions 722A and 722B through a third contact hole CT1 and a fourth contact hole CT2 to be described below, respectively.

Each pixel PX may further include a repair area RPA disposed between the emission area EMA and the sub-region SA. The repair area RPA may be a region where the repair process is performed in case that the alignment of the light emitting elements ED included in the light emitting element groups EDG (e.g., the first and second light emitting element groups EDG1 and EDG2) of the pixels PX is defective. In an embodiment, the first pixel PX1 may include a first repair area RPA1 disposed between the first emission area EMA1 and the first sub-region SA1, and the second pixel PX2 may include a second repair area RPA2 disposed between the second emission area EMA2 and the second sub-region SA2. On the other hand, although it is illustrated in the drawing that the repair area RPA is disposed between the emission area EMA and the sub-region SA of each pixel PX, the position of the repair area RPA is not limited thereto.

The pixels PX of the display device 10 according to an embodiment include a first bank 600, the electrode layer 200, the first contact electrodes 711A and 711B, the second contact electrodes 721A and 721B, the first electrode contact portions 712A and 712B, the second electrode contact portions 722A and 722B, and the light emitting element groups EDG1 and EDG2.

The first bank 600 may include portions extending in the first direction DR1 and the second direction DR2 in a plan view to be arranged in a grid pattern over the entire surface of the display area DPA. The first bank 600 may be disposed across the boundary of each of the pixels PX to delimit the neighboring pixels PX. The first bank 600 may be disposed to surround the emission area EMA and the sub-region SA in each pixel PX to distinguish them. For example, the emission area EMA and the sub-region SA of each pixel PX may be defined by the first bank 600.

The electrode layer 200 may extend in a direction and may be disposed across the emission area EMA and the sub-region SA of each pixel PX. The electrode layer 200 may transmit an electrical signal applied from a circuit element layer to the light emitting element ED so that the light emitting element ED emits light. Further, the electrode layer 200 may also be used for generating an electric field used in the deflection alignment process of the light emitting elements ED. In an embodiment, the electrode layer 200 may include the first electrode 210 and the second electrode 220. The structures of the electrode layers 200 of the first pixel PX1 and the second pixel PX2 may be substantially the same.

The first electrode 210 may be located on a left side of each pixel PX in a plan view. The first electrode 210 may extend in the second direction DR2 in a plan view. The first electrode 210 may be disposed across the emission area EMA and the sub-region SA. The first electrode 210 may extend in the second direction DR2 in a plan view and may be separated from the first electrode 210 of the pixel PX adjacent thereto in the second direction DR2 at the separation portion ROP of the sub-region SA.

The first electrode 210 may be electrically connected to the circuit element layer to be described below through a first contact hole CTD. The first electrode 210 may receive the electrical signal for making the light emitting elements ED emit light through the first contact hole CTD.

The second electrode 220 may be spaced apart from the first electrode 210 in the first direction DR1. The second electrode 220 may be located on a right side of each pixel PX in a plan view. The second electrode 220 may extend in the second direction DR2 in a plan view. The second electrode 220 may be disposed across the emission area EMA and the sub-region SA. The second electrode 220 may extend in the second direction DR2 in a plan view and may be separated from the second electrode 220 of the pixel PX adjacent thereto in the second direction DR2 at the separation portion ROP of the sub-region SA.

The second electrode 220 may be electrically connected to the circuit element layer to be described below through a second contact hole CTS. The second electrode 220 may receive the electrical signal for making the light emitting elements ED emit light through the second contact hole CTS.

The light emitting element group EDG may be disposed in the emission area EMA of each pixel PX. The light emitting element group EDG may be disposed between the first electrode 210 and the second electrode 220 in the emission area EMA of each pixel PX. In an embodiment, the first light emitting element group EDG1 may be disposed in the first emission area EMA1 of the first pixel PX1, and the second light emitting element group EDG2 may be disposed in the second emission area EMA2 of the second pixel PX2. The first light emitting element group EDG1 of the first pixel PX1 and the second light emitting element group EDG2 of the second pixel PX2 may be different in the alignment direction of the light emitting elements ED included therein.

The first light emitting element group EDG1 may include at least one first light emitting element ED1. The first light emitting element group EDG1 may further include the second light emitting elements ED2. The first light emitting elements ED1 and the second light emitting elements ED2 may have a shape extended in a direction, and the extension direction of the light emitting elements ED may be substantially perpendicular to the extension direction of the first electrode 210 and the second electrode 220. For example, the extension direction of the light emitting elements ED may be parallel to the first direction DR1 that is substantially perpendicular to the second direction DR2 that is the extension direction of the first electrode 210 and the second electrode 220. However, the disclosure is not limited thereto, and the light emitting elements ED may be arranged to extend in a direction oblique to the extension direction of the first electrode 210 and the second electrode 220.

The light emitting elements ED included in the first light emitting element group EDG1 may be arranged such that the first ends and the second ends of the light emitting elements ED are disposed on specific electrodes. For example, between the first electrode 210 and the second electrode 220, first ends ED1_EP1 of the first light emitting elements ED1 may be disposed on the first electrode 210, and second ends ED1_EP2 of the first light emitting elements ED1 may be disposed on the second electrode 220. Further, between the first electrode 210 and the second electrode 220, first ends ED2_EP1 of the second light emitting elements ED2 may be disposed on the second electrode 220, and second ends ED2_EP2 of the second light emitting elements ED2 may be disposed on the first electrode 210. As described above, the first end of the light emitting element ED may be defined as an end where the second semiconductor layer 32 is located, the second end of the light emitting element ED may be defined as an end where the first semiconductor layer 31 is located, one end (or first end) of the light emitting element ED may be defined as an end disposed on the first electrode 210, and the other end (or second end) of the light emitting element ED may be defined as an end disposed on the second electrode 220.

The second light emitting element group EDG2 may include the second light emitting elements ED2. The second light emitting element group EDG2 may not include the first light emitting element ED1. The light emitting elements ED included in the second light emitting element group EDG2 may be aligned in the same direction.

The second light emitting elements ED2 included in the second light emitting element group EDG2 may be arranged such that the first ends ED2_EP1 and the second ends ED2_EP2 are disposed on specific electrodes. For example, between the first electrode 210 and the second electrode 220, the first ends ED2_EP1 of the second light emitting elements ED2 may be disposed on the second electrode 220, and the second ends ED2_EP2 of the second light emitting elements ED2 may be disposed on the first electrode 210.

Each pixel PX may include a first contact electrode 711, a second contact electrode 721, a first electrode contact portion 712, and a second electrode contact portion 722. In this specification, in describing the first contact electrode 711, the second contact electrode 721, the first electrode contact portion 712, and the second electrode contact portion 722, different reference numerals (e.g., 711A and 711B) are used in case that it is required to specify the first contact electrode 711, the second contact electrode 721, the first electrode contact portion 712, and the second electrode contact portion 722 included in each of the first pixel PX1 and the second pixel PX2, and the reference numerals 711A and 711B are collectively referred to as 711 in case that it is not required to specify the first pixel PX1 and the second pixel PX2.

The first contact electrode 711 may be disposed in the emission area EMA of each pixel PX. The first contact electrode 711 may be located on the left side of each pixel PX in a plan view. The first contact electrode 711 may extend in the second direction DR2 in a plan view in the emission area EMA. The first contact electrode 711 may overlap the first electrode 210 in the third direction DR3. The first contact electrode 711 may overlap first ends of the light emitting elements ED arranged in the emission area EMA in the third direction DR3. The first contact electrode 711 may be electrically connected to first ends (e.g., the first ends of the light emitting elements ED arranged on the first electrode 210) of the light emitting elements ED arranged in the emission area EMA.

The first contact electrode 711A disposed in the first emission area EMA1 may contact first ends of the light emitting elements ED of the first light emitting element group EDG1. The first contact electrode 711A disposed in the first emission area EMA1 may contact the first ends ED1_EP1 of the first light emitting elements ED1 and the second ends ED2_EP2 of the second light emitting elements ED2. First ends (e.g., the first ends ED EP1 of the first light emitting elements ED1 and the second ends ED2_EP2 of the second light emitting elements ED2) of the light emitting elements ED of the first light emitting element group EDG1 may be electrically connected to each other through the first contact electrode 711A disposed in the first emission area EMA1.

The first contact electrode 711B disposed in the second emission area EMA2 may contact first ends of the light emitting elements ED of the second light emitting element group EDG2. The first contact electrode 711B disposed in the second emission area EMA2 may contact the second ends ED2_EP2 of the second light emitting elements ED2. First ends (e.g., the second ends ED2_EP2 of the second light emitting elements ED2) of the light emitting elements ED of the second light emitting element group EDG2 may be electrically connected to each other through the first contact electrode 711B disposed in the second emission area EMA2.

The second contact electrode 721 may be disposed in the emission area EMA of each pixel PX. The second contact electrode 721 may be spaced apart from the first contact electrode 711 in the first direction DR1. The second contact electrode 721 may be located on the right side of each pixel PX in a plan view. The second contact electrode 721 may extend in the second direction DR2 in a plan view in the emission area EMA. The second contact electrode 721 may overlap the second electrode 220 in the third direction DR3. The second contact electrode 721 may overlap the second ends of the light emitting elements ED arranged in the emission area EMA, in the third direction DR3. The second contact electrode 721 may be electrically connected to the second ends (for example, the second ends of the light emitting elements ED arranged on the second electrode 220) of the light emitting elements ED arranged in the emission area EMA.

The second contact electrode 721A disposed in the first emission area EMA1 may contact the second ends of the light emitting elements ED of the first light emitting element group EDG2. The second contact electrode 721A disposed in the first emission area EMA1 may contact the second ends ED1_EP2 of the first light emitting elements ED1 and the first ends ED2_EP1 of the second light emitting elements ED2. The second ends (e.g., the second ends ED1_EP2 of the first light emitting elements ED1 and the first ends ED2_EP1 of the second light emitting elements ED2) of the light emitting elements ED of the first light emitting element group EDG1 may be electrically connected to each other through the second contact electrode 721A disposed in the first emission area EMA1.

The second contact electrode 721B disposed in the second emission area EMA2 may contact the second ends of the light emitting elements ED of the second light emitting element group EDG2. The second contact electrode 721B disposed in the second emission area EMA2 may contact the first ends ED2_EP1 of the second light emitting elements ED2. The second ends (e.g., the first ends ED2_EP1 of the second light emitting elements ED2) of the light emitting elements ED of the second light emitting element group EDG2 may be electrically connected to each other through the second contact electrode 721B disposed in the second emission area EMA2.

The first electrode contact portion 712 may be disposed in the sub-region SA of each pixel PX. The first electrode contact portion 712 may be spaced apart from the first contact electrode 711. The first electrode contact portion 712 may overlap the first electrode 210 disposed in the sub-region SA, in the third direction DR3. The first electrode contact portion 712 may be electrically connected to the first electrode 210 through the third contact hole CT1.

The second electrode contact portion 722 may be disposed in the sub-region SA of each pixel PX. The second electrode contact portion 722 may be spaced apart from the second contact electrode 721. The second electrode contact portion 722 may be spaced apart from the first electrode contact portion 712. The second electrode contact portion 722 may overlap the second electrode 220 disposed in the sub-region SA, in the third direction DR3. The second electrode contact portion 722 may be electrically connected to the second electrode 220 through the fourth contact hole CT2.

Hereinafter, the differences between the structure of the first pixel PX1 (or the normal pixel PX_N) and the structure of the second pixel PX2 (or the repair pixel PX_R) will be mainly described.

First, the planar structure of the first pixel PX1 will be described.

In an embodiment, the first pixel PX1 (or the normal pixel PX_N) may further include a first connection pattern 713A and a second connection pattern 723A.

The first connection pattern 713A may be disposed between the first contact electrode 711A and the first electrode contact portion 712A. The first connection pattern 713A may be disposed in the first repair area RPA1. The first connection pattern 713A may physically and/or electrically connect the first contact electrode 711A and the first electrode contact portion 712A of the first pixel PX1. The first contact electrode 711A, the first connection pattern 713A, and the first electrode contact portion 712A of the first pixel PX1 may be integrated into a pattern. For example, the first contact electrode 711A, the first connection pattern 713A, and the first electrode contact portion 712A of the first pixel PX1 may be formed as the same conductive layer 700 (hereinafter, referred to as a fourth conductive layer 700).

The second connection pattern 723A may be disposed between the second contact electrode 721A and the second electrode contact portion 722A. The second connection pattern 723A may be disposed in the first repair area RPA1. The second connection pattern 723A may be spaced apart from the first connection pattern 713A in the first repair area RPA1. The first connection pattern 713A may physically and/or electrically connect the second contact electrode 721A and the second electrode contact portion 722A of the first pixel PX1. The second contact electrode 721A, the second connection pattern 723A, and the second electrode contact portion 722A of the first pixel PX1 may be integrated to form a pattern. For example, the second contact electrode 721A, the second connection pattern 723A, and the second electrode contact portion 722A of the first pixel PX1 may be formed as the same fourth conductive layer 700.

The first contact electrode 711A of the first pixel PX1 may be electrically connected to the first electrode contact portion 712A through the first connection pattern 713A to receive the electrical signal applied to the first electrode 210. The electrical signal applied to the first electrode 210 may be transmitted to the first electrode contact portion 712A through the third contact hole CT1 and transmitted along the first connection pattern 713A and the first contact electrode 711A from the first electrode contact portion 712A. Therefore, the electrical signal applied to the first electrode 210 may be transmitted to first ends of the light emitting elements ED of the first light emitting element group EDG1 through the first electrode contact portion 712A, the first connection pattern 713A, and the first contact electrode 711A that are formed as a pattern.

The second contact electrode 721A of the first pixel PX1 may be electrically connected to the second electrode contact portion 722A through the second connection pattern 723A to receive the electrical signal applied to the second electrode 220. The electrical signal applied to the second electrode 220 may be transmitted to the second electrode contact portion 722A through the fourth contact hole CT2, and transmitted along the second connection pattern 723A and the second contact electrode 721A from the second electrode contact portion 722A. Therefore, the electrical signal applied to the second electrode 220 may be transmitted to the second ends of the light emitting elements ED of the first light emitting element group EDG1 through the second electrode contact portion 722A, the second connection pattern 723A, and the second contact electrode 721A that are formed as a pattern.

Next, the planar structure of the second pixel PX2 will be described.

In an embodiment, the second pixel PX2 (or the repair pixel PX_R) may further include a first repair pattern 810 and a second repair pattern 820.

The first contact electrode 711B and the first electrode contact portion 712B of the second pixel PX2 may be spaced apart from each other with the second repair area RPA2 interposed therebetween. The first contact electrode 711B and the first electrode contact portion 712B may be formed as separate patterns. For example, the first contact electrode 711B and the first electrode contact portion 712B of the second pixel PX2 may not be physically and electrically connected to each other.

The second contact electrode 721B and the second electrode contact portion 722B of the second pixel PX2 may be spaced apart from each other with the second repair area RPA2 interposed therebetween. The second contact electrode 721B and the second electrode contact portion 722B may be formed as separate patterns. For example, the second contact electrode 721B and the second electrode contact portion 722B of the second pixel PX2 may not be physically and electrically connected to each other.

The first repair pattern 810 may be disposed between the first electrode contact portion 712B and the second contact electrode 721B of the second pixel PX2. The first repair pattern 810 may electrically connect the first electrode contact portion 712B and the second contact electrode 721B of the second pixel PX2. A first end 810EP1 of the first repair pattern 810 may be disposed on the second contact electrode 721B, and a second end 810EP2 of the first repair pattern 810 may be disposed on the first electrode contact portion 712B. Both ends of the first repair pattern 810 may contact the second contact electrode 721B and the first electrode contact portion 712B, respectively, and serve to electrically connect them. The first repair pattern 810 may be formed as a different conductive layer from the first electrode contact portion 712B and the second contact electrode 721B.

The second repair pattern 820 may be spaced apart from the first repair pattern 810. The second repair pattern 820 may be disposed between the second electrode contact portion 722B and the first contact electrode 711B of the second pixel PX2. The second repair pattern 820 may electrically connect the second electrode contact portion 722B and the first contact electrode 711B of the second pixel PX2. A first end 820EP1 of the second repair pattern 820 may be disposed on the first contact electrode 711B, and a second end 820EP2 of the second repair pattern 820 may be disposed on the second electrode contact portion 722B. Both ends of the second repair pattern 820 may contact the first contact electrode 711B and the second electrode contact portion 722B, respectively, and serve to electrically connect them. The second repair pattern 820 may be formed as a different conductive layer from the second electrode contact portion 722B and the first contact electrode 711B.

On the other hand, although it is illustrated in the drawing that the first repair pattern 810 is disposed in the second repair area RPA2 and the second repair pattern 820 surrounds the first electrode contact portion 712B to extend from the second electrode contact portion 722B to the first contact electrode 711B, the disclosure is not limited thereto. For example, the first repair pattern 810 may be disposed to surround the second electrode contact portion 722B to extend from the first electrode contact portion 712B to the second contact electrode 721B, and the second repair pattern 820 may be disposed in the second repair area RPA2.

The first contact electrode 711B of the second pixel PX2 may be electrically connected to the second electrode contact portion 722B through the second repair pattern 820 to receive the electrical signal applied to the second electrode 220. The electrical signal applied to the second electrode 220 may be transmitted to the second electrode contact portion 722B through the fourth contact hole CT2, and transmitted along the second repair pattern 820 and the first contact electrode 711B from the second electrode contact portion 722B. Therefore, the electrical signal applied to the second electrode 220 may be transmitted to first ends of the light emitting elements ED of the second light emitting element group EDG2 through the second electrode contact portion 722B, the second repair pattern 820, and the first contact electrode 711B.

The second contact electrode 721B of the second pixel PX2 may be electrically connected to the first electrode contact portion 712B through the first repair pattern 810 to receive the electrical signal applied to the first electrode 210. The electrical signal applied to the first electrode 210 may be transmitted to the first electrode contact portion 712B through the third contact hole CT1, and transmitted along the first repair pattern 810 and the second contact electrode 721B from the first electrode contact portion 712B. Therefore, the electrical signal applied to the first electrode 210 may be transmitted to the second ends of the light emitting elements ED of the second light emitting element group EDG2 through the first electrode contact portion 712B, the first repair pattern 810, and the second contact electrode 721B.

Figure 5:
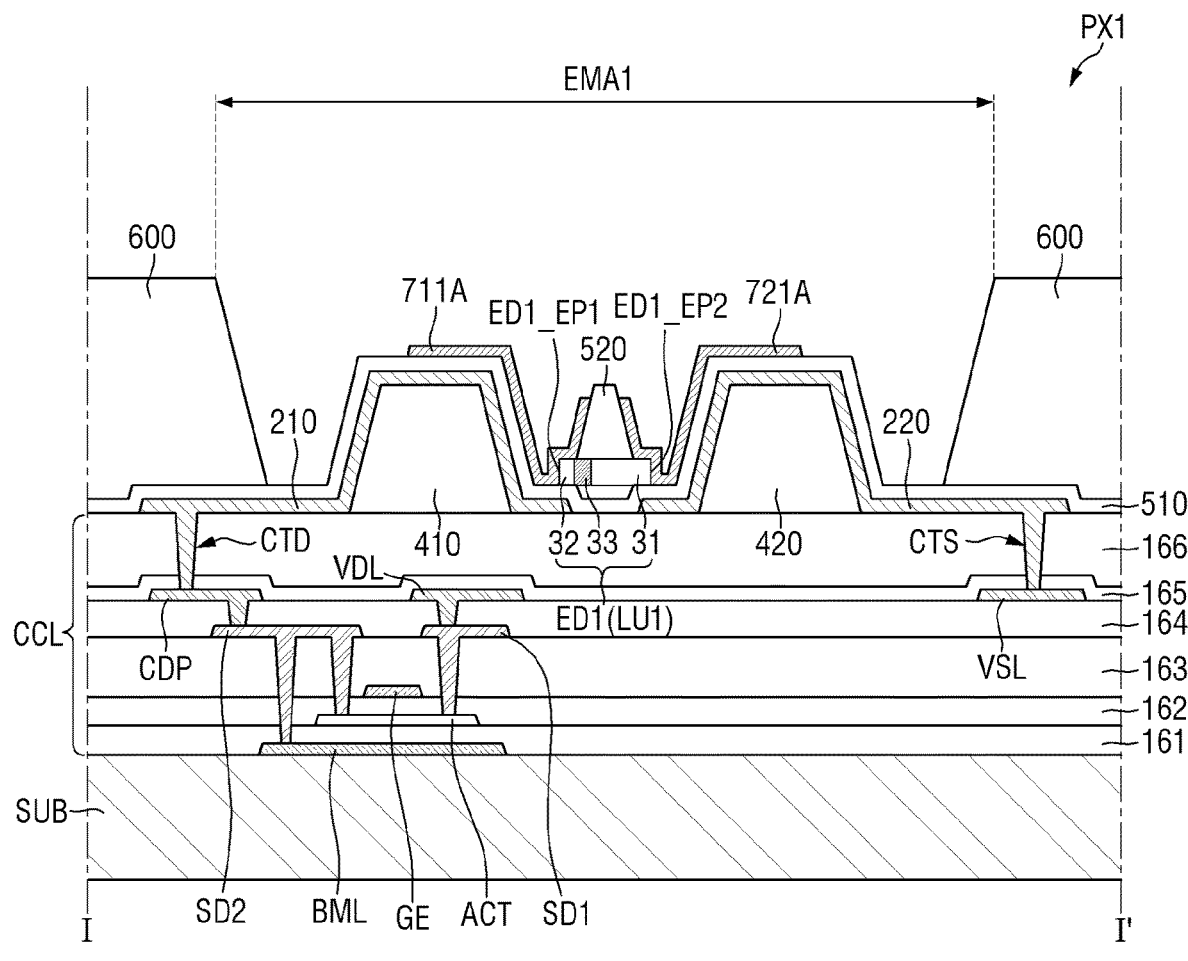
FIG. 5 is a schematic cross-sectional view taken along line I-I' of FIG. 4.
Figure 6:
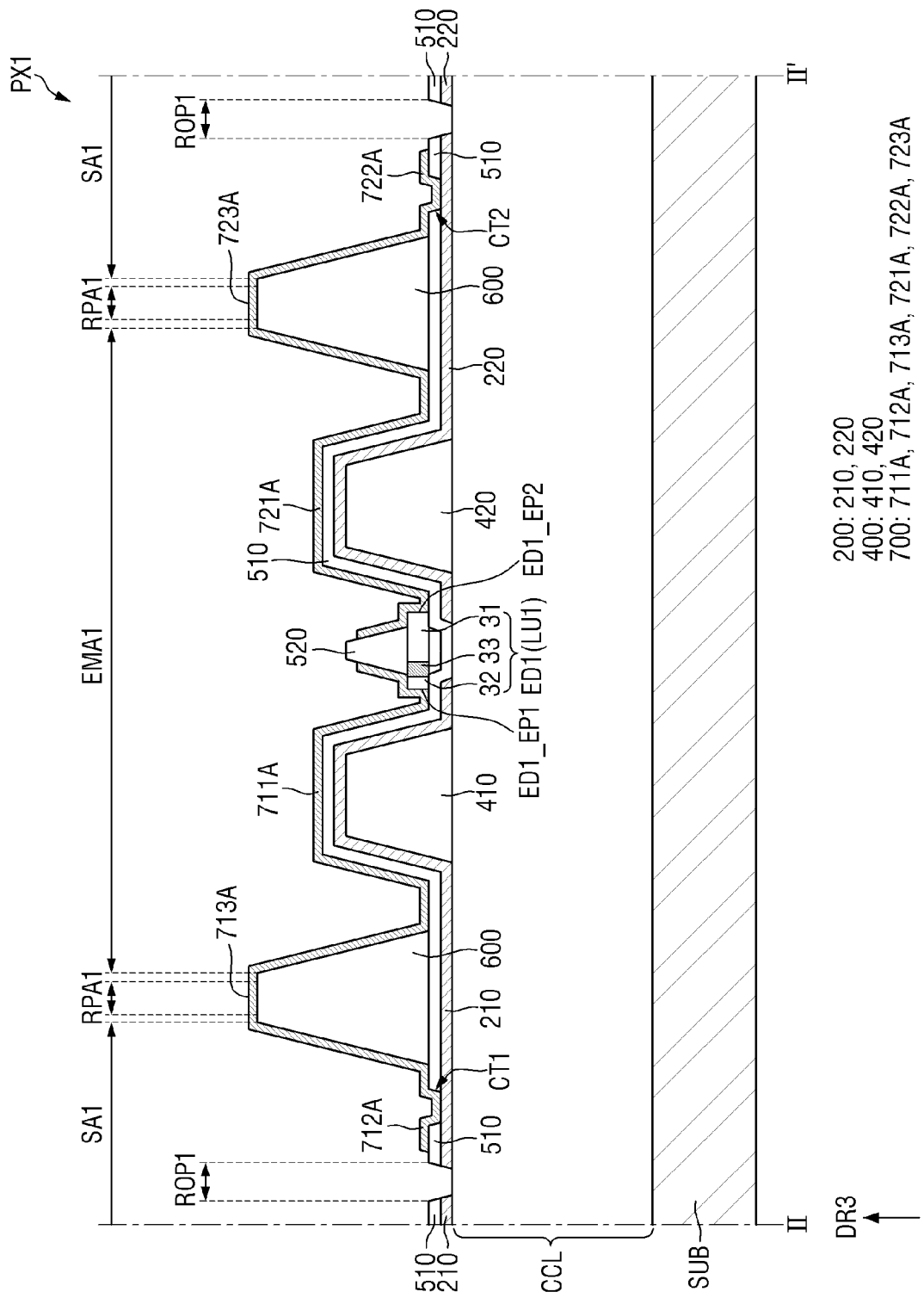
FIG. 6 is a schematic cross-sectional view taken along line II-II' of FIG. 4.

FIG. 5 is a schematic cross-sectional view taken along line I-I' of FIG. 4. FIG. 6 is a schematic cross-sectional view taken along line II-II' of FIG. 4. FIGS. 5 and 6 are schematic views illustrating the cross-sectional structure of the first pixel PX1 according to an embodiment.

Referring to FIGS. 4 to 6, the display device 10 includes a substrate SUB, a circuit element layer CCL disposed on the substrate SUB, and a light emitting element layer disposed on the circuit element layer CCL.

The substrate SUB may be an insulating substrate. The substrate SUB may be made of an insulating material such as glass, quartz, or polymer resin. Further, the substrate SUB may be a rigid substrate, but may also be a flexible substrate which can be bent, folded, or rolled.

The circuit element layer CCL may be disposed on the substrate SUB. The circuit element layer CCL may include a lower metal layer, a semiconductor layer, a first conductive layer, a second conductive layer 140, a third conductive layer 150, and insulating layers.

The lower metal layer is disposed on the substrate SUB. The lower metal layer may include a light blocking layer BML. The light blocking layer BML, may be disposed to cover (or overlap) at least a channel region of an active layer ACT of the first transistor T1 at a position therebelow. However, the disclosure is not limited thereto, and the light blocking layer BML may be omitted. The lower metal layer may contain a material that blocks light. For example, the lower metal layer may be made of an opaque metal material that blocks transmission of light.

A buffer layer 161 may be disposed on the lower metal layer. The buffer layer 161 may be disposed to cover the entire surface of the substrate SUB where the lower metal layer is disposed. The buffer layer 161 may serve to protect transistors from moisture permeating through the substrate SUB that is susceptible to moisture permeation.

A semiconductor layer is disposed on the buffer layer 161. The semiconductor layer may include the active layer ACT of the first transistor T1. The active layer ACT of the first transistor T1 may be disposed to overlap the light blocking layer BML as described above.

The semiconductor layer may include polycrystalline silicon, monocrystalline silicon, oxide semiconductor, and the like. In an embodiment, in case that the semiconductor layer contains polycrystalline silicon, the polycrystalline silicon may be formed by crystallizing amorphous silicon. In case that the semiconductor layer contains polycrystalline silicon, the active layer ACT of the first transistor T1 may include doping regions doped with impurities and channel regions disposed therebetween. In an embodiment, the semiconductor layer may include an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) or the like.

A gate insulating layer 162 may be disposed on the semiconductor layer. The gate insulating layer 162 may function as a gate insulating layer of each transistor. The gate insulating layer 162 may be formed as a multilayer in which inorganic layers including an inorganic material, for example, at least one of silicon oxide ($SiO_x$), silicon nitride ($SiN_x$), and silicon oxynitride ($SiO_xN_y$) are alternately stacked.

The first conductive layer may be disposed on the gate insulating layer 162. The first conductive layer may include a gate electrode GE of the first transistor T1. The gate electrode GE may be disposed to overlap the channel region of the active layer ACT in the third direction DR3, which is the thickness direction of the substrate SUB.

A first interlayer insulating layer 163 may be disposed on the first conductive layer. The first interlayer insulating layer 163 may be disposed to cover the gate electrode GE. The first interlayer insulating layer 163 may function as an insulating layer between the first conductive layer and other layers disposed thereon, and may protect the first conductive layer.

A second conductive layer 140 may be disposed on the first interlayer insulating layer 163. The second conductive layer 140 may include a first electrode SD1 of the first transistor T1 and a second electrode SD2 of the first transistor T1.

The first electrode SD1 of the first transistor T1 and the second electrode SD2 of the first transistor T1 may be electrically connected to both ends of the active layer ACT of the first transistor T1 through the contact holes penetrating the first interlayer insulating layer 163 and the gate insulating layer 162, respectively. Further, the second electrode SD2 of the first transistor T1 may be electrically connected to the light blocking layer BML, through another contact hole penetrating the first interlayer insulating layer 163, the gate insulating layer 162, and the buffer layer 161.

The second interlayer insulating layer 164 may be disposed on the second conductive layer 140. The second interlayer insulating layer 164 may be disposed to cover the first electrode SD1 of the first transistor T1 and the second electrode SD2 of the first transistor T1. The second interlayer insulating layer 164 may function as an insulating layer between the second conductive layer 140 and other layers disposed thereon, and may protect the second conductive layer 140.

A third conductive layer 150 may be disposed on the second interlayer insulating layer 164. The third conductive layer 150 may include the first voltage line VDL, the second voltage line VSL, and a conductive pattern CDP.

The first voltage line VDL may overlap at least a part of a first electrode SD1 of the first transistor T1 in the thickness direction of the substrate SUB. The first voltage line VDL may be electrically connected to the first electrode SD1 of the first transistor T1 through the contact hole penetrating the second interlayer insulating layer 164. A high potential voltage (or a first power voltage) supplied to the first transistor T1 may be applied to the first voltage line VDL.

A part of the second voltage line VSL may overlap the second electrode 220 in the third direction DR3. The second voltage line VSL may be electrically connected to the second electrode 220 through the second contact hole CTS penetrating a via layer 166 and a passivation layer 165 to be described below. A low-potential voltage (or a second power voltage) lower than the high-potential voltage supplied to the first voltage line VDL may be applied to the second voltage line VSL.

For example, the high potential voltage (or the first power voltage) supplied to the first transistor T1 may be applied to the first voltage line VDL, and the low potential voltage (or the second power voltage) lower than the high potential voltage supplied to the first voltage line VDL may be applied to the second voltage line VSL.

The conductive pattern CDP may be electrically connected to the second electrode SD2 of the first transistor T1. The conductive pattern CDP may be electrically connected to the second electrode SD2 of the first transistor T1 through the contact hole penetrating the second interlayer insulating layer 164. Further, the conductive pattern CDP may be electrically connected to the first electrode 210 through the first contact hole CTD penetrating the via layer 166 and the passivation layer 165 to be described below.

The passivation layer 165 may be disposed on the third conductive layer 150. The passivation layer 165 may be disposed to cover the third conductive layer 150. The passivation layer 165 may serve to protect the third conductive layer 150.

The buffer layer 161, the first gate insulating layer 162, the first interlayer insulating layer 163, the second interlayer insulating layer 164, and the passivation layer 165 described above may be formed of inorganic layers stacked in an alternating manner. For example, the buffer layer 161, the gate insulating layer 162, the first interlayer insulating layer 163, the second interlayer insulating layer 164, and the passivation layer 165 described above may be formed as a double layer formed by stacking inorganic layers including at least one of silicon oxide ($SiO_x$), silicon nitride ($SiN_x$), or silicon oxynitride ($SiO_xN_y$), or a multi-layer formed by alternately stacking the inorganic layers. However, the disclosure is not limited thereto, and the buffer layer 161, the gate insulating layer 162, the first interlayer insulating layer 163, the second interlayer insulating layer 164, and the passivation layer 165 described above may be formed as a single inorganic layer containing the above-described insulating material.

The via layer 166 may be disposed on the passivation layer 165. The via layer 166 may include an organic insulating material, for example, an organic material such as polyimide (PI). The via layer 166 may function to flatten a surface. Therefore, the top surface (or the surface) of the via layer 166 on which the light emitting element layer to be described below is disposed may have a substantially flat surface regardless of the shape or existence of the pattern disposed therebelow.

The light emitting element layer of the first pixel PX1 may include the electrode layer 200, a second bank 400, the first bank 600, the light emitting elements ED, and the first and second contact electrodes 711A and 721A, the first and second electrode contact portions 712A and 722A, the first and second connection patterns 713A and 723A, and insulating layers 510 and 520.

The second bank 400 may be disposed on the via layer 166 in the first emission area EMA. The second bank 400 may be directly disposed on a surface of the via layer 166. The second bank 400 may have a structure in which at least a part of the first bank 400 protrudes upward (e.g., a side of the third direction DR3) with respect to one surface of the via layer 166. The protruding part of the second bank 400 may have an inclined side surface.

The second bank 400 may serve to change the traveling direction of the light emitted from the light emitting element ED toward the inclined side surface of the second bank 400 to an upward direction (e.g., a display direction).

The second bank 400 may include a first sub-bank 410 and a second sub-bank 420 spaced apart from each other. The first sub-bank 410 and the second sub-bank 420 spaced apart from each other may serve as a partition wall that provides a space where the light emitting element ED is disposed and also changes the traveling direction of the light emitted from the light emitting element ED to the display direction.

Although it is illustrated in the drawing that the side surface of the second bank 400 is inclined in a linear shape, the disclosure is not limited thereto. For example, the side surface (or an outer surface) of the second bank 400 may have a curved semi-circular or semi-elliptical shape. In an embodiment, the second bank 400 may include an organic insulating material such as polyimide (PI), but the disclosure is not limited thereto.

The electrode layer 200 may be disposed on the second bank 400 and the via layer 166 exposed by the second bank 400. The electrode layer 200 may be disposed on the second bank 400 in the first emission area EMA1 and may be disposed on the via layer 166 exposed by the second bank 400 in the non-emission area.

In the first emission area EMA1, the first electrode 210 may be disposed on the first sub-bank 410, and the second electrode 220 may be disposed on the second sub-bank 420. In the first sub-region SA1, the first electrode 210 may be spaced apart from the first electrode 210 of another pixel PX adjacent thereto in the second direction DR2 with the first separation portion ROP1 interposed therebetween. Similarly, in the first sub-region SA1, the second electrode 220 may be spaced from the second electrode 220 of another pixel PX adjacent thereto in the second direction DR2 with the first separation portion ROP1 interposed therebetween. Therefore, the first electrode 210 and the second electrode 220 may expose the via layer 166 at the first separation portion ROP1 of the first sub-region SA1.

The first electrode 210 may be electrically connected to the conductive pattern CDP of the circuit element layer CCL through the first contact hole CTD penetrating the via layer 166 and the passivation layer 165. Specifically, the first electrode 210 may contact the top surface of the conductive pattern CDP exposed by the first contact hole CTD. The first power voltage applied from the first voltage line VDL may be transmitted to the first electrode 210 through the conductive pattern CDP.

The second electrode 220 may be electrically connected to the second voltage line VSL of the circuit element layer CCL through the second contact hole CTS penetrating the via layer 166 and the passivation layer 165. The second electrode 220 may contact the top surface of the second voltage line VSL exposed by the second contact hole CTS. The second power voltage applied from the second voltage line VSL may be transmitted to the second electrode 220.

The electrode layer 200 may include a conductive material having high reflectivity. For example, the electrode layer 200 may include a metal such as silver (Ag), copper (Cu), or aluminum (Al) as a material having high reflectivity, or may be an alloy including aluminum (Al), nickel (Ni), lanthanum (La), and the like. The electrode layer 200 may reflect the light emitted from the light emitting element ED and traveling toward the side surface of the second bank 400 in the upward direction of each sub-pixel PX.

However, the disclosure is not limited thereto, and the electrode layer 200 may further include a transparent conductive material. For example, the electrode layer 200 may include a material such as ITO, IZO, and ITZO. In some embodiments, the electrode layer 200 may have a structure in which at least one transparent conductive material and at least one metal layer having high reflectivity are stacked, or may be formed as a layer including them. For example, the electrode layer 200 may have a stacked structure of ITO/Ag/ITO, ITO/Ag/IZO, ITO/Ag/ITZO/IZO, or the like.

The first insulating layer 510 may be disposed on the via layer 166 on which the electrode layer 200 is formed.

The first insulating layer 510 may be disposed on the entire via layer 166 on which the electrode layer 200 is formed in the first emission area EMA1. The first insulating layer 510 may protect the electrode layer 200 in the first emission area EMA1 and also insulate the first electrode 210 and the second electrode 220 from each other.

The first insulating layer 510 may include the third contact hole CT1 exposing a part of the top surface of the first electrode 210 and the fourth contact hole CT2 exposing a part of the top surface of the second electrode 220 in the first sub-region SA. The first electrode 210 may be electrically connected to the first electrode contact portion 712A through the third contact hole CT1 penetrating the first insulating layer 510 in the first sub-region SA1, and the second electrode 220 may be electrically connected to the second electrode contact portion 722A through the fourth contact hole CT2 penetrating the first insulating layer 510 in the first sub-region SA1.

The first bank 600 may be disposed on the first insulating layer 510. The first bank 600 may be disposed in the form of a grid pattern including portions extending in the first and second directions DR1 and DR2 in a plan view.

The first bank 600 may be disposed across the boundary of adjacent pixels PX to divide the pixels PX and may divide the emission area EMA and the sub-region SA. Further, the first bank 600 has a height greater than that of the second bank 400 and divides the emission area EMA and the sub-region SA. Accordingly, in an inkjet printing step for aligning the light emitting elements ED during the manufacturing process of the display device 10, ink in which the light emitting elements ED are dispersed can be sprayed into the emission area EMA without being mixed with an adjacent pixel PX.

The first light emitting element group EDG1 may be disposed on the first insulating layer 510 in the first emission area EMA1. The light emitting elements ED included in the first light emitting element group EDG1 may be aligned such that both ends thereof are disposed on the first electrode 210 and the second electrode 220, respectively. As described above, the first light emitting element group EDG1 may include the first light emitting elements ED1 and the second light emitting elements ED2 electrically connected in parallel to each other. The first ends ED1_EP1 of the first light emitting elements ED1 may be disposed on the first electrode 210, and the second ends ED1_EP2 of the first light emitting elements ED1 may be disposed on the second electrode 220. Further, the second ends ED2_EP2 of the second light emitting elements ED2 may be disposed on the first electrode 210, and the first ends ED2_EP1 of the second light emitting elements ED2 may be disposed on the second electrode 220.

The second insulating layer 520 may be disposed on the first light emitting element group EDG1. The second insulating layer 520 may be partially disposed on the light emitting element ED of the first light emitting element group EDG1. The second insulating layer 520 may be disposed to partially surround the outer surface of the light emitting element ED, but not to cover both ends of the light emitting element ED.

A part of the second insulating layer 520 disposed on the light emitting element ED may be arranged to extend in the second direction DR2 on the first insulating layer 510 in a plan view, so that it may form a linear or island-like pattern in each pixel PX. The second insulating layer 520 may function to protect the light emitting element ED and also affix the light emitting element ED in a manufacturing process of the display device 10. Although not shown in the drawing, the material forming the second insulating layer 520 may fill an empty space (or depressed or trenched portion) between the first insulating layer 510 and the light emitting element ED that is formed between the first electrode 210 and the second electrode 220.

The fourth conductive layer 700 may be disposed on the second insulating layer 520. The fourth conductive layer 700 may include the first contact electrode 711A and the second contact electrode 721A arranged in the first emission area EMA1, the first electrode contact portion 712A and the second electrode contact portion 722A arranged in the first sub-region SA1, and the first connection pattern 713A and the second connection pattern 723A arranged in the first repair area RPA1.

The first contact electrode 711A may be disposed on the first electrode 210 and a first end of the first light emitting element group EDG1 in the first emission area EMA1. The first insulating layer 510 may be disposed between the first contact electrode 711A and the first electrode 210 to prevent the first contact electrode 711A from contacting and the first electrode 210. The first contact electrode 711A may contact first ends of the light emitting elements ED of the first light emitting element group EDG1 exposed by the second insulating layer 520. The first contact electrode 711A may contact the first ends ED1_EP1 of the first light emitting elements ED1 and the second ends ED2_EP2 of the second light emitting elements ED2 arranged in the first emission area EMA1.

The second contact electrode 721A may be disposed on the second electrode 220 and a second end of the first light emitting element group EDG1 in the first emission area EMA1. The first insulating layer 510 may be disposed between the second contact electrode 721A and the second electrode 220 to prevent the second contact electrode 721A from contacting the second electrode 220. The second contact electrode 721A may contact the second ends of the light emitting elements ED of the first light emitting element group EDG1 exposed by the second insulating layer 520. The second contact electrode 721A may contact the second ends ED EP2 of the first light emitting elements ED1 and the first ends ED2_EP1 of the second light emitting elements ED2 arranged in the first emission area EMA1.

The first contact electrode 711A and the second contact electrode 721A may be spaced from each other with the second insulating layer 520 interposed therebetween.

The first electrode contact portion 712A may be disposed on the first electrode 210 in the first sub-region SA1. The first electrode contact portion 712A may contact the top surface of the first electrode 210 exposed by the third contact hole CT1 of the first insulating layer 510. The first electrode contact portion 712A may be electrically connected to the first electrode 210.

The second electrode contact portion 722A may be disposed on the second electrode 220 in the first sub-region SA1. The second electrode contact portion 722A may contact the top surface of the second electrode 220 exposed by the fourth contact hole CT2 of the first insulating layer 510. The second electrode contact portion 722A may be electrically connected to the second electrode 220.

The first connection pattern 713A may be disposed between the first contact electrode 711A and the first electrode contact portion 712A. The first connection pattern 713A may be disposed on the first insulating layer 510 and the second bank 600. The first connection pattern 713A, the first contact electrode 711A, and the first electrode contact portion 712A may be formed as the same fourth conductive layer 700 to form a pattern.

The second connection pattern 723A may be disposed between the second contact electrode 721A and the second electrode contact portion 722A. The second connection pattern 723A may be disposed on the first insulating layer 510 and the second bank 600. The second connection pattern 723A, the second contact electrode 721A, and the second electrode contact portion 722A may be formed as the same fourth conductive layer 700 to form a pattern.

The fourth conductive layer 700 may include a conductive material. For example, the fourth conductive layer 700 may include ITO, IZO, ITZO, aluminum (Al), or the like.

Figure 7:
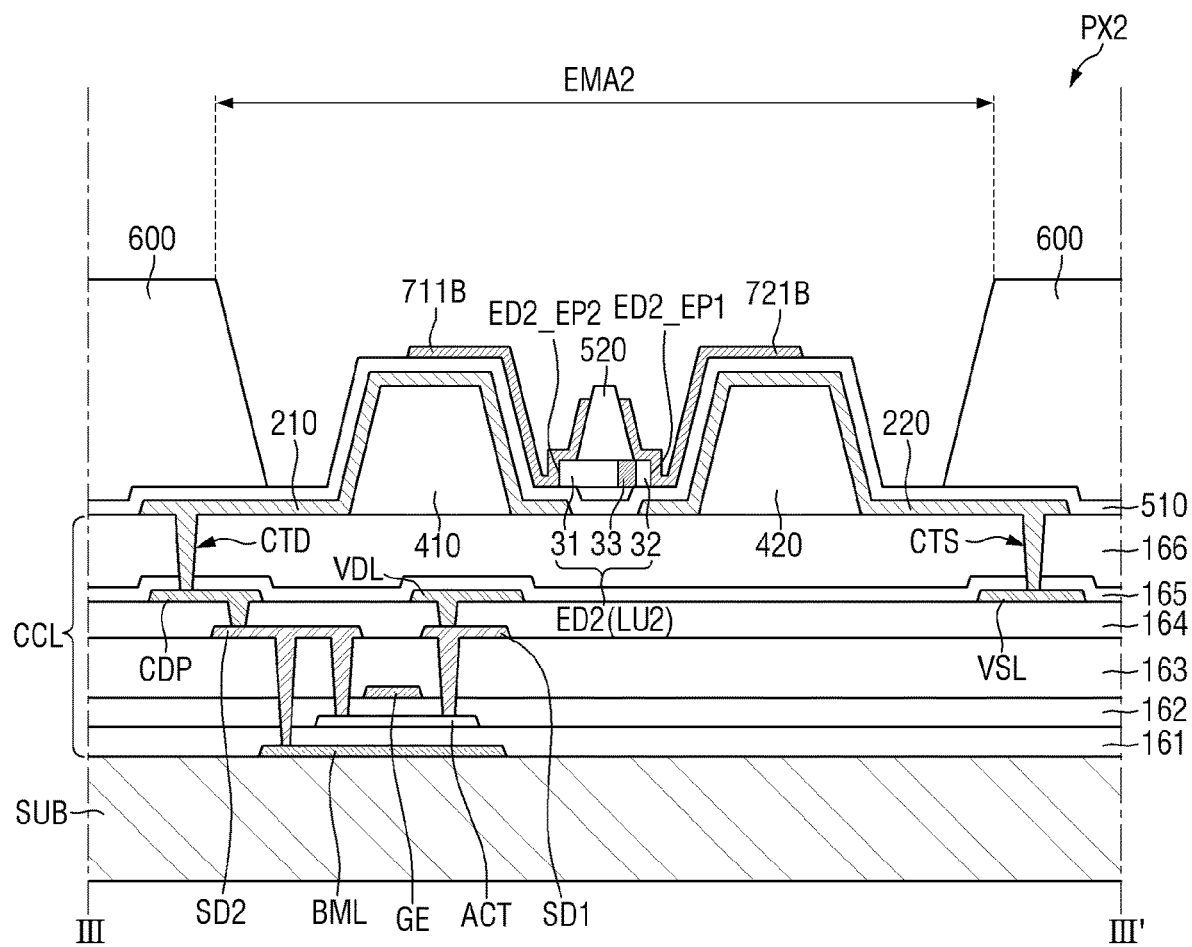
FIG. 7 is a schematic cross-sectional view taken along line of FIG. 4.
Figure 8:
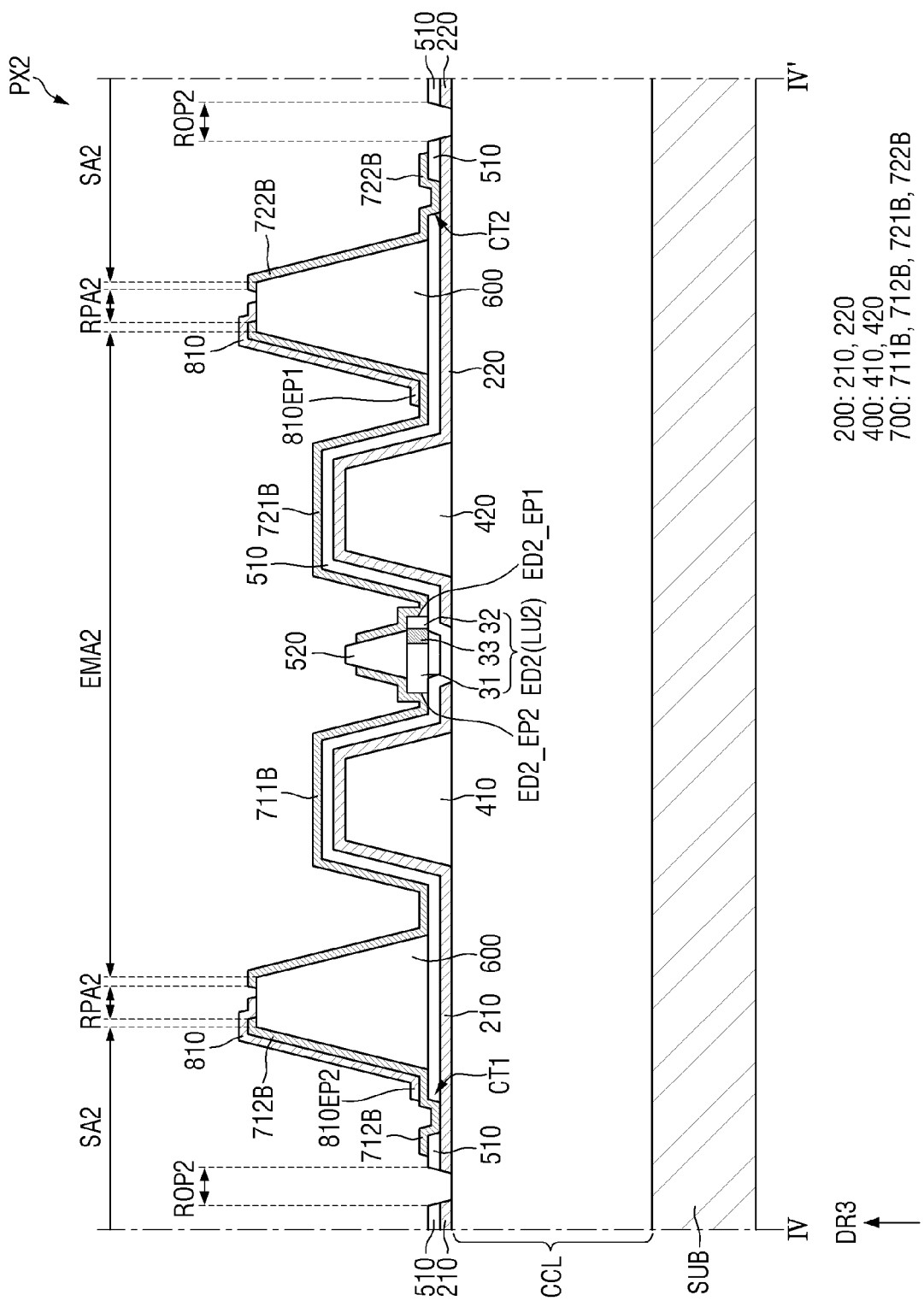
FIG. 8 is a schematic cross-sectional view taken along line IV-IV' of FIG. 4.
Figure 9:
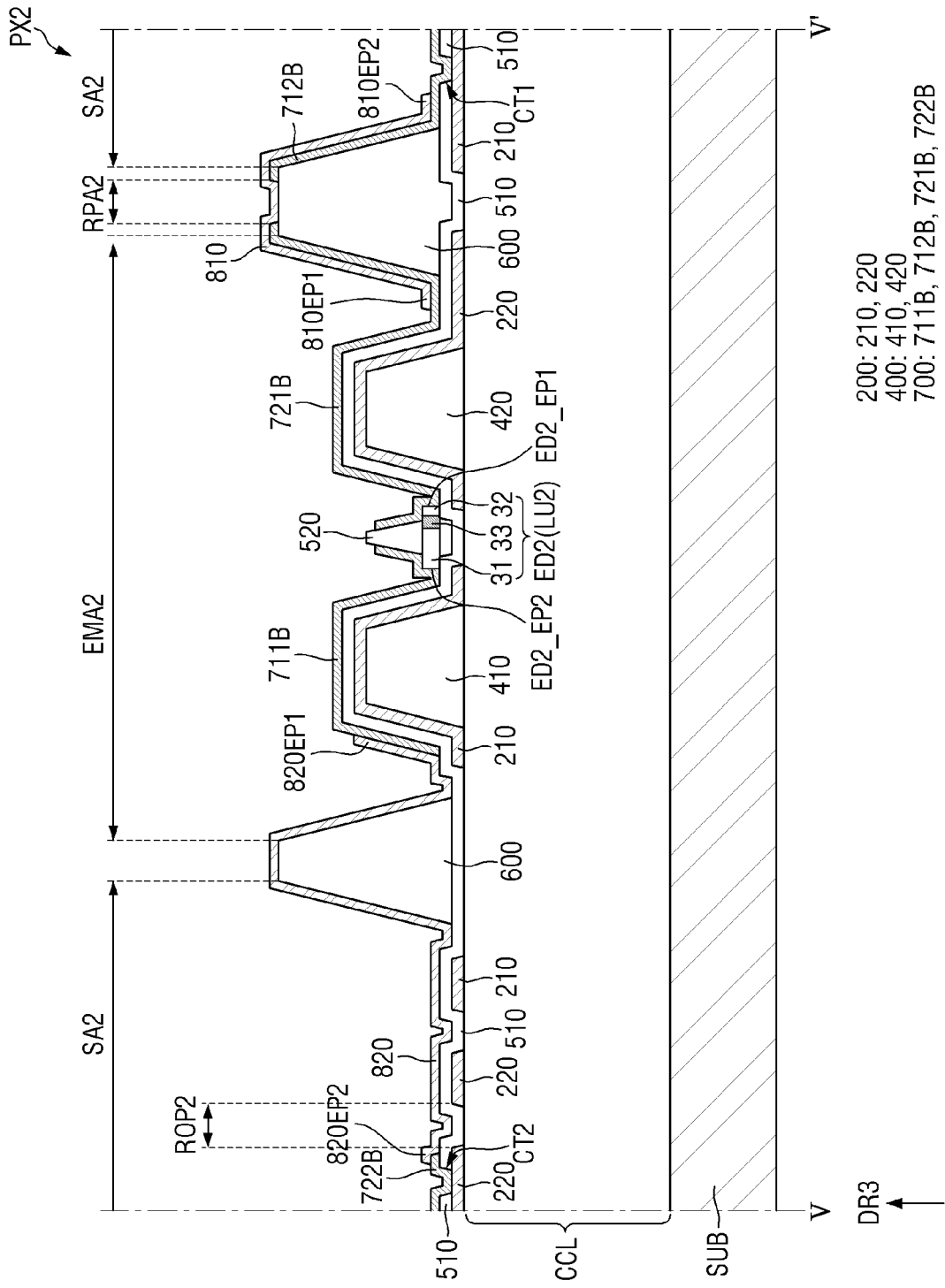
FIG. 9 is a schematic cross-sectional view taken along line V-V of FIG. 4.

FIG. 7 is a schematic cross-sectional view taken along line of FIG. 4. FIG. 8 is a schematic cross-sectional view taken along line IV-IV' of FIG. 4. FIG. 9 is a schematic cross-sectional view taken along line V-V of FIG. 4.

FIGS. 7 to 9 illustrate the cross-sectional structure of the second pixel PX2. Hereinafter, in describing the cross-sectional structure of the second pixel PX2, a description of the same structure as that of the first pixel PX1 will be omitted, and the differences will be mainly described. Therefore, a detailed description of the substrate SUB and the circuit element layer CCL disposed on the substrate SUB will be omitted. Further, a detailed description of the electrode layer 200, the first bank 600, the second bank 400, and the insulating layers 510 and 520 of the light emitting element layer of the second pixel PX2 will be omitted.

The light emitting element layer of the second pixel PX2 may include the electrode layer 200, the second bank 400, the first bank 600, the light emitting elements ED, the first and second contact electrodes 711B and 721B, the first and second electrode contact portions 712B and 722B, the first and second repair patterns 810 and 820, and the insulating layers 510 and 520.

The second light emitting element group EDG2 may be disposed on the first insulating layer 510 in the second emission area EMA2. As described above, the second light emitting element group EDG2 may include the second light emitting elements ED2 electrically connected in parallel to each other. The second ends ED2_EP2 of the second light emitting elements ED2 may be disposed on the first electrode 210, and the first ends ED2_EP1 of the second light emitting elements ED2 may be disposed on the second electrode 220.

The fourth conductive layer 700 may be disposed on the second insulating layer 520. The fourth conductive layer 700 may include the first contact electrode 711B and the second contact electrode 721B arranged in the second emission area EMA2, and the first electrode contact portion 712B and the second electrode contact portion 722B arranged in the second sub-region SA2. The fourth conductive layer 700 of the second pixel PX2 may not include the first connection pattern 713A and the second connection pattern 723A of the first pixel PX1.

The first contact electrode 711B may be disposed on the first electrode 210 and a first end of the second light emitting element group EDG2 in the second emission area EMA2. The first insulating layer 510 may be disposed between the first contact electrode 711B and the first electrode 210 to prevent the first contact electrode 711B from contacting the first electrode 210. The first contact electrode 711B may contact first ends of light emitting elements ED of the second light emitting element group EDG2 exposed by the second insulating layer 520. The first contact electrode 711B may contact the second ends ED2_EP2 of the second light emitting elements ED2 disposed in the second emission area EMA2.

The second contact electrode 721B may be disposed on the second electrode 220 and the second end of the second light emitting element group EDG2 in the second emission area EMA2. The first insulating layer 510 may be disposed between the second contact electrode 721B and the second electrode 220 to prevent the second contact electrode 721B from contacting the second electrode 220. The second contact electrode 721B may contact the second ends of the light emitting elements ED of the second light emitting element group EDG2 exposed by the second insulating layer 520. The second contact electrode 721B may contact the first ends ED2_EP1 of the second light emitting elements ED2 disposed in the second emission area EMA2.

The first electrode contact portion 712B may be disposed on the first electrode 210 in the second sub-region SA2. The first electrode contact portion 712B may contact the top surface of the first electrode 210 exposed by the third contact hole CT1 of the first insulating layer 510. The first electrode contact portion 712B may be electrically connected to the first electrode 210.

The second electrode contact portion 722B may be disposed on the second electrode 220 in the second sub-region SA2. The second electrode contact portion 722B may contact the top surface of the second electrode 220 exposed by the fourth contact hole CT2 of the first insulating layer 510. The second electrode contact portion 722B may be electrically connected to the second electrode 220.

The first contact electrode 711B and the first electrode contact portion 712B may be spaced apart from each other with the second repair area RPA2 interposed therebetween. The first contact electrode 711B and the first electrode contact portion 712B may expose the first bank 600 in the second repair area RPA2. The second contact electrode 721B and the second electrode contact portion 722B may be spaced apart from each other with the second repair area RPA2 interposed therebetween. The second contact electrode 721B and the second electrode contact portion 722B may expose the first bank 600 in the second repair area RPA2.

The shapes of the first contact electrode 711B and the first electrode contact portion 712B spaced apart from each other in the second repair area RPA2 and the shapes of the second contact electrode 721B and the second electrode contact portion 722B spaced apart from each other in the second repair area RPA2 may be formed by the repair process to be described below. A detailed description thereof will be given below.

The first repair pattern 810 and the second repair pattern 820 may be arranged on the fourth conductive layer 700. The first repair pattern 810 and the second repair pattern 820 may be spaced apart from each other.

The first repair pattern 810 may be disposed between the first electrode contact portion 712B and the second contact electrode 721B. The first repair pattern 810 may have a first end 810EP1 disposed on the second contact electrode 721B and the second end 810EP2 disposed on the first electrode contact portion 712B. The first repair pattern 810 may have the first end 810EP1 directly contacting a part of the second contact electrode 721B and the second end 810EP2 directly contacting a part of the first electrode contact portion 712B. Both ends 810EP1 and 810EP2 of the first repair pattern 810 may contact the first electrode contact portion 712B and the second contact electrode 721B of the fourth conductive layer 700, respectively, and serve to electrically connect them.

The second repair pattern 820 may be disposed between the second electrode contact portion 722B and the first contact electrode 711B. The second repair pattern 820 may have a first end 820EP1 disposed on the first contact electrode 711B and a second end 820EP2 disposed on the second electrode contact portion 722B. The second repair pattern 820 may have the first end 820EP1 directly contacting a part of the first contact electrode 711B and the second end 820EP2 directly contacting a part of the second electrode contact portion 722B. Both ends 820EP1 and 820EP2 of the second repair pattern 820 may contact the second electrode contact portion 722B and the first contact electrode 711B of the fourth conductive layer 700, respectively, and serve to electrically connect them.

On the other hand, referring to FIGS. 6 and 9, in the first pixel PX1 and the second pixel PX2, the flow of the current between the first electrode 210 and the second electrode 220 through the fourth conductive layer 700 may be different.

Referring to FIG. 6, the current may flow through the first pixel PX1 from the left side to the right side in the drawing. The first electrode 210 disposed in the first sub-region SA1 illustrated on the left side of FIG. 6 may be electrically connected to the first electrode contact portion 712A through the third contact hole CT1, and the second electrode 220 disposed in the first sub-region SA1 illustrated on the right side of FIG. 6 may be electrically connected to the second electrode contact portion 722A through the fourth contact hole CT2. The current may flow from the first electrode 210 to the second electrode 220 by the electrical signals transmitted to the first electrode 210 and the second electrode 220. Therefore, the current may flow from the first electrode 210 to the second electrode 220 of the first pixel PX1 through the first electrode contact portion 712A, the first connection pattern 713A, the first contact electrode 711A, the first light emitting elements ED1 of the first light emitting element group EDG1, the second contact electrode 721A, the second connection pattern 723A, and the second electrode contact portion 722A by the electrical signals transmitted to the first electrode 210 and the second electrode 220. In this case, the current flowing from the first electrode 210 to the second electrode 220 through the first light emitting elements ED1 of the first light emitting element group EDG1 that are aligned in the forward direction may flow from the second semiconductor layers 32 to the first semiconductor layers 31 of the first light emitting elements ED1. Further, in the second light emitting elements ED2 of the first light emitting element group EDG1 that are aligned in a reverse direction, the first semiconductor layers 31, the element active layers 33, and the second semiconductor layers 32 are sequentially arranged in the direction of the current, so that there may be substantially no current flowing through the second light emitting elements ED2. Therefore, although the first light emitting element group EDG1 includes the second light emitting elements ED2 aligned in the reverse direction, the first light emitting elements ED1 may allow the current to flow from the first ends ED1_EP1 to the second ends ED1_EP2 of the first light emitting elements ED1.

Referring to FIG. 9, in the second pixel PX2, the current may flow from the right side to the left side in the drawing. The first electrode 210 disposed in the second sub-region SA2 illustrated on the right side of FIG. 9 may be electrically connected to the first electrode contact portion 712B through the third contact hole CT1, and the second electrode 220 disposed in the second sub-region SA2 illustrated on the left side of FIG. 9 may be electrically connected to the second electrode contact portion 722B through the fourth contact hole CT2. The current may flow from the first electrode 210 to the second electrode 220 by the electrical signals transmitted to the first electrode 210 and the second electrode 220. Therefore, the current may flow from the first electrode 210 to the second electrode 220 of the second pixel PX2 through the first electrode contact portion 712B, the first repair pattern 810, the second contact electrode 721B, the second light emitting elements ED2 of the second light emitting element group EDG2, the first contact electrode 711B, the second repair pattern 820, and the second electrode contact portion 722B by the electrical signals transmitted to the first electrode 210 and the second electrode 220. By electrically connecting the first ends ED2_EP1 of the second light emitting elements ED2 to the first electrode 210 through the first repair pattern 810 and electrically connecting the second ends ED2_EP2 of the second light emitting elements ED2 to the second electrode 220 through the second repair pattern 820, the second semiconductor layers 32 of the second light emitting elements ED2 may be electrically connected to the first electrode 210, and the first semiconductor layers 31 of the second light emitting elements ED2 may be electrically connected to the second electrode 220. In this case, the current flowing from the first electrode 210 to the second electrode 220 through the second light emitting elements ED2 included in the second light emitting element group EDG2 may flow from the second semiconductor layers 32 to the first semiconductor layers 31 of the second light emitting elements ED2. Therefore, although the second light emitting element group EDG2 includes only the second light emitting elements ED2 having the second ends ED2_EP2 disposed on the first electrode 210 and the first ends ED2_EP1 disposed on the second electrode 220, the current may flow through the second light emitting elements ED2 by changing the first electrode 210 and the second electrode 220 electrically connected to both ends of the second light emitting elements ED2 through the first and second repair patterns 810 and 820, respectively. Therefore, since the second light emitting elements ED2 included in the second light emitting element group EDG2 are electrically connected in the forward direction between the first electrode 210 and the second electrode 220 by the first and second repair patterns 810 and 820 and the current flows therethrough, the second light emitting elements ED2 may emit light.

Figure 10:
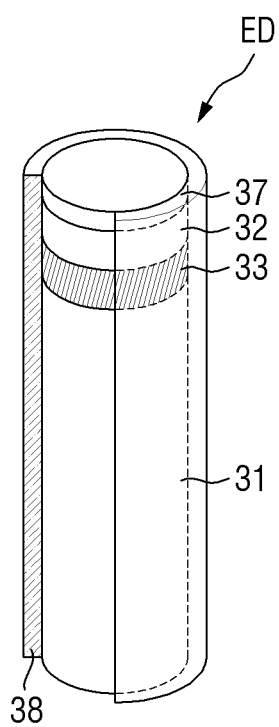
FIG. 10 is a schematic diagram of a light emitting element according to an embodiment.

FIG. 10 is a schematic diagram of a light emitting element according to an embodiment.

Referring to FIG. 10, the light emitting element ED which is a particulate element may have a rod or cylindrical shape having a predetermined aspect ratio. The length of the light emitting element ED may be larger than the diameter of the light emitting element ED, and the aspect ratio may be about 6:5 to about 100:1, but the disclosure is not limited thereto.

The light emitting element ED may have a size of a nanometer scale (equal to or greater than about 1 nm and less than about 1 µm) to a micrometer scale (equal to or greater than about 1 µm and less than about 1 mm). In an embodiment, both the diameter and the length of the light emitting element ED may be on a nanometer scale, or on a micrometer scale. In some other embodiments, the diameter of the light emitting element ED may be on a nanometer scale, while the length of the light emitting element ED may be on a micrometer scale. In some embodiments, some of the light emitting elements ED may have a diameter and/or length on a nanometer scale, while some others of the light emitting elements ED may have a diameter and/or length on a micrometer scale.

In an embodiment, the light emitting element ED may be an inorganic light emitting diode. The inorganic light emitting diode may include semiconductor layers. For example, the inorganic light emitting diode may include a first conductive (e.g., n-type) semiconductor layer, a second conductive (e.g., p-type) semiconductor layer, and an active semiconductor layer interposed therebetween. The active semiconductor layer may receive holes and electrons from the first conductive semiconductor layer and the second conductive semiconductor layer, respectively, and the holes and electrons that have reached the active semiconductor layer may be coupled or combined to emit light.

In an embodiment, the above-described semiconductor layers may be sequentially stacked in the longitudinal direction of the light emitting element ED. As shown in FIG. 10, the light emitting element ED may include a first semiconductor layer 31, an element active layer 33, and a second semiconductor layer 32 that are sequentially stacked in the longitudinal direction.

The first semiconductor layer 31 may be doped with a first conductive dopant. The first conductive dopant may be Si, Ge, Sn, or the like. In an embodiment, the first semiconductor layer 31 may be n-GaN doped with n-type Si.

The second semiconductor layer 32 may be spaced apart from the first semiconductor layer 31 with the element active layer 33 interposed therebetween. The second semiconductor layer 32 may be doped with a second conductive dopant such as Mg, Zn, Ca, Se, Ba, or the like. In an embodiment, the second semiconductor layer 32 may be p-GaN doped with p-type Mg.

The element active layer 33 may include a material having a single or multiple quantum well structure. As described above, the element active layer 33 may emit light by coupling of electron-hole pairs according to an electrical signal applied through the first semiconductor layer 31 and the second semiconductor layer 32.

In some embodiments, the element active layer 33 may have a structure in which semiconductor materials having large band gap energy and semiconductor materials having small band gap energy are alternately stacked, and may include other group III to V semiconductor materials according to the wavelength band of the emitted light.

The light emitted from the element active layer 33 may be projected through both side surfaces as well as the outer surface of the light emitting element ED in a longitudinal direction. For example, the direction of light emitted from the element active layer 33 is not limited to a direction.

The light emitting element ED may further include an element electrode layer 37 disposed on the second semiconductor layer 32. The element electrode layer 37 may contact the second semiconductor layer 32. The element electrode layer 37 may be an ohmic contact electrode, but the disclosure is not limited thereto, and the element electrode layer 37 may be a Schottky contact electrode.

In case that both ends of the light emitting element ED are electrically connected to the first and second contact electrodes 711 and 721 to apply an electrical signal to the first and second semiconductor layers 31 and 32, the element electrode layer 37 may be disposed between the second semiconductor layer 32 and the first and second contact electrodes 711 and 721 to reduce resistance. The element electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). The element electrode layer 37 may include an n-type or p-type doped semiconductor material.

The light emitting element ED may further include an element insulating layer 38 surrounding the outer peripheral surfaces of the first semiconductor layer 31, the second semiconductor layer 32, the element active layer 33 and/or the element electrode layer 37. The element insulating layer 38 is disposed to surround at least the outer surface of the element active layer 33 and may extend in the direction in which the light emitting element ED extends. The element insulating layer 38 may function to protect the members. Since the element insulating layer 38 is made of materials having insulating properties, it is possible to prevent an electrical short circuit that may occur in case that the element active layer 33 directly contacts an electrode through which an electrical signal is transmitted to the light emitting element ED. Further, since the element insulating layer 38 includes the element active layer 33 to protect the outer peripheral surfaces of the first and second semiconductor layers 31 and 32, it is possible to prevent degradation in light emission efficiency.

Figure 11:
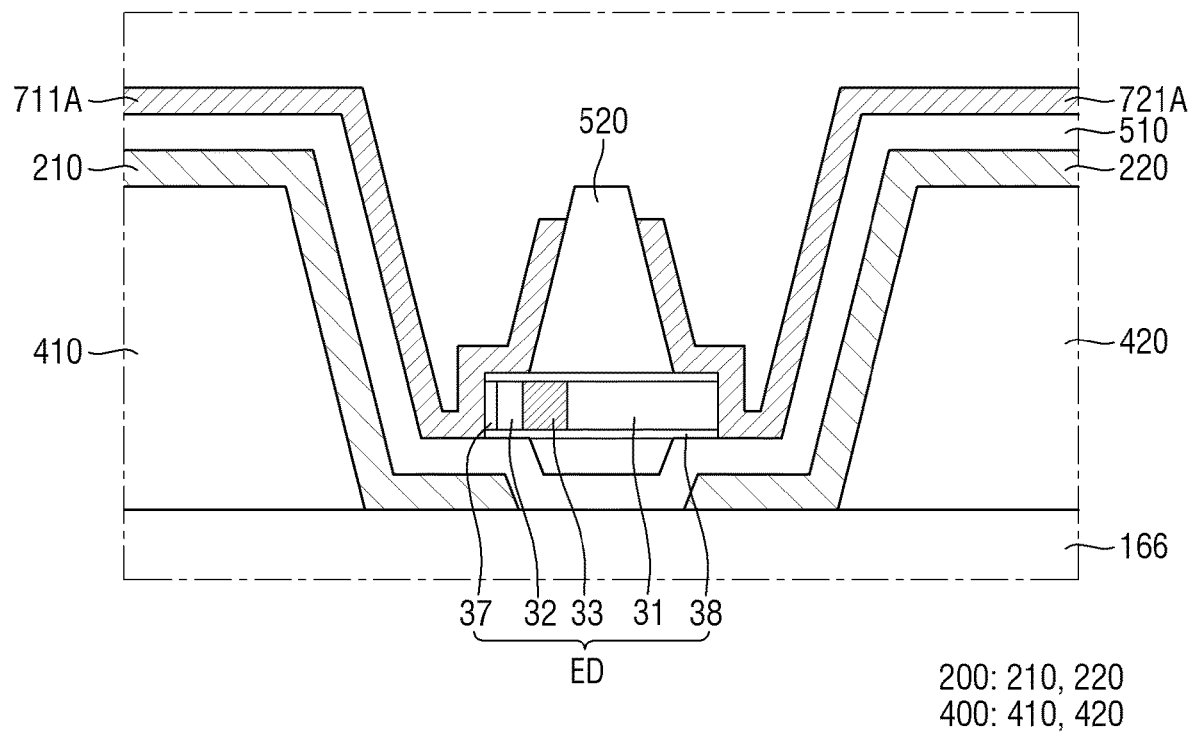
FIG. 11 is an enlarged cross-sectional view illustrating relative arrangement of a plurality of members arranged in a light emitting element layer according to an embodiment.

FIG. 11 is a schematic enlarged cross-sectional view illustrating relative arrangement of members arranged in a light emitting element layer according to an embodiment.

Referring to FIGS. 10 and 11, the light emitting element ED may extend in a direction parallel to the top surface of the substrate SUB. The semiconductor layers included in the light emitting element ED may be sequentially arranged in the direction parallel to the top surface of the substrate SUB. For example, the first semiconductor layer 31, the element active layer 33, and the second semiconductor layer 32 of the light emitting element ED may be sequentially arranged in the direction parallel to the top surface of the substrate SUB.

In the light emitting element ED, the first semiconductor layer 31, the element active layer 33, the second semiconductor layer 32, and the element electrode layer 37 may be sequentially formed in the direction parallel to the top surface of the substrate SUB (or the top surface of the via layer 166) in a cross-sectional view across both ends of the light emitting element ED.

The second insulating layer 520 may be disposed on the light emitting element ED in the emission area EMA. The second insulating layer 520 may be disposed on the light emitting element ED to expose both ends of the light emitting element ED. The second insulating layer 520 may be disposed to surround the outer surface of the light emitting element ED. The second insulating layer 520 may be disposed to surround the element insulating layer 38 of the light emitting element ED and expose both ends of the light emitting element ED.

The first contact electrode 711 may be disposed on the first electrode 210 and a first end of the light emitting element ED. The first end of the light emitting element ED on which the first contact electrode 711 is disposed may be the first end of the light emitting element ED disposed on the first electrode 210 and exposed by the second insulating layer 520. For example, the first contact electrode 711 may contact the first ends ED1_EP1 of the first light emitting elements ED1. Although not shown in the drawing, the first contact electrode 711 may contact the second ends ED2_EP2 of the second light emitting elements ED2.

The second contact electrode 721 may be disposed on the second electrode 220 and the second end of the light emitting element ED. The second end of the light emitting element ED on which the second contact electrode 721 is disposed may be the second end of the light emitting element ED disposed on the second electrode 220 and exposed by the second insulating layer 520. For example, the second contact electrode 721 may contact the second ends ED1_EP2 of the first light emitting elements ED1. On the other hand, although not shown in the drawing, the second contact electrode 721 may contact the first ends ED2_EP1 of the second light emitting elements ED2.

The first contact electrode 711 and the second contact electrode 721 may be spaced apart from each other with the second insulating layer 520 interposed therebetween. The first contact electrode 711 may contact the first end of the light emitting element ED disposed on the first electrode 210 to transmit an electrical signal to the first end of the light emitting element ED, and the second electrode 721 may contact the second end of the light emitting element ED disposed on the second electrode 220 to transmit an electrical signal to the second end of the light emitting element ED. The first contact electrode 711 and the second contact electrode 721 may be electrically insulated from each other.

FIGS. 12 to 17 are schematic diagrams illustrating a method of repairing a defective pixel in which alignment of light emitting elements is defective. Hereinafter, a method of repairing a defective pixel will be described with reference to FIGS. 12 to 17.

Figure 12:
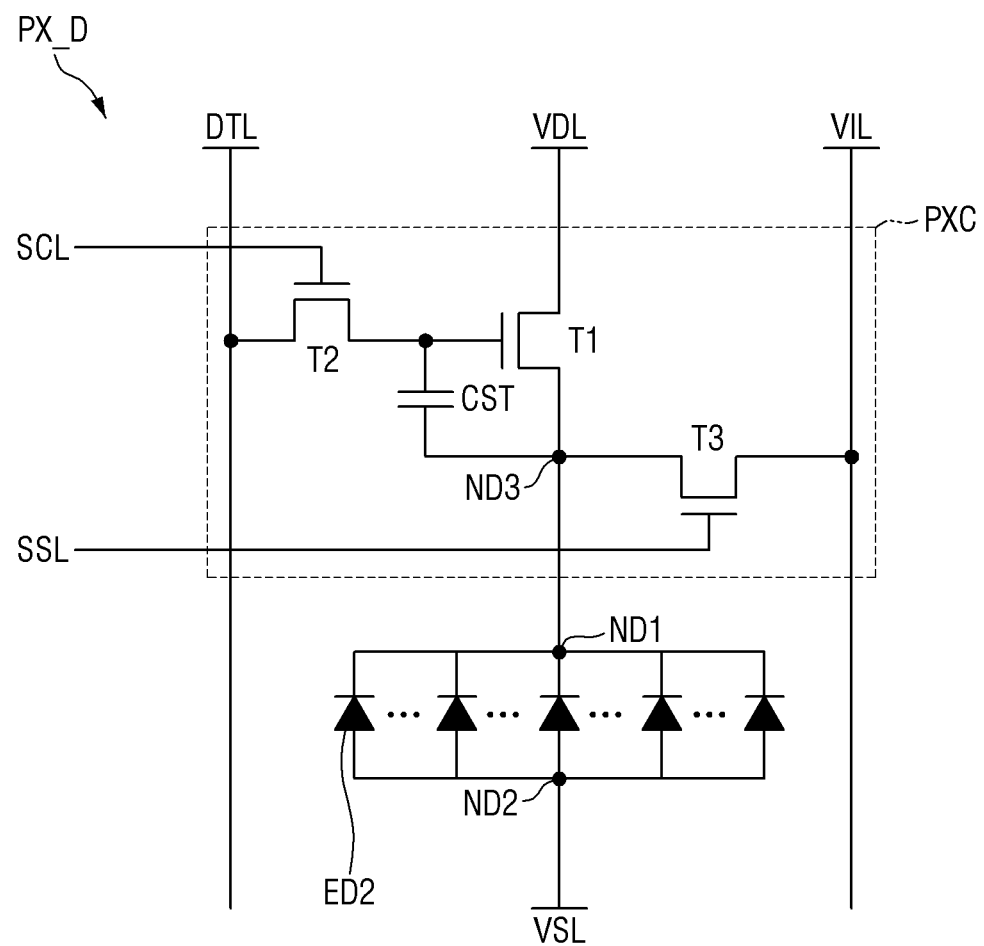
FIG. 12 is an equivalent circuit diagram of a defective pixel in which the alignment of a plurality of light emitting elements included in a display device according to an embodiment is defective.
Figure 13:
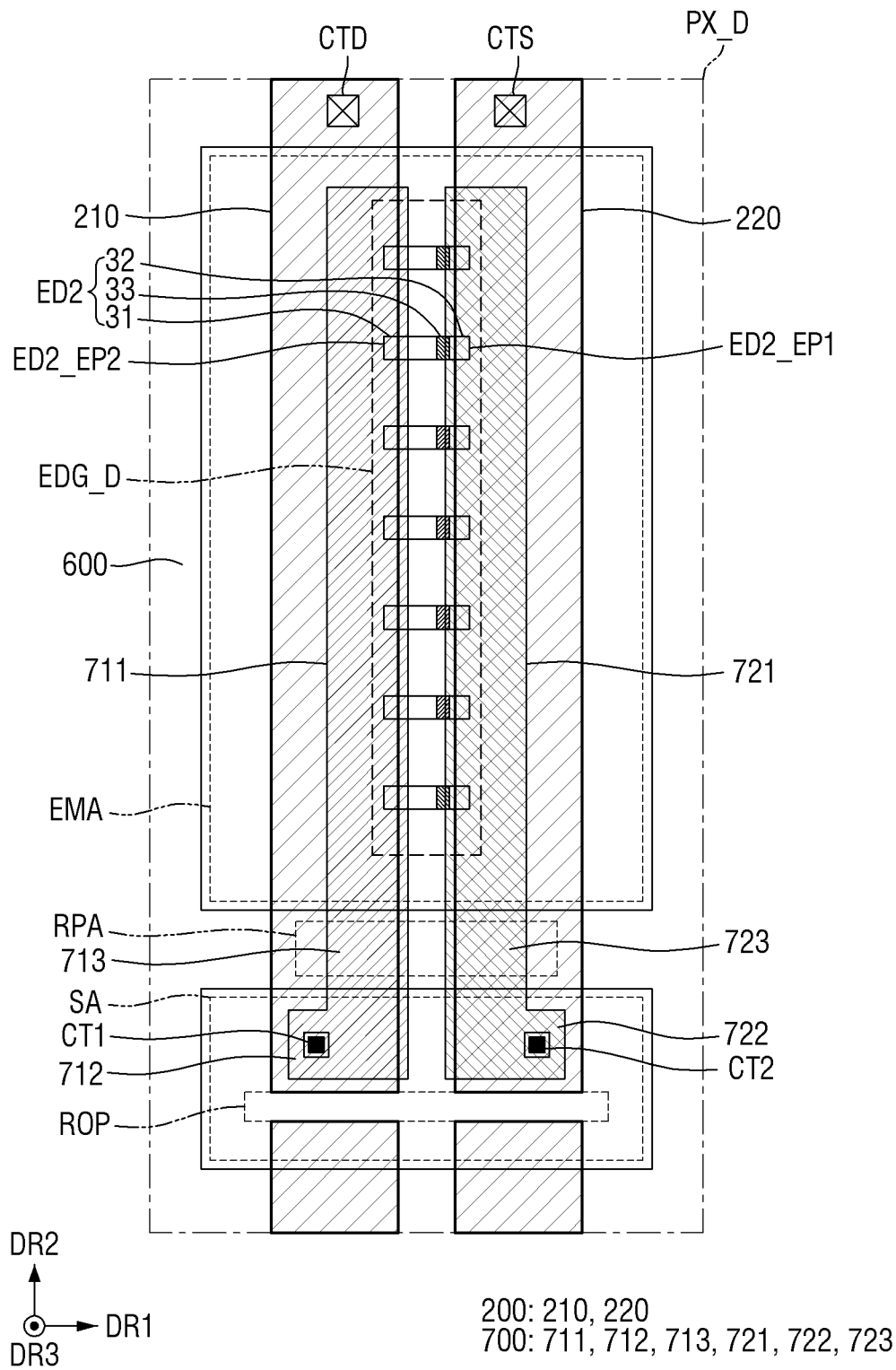
FIG. 13 is a schematic plan layout view of a defective pixel according to an embodiment.

FIG. 12 is an equivalent circuit diagram of a defective pixel in which the alignment of light emitting elements included in a display device according to an embodiment is defective. FIG. 13 is a schematic plan layout view of a defective pixel according to an embodiment.

Referring to FIG. 12, light emitting elements ED of a defective pixel PX_D are electrically connected between the pixel driving circuit PXC and the second voltage line VSL.

The light emitting elements ED included in the defective pixel PX_D may include the second light emitting elements ED2 electrically connected to each other in parallel in the same direction between the first node ND1 and the second node ND2. The light emitting elements ED included in the defective pixel PX_D may have the first ends aligned on the second node ND2 and the second ends aligned on the first node ND1. In the equivalent circuit diagram of the defective pixel PX_D, the first node ND1 may be electrically connected to the third node ND3 of the pixel driving circuit PXC, and the second node ND2 may be electrically connected to the second voltage line VSL.

In the second light emitting elements ED2 included in the defective pixel PX_D, the second ends may be commonly electrically connected to the first node ND1 and commonly electrically connected to the pixel driving circuit PXC through the first node ND1, and the first ends may be commonly electrically connected to the second node ND2 and electrically connected to the second voltage line VSL through the second node ND2.

Therefore, the second light emitting elements ED2 included in the defective pixel PX_D may be electrically connected in parallel to each other in the reverse direction between the pixel driving circuit PXC and the second voltage line VSL.

The second ends of the second light emitting elements ED2 included in the defective pixel PX_D may be electrically connected to the first voltage line VDL through the pixel driving circuit PXC, and the first ends of the second light emitting elements ED2 included in the defective pixel PX_D may be electrically connected to the second voltage line VSL. Therefore, there may be substantially no current flowing through the second light emitting elements ED2 aligned in the reverse direction between the first voltage line VDL and the second voltage line VSL even if the electrical signal is applied to each of the first voltage line VDL and the second voltage line VSL. In this case, the second light emitting elements ED2 may not emit light. Therefore, in case that the defective pixel PX_D includes only the second light emitting elements ED2 aligned in the reverse direction, no current flows through the defective pixel PX_D and, thus, the defective pixel PX_D may be displayed as a dark spot.

Referring to FIG. 13, the defective pixel PX_D may include a defective light emitting element group EDG_D including the second light emitting elements ED2. The defective light emitting element group EDG_D may be disposed in the emission area EMA. As described above, the defective light emitting element group EDG_D may include the light emitting elements ED2 having the first ends ED2_EP1 disposed on the second electrode 220 and the second ends ED2_EP2 disposed on the first electrode 210 between the first electrode 210 and the second electrode 220. The defective light emitting element group EDG_D may not include the first light emitting element ED_1. Therefore, the first semiconductor layers 31 of the second light emitting elements ED2 may be disposed on the first electrode 210, and the second semiconductor layers 32 of the second light emitting elements ED2 may be disposed on the second electrode 220.

The first contact electrode 711 may contact the second ends ED2_EP2 of the second light emitting elements ED2. The first contact electrode 711 may be integral with the first electrode contact portion 712 and the first connection pattern 713 to form a pattern. Therefore, the first contact electrode 711 may be electrically connected to the first electrode 210. Therefore, the second ends ED2_EP2 of the second light emitting elements ED2 included in the defective light emitting element group EDG_D may be electrically connected to the first electrode 210.

The second contact electrode 721 may contact the first ends ED2_EP1 of the second light emitting elements ED2. The second contact electrode 721 may be integral with the second electrode contact portion 722 and the second connection pattern 723 to form one pattern. Therefore, the second contact electrode 721 may be electrically connected to the second electrode 220. Therefore, the first ends ED2_EP1 of the second light emitting elements ED2 included in the defective light emitting element group EDG_D may be electrically connected to the second electrode 220.

Figure 14:
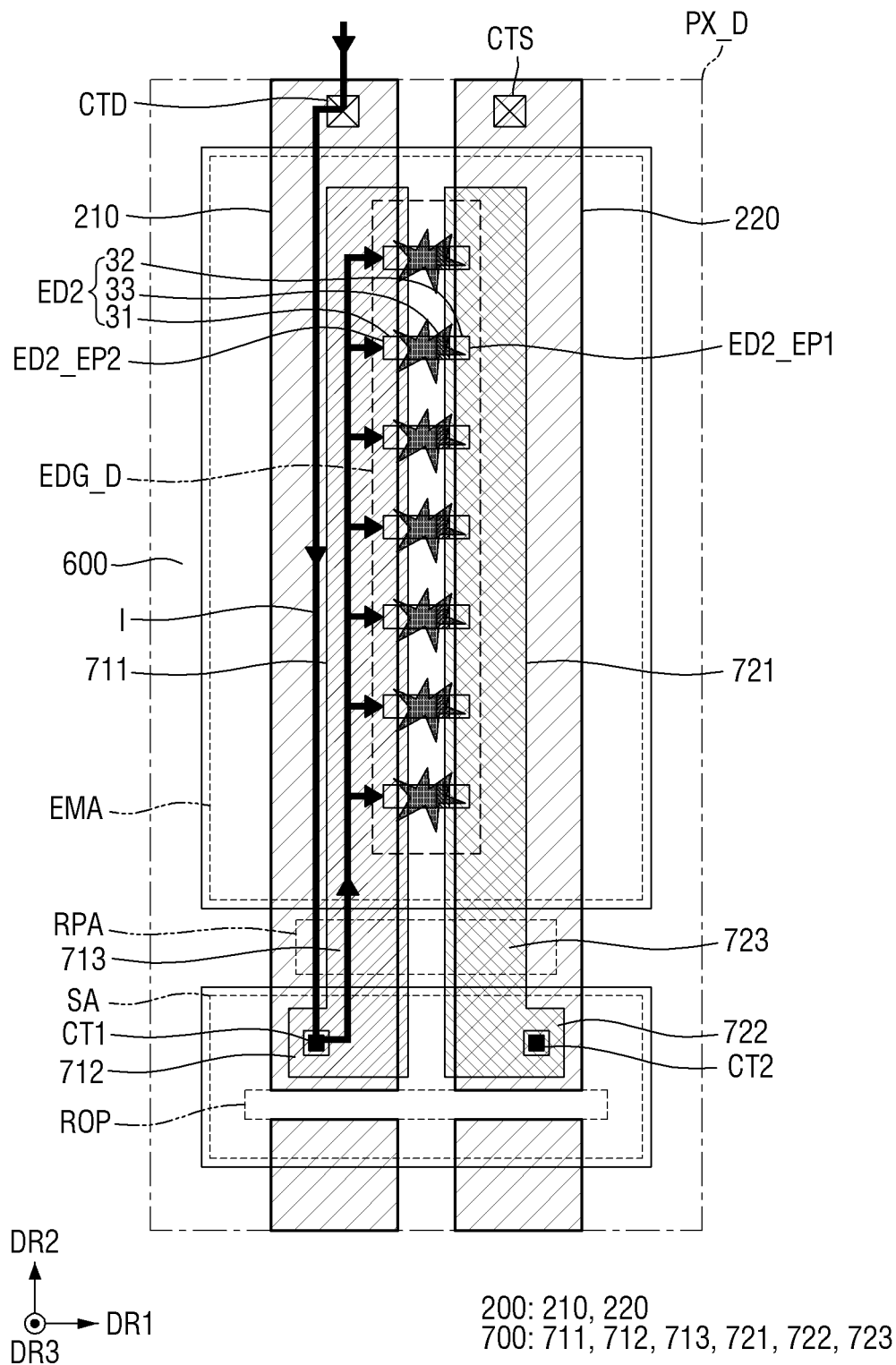
FIGS. 14 to 16 are schematic plan layout views illustrating the repair process of the defective pixel of FIG. 13.
Figure 15:
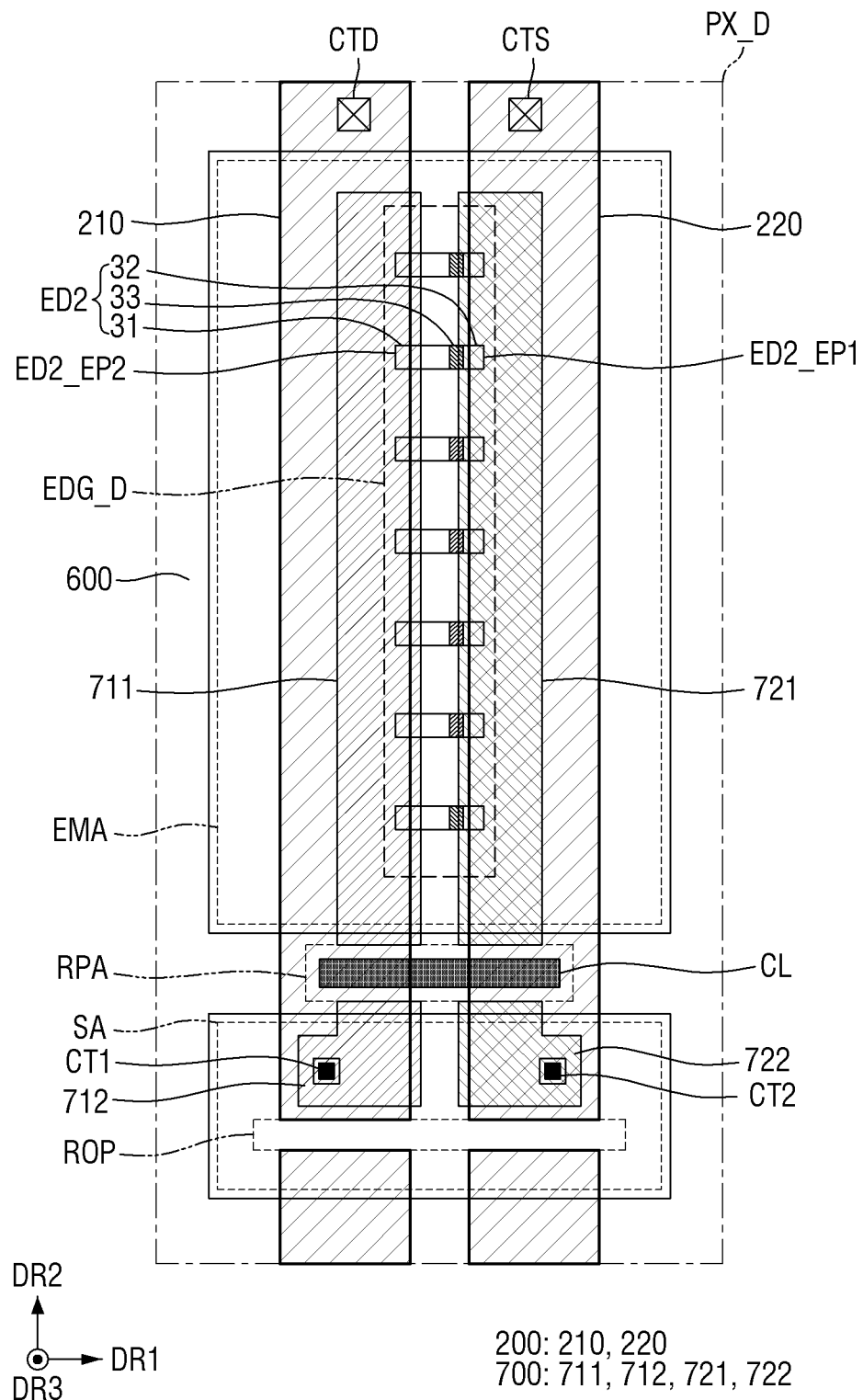
Figure 16:
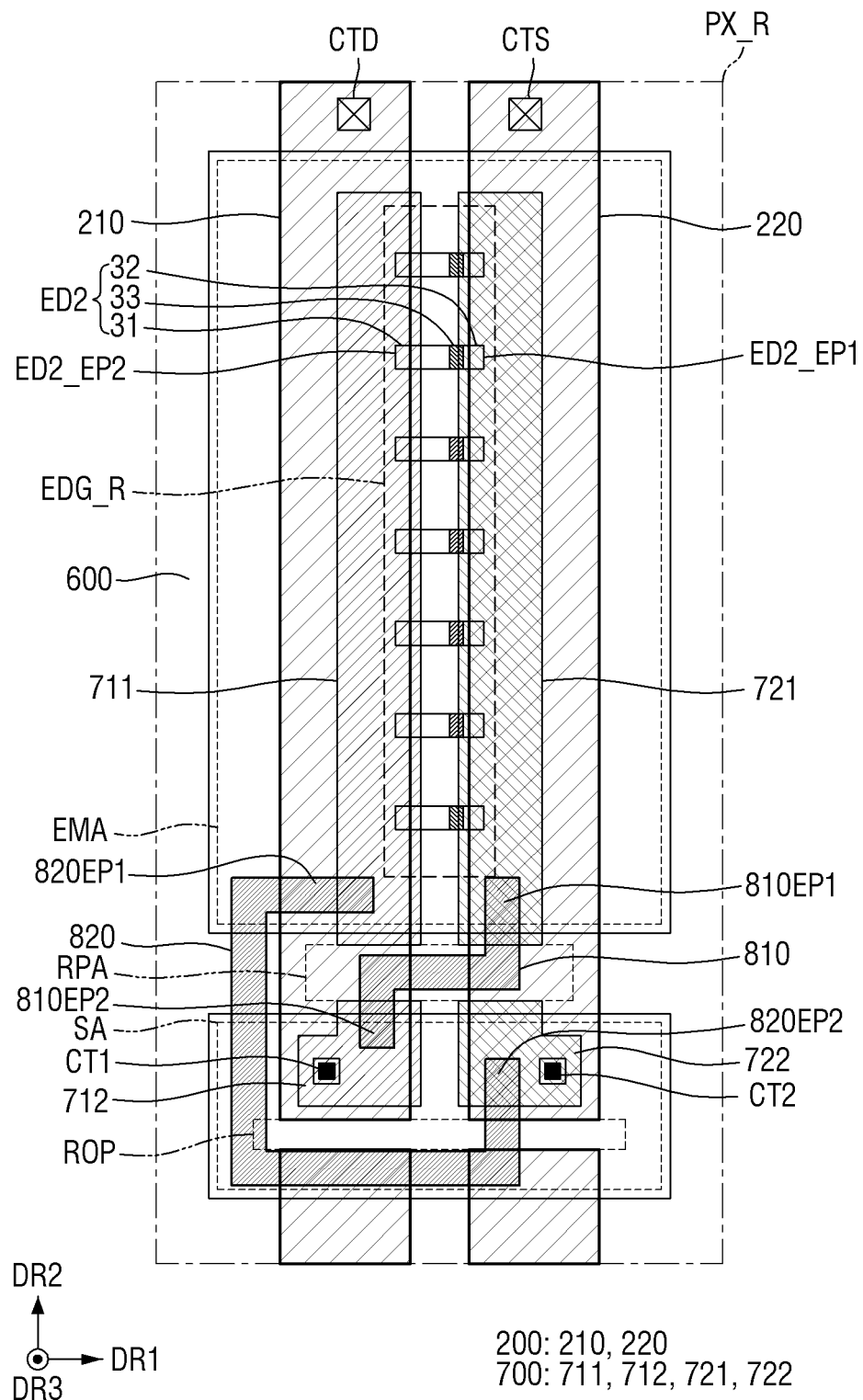

FIGS. 14 to 16 are schematic plan layout views illustrating the repair process of the defective pixel of FIG. 13.

Referring to FIG. 14, the defective pixel PX_D in which the alignment of the light emitting elements ED is defective is searched. The defective pixel PX_D in which the alignment the light emitting elements ED is defective may include a pixel displayed as a dark spot.

In the defective pixel PX_D in which the alignment of the light emitting elements ED is defective, the light emitting element group EDG disposed between the first electrode 210 and the second electrode 220 may include the second light emitting elements ED2 having the first ends ED2_EP1 disposed on the first electrode 210 and the second ends ED2_EP2 disposed on the second electrode 220.

In the second light emitting elements ED2 included in the defective light emitting element group EDG_D of the defective pixel PX_D, the second ends ED2_EP2 may be electrically connected to the first electrode 210 through the first contact electrode 711, the first electrode contact portion 712, and the first connection pattern 713 that are formed as a pattern, and the first ends ED2_EP1 may be electrically connected to the second electrode 220 through the second contact electrode 721, the second electrode contact portion 722, and the second connection pattern 723. In this case, even in case that the electrical signal is applied to each of the first electrode 210 electrically connected to the circuit element layer CCL through the first contact hole CTD and the second electrode 220 electrically connected to the circuit element layer CCL through the second contact hole CTS, the current I may not flow through the second light emitting elements ED2 because the second ends ED2_EP2 of the second light emitting elements ED2 are electrically connected to the first electrode 210, and the second ends ED2_EP1 of the second light emitting elements ED2 are electrically connected to the second electrode 220. For example, in case that the first semiconductor layer 31 of the light emitting element ED is electrically connected to the first electrode 210, and the second semiconductor layer 32 of the light emitting element ED is electrically connected to the second electrode 220, the current I may not flow through the light emitting element ED. Therefore, the second light emitting elements ED2 of the defective pixel PX_D may not emit light, and the defective pixel PX_D may be recognized as a dark spot.

Next, referring to FIG. 15, the first connection pattern 713 and the second connection pattern 723 arranged in the repair area RPA are removed. A cutting line CL is formed in the repair area RPA to remove the first connection pattern 713 electrically connecting the first contact electrode 711 and the first electrode contact portion 712, and to remove the second connection pattern 723 electrically connecting the second contact electrode 721 and the second electrode contact portion 722. By forming the cutting line CL in the repair area RPA, the first contact electrode 711 and the first electrode contact portion 712 may be separated from each other with the repair area RPA interposed therebetween, and the second contact electrode 721 and the second electrode contact portion 722 may be separated from each other with the repair area RPA interposed therebetween. The process of removing the first connection pattern 713 and the second connection pattern 723 arranged in the repair area RPA may be performed by a process such as laser cutting or the like.

Next, referring to FIG. 16, the first repair pattern 810 electrically connecting the second contact electrode 721 and the first electrode contact portion 712, and the second repair pattern 820 electrically connecting the first contact electrode 711 and the second electrode contact portion 722 are formed. The first repair pattern 810 and the second repair pattern 820 may be patterned such that both ends 810EP1 and 810EP2 of the first repair pattern 810 contact the second contact electrode 721 and the first electrode contact portion 712, respectively, and both ends 820EP1 and 820EP2 of the second repair pattern 820 contact the first contact electrode 711 and the second electrode contact portion 722, respectively.

The first electrode 210 may be electrically connected to the second contact electrode 721 through the first repair pattern 810, and the second electrode 220 may be electrically connected to the first contact electrode 711 through the second repair pattern 820.

Figure 17:
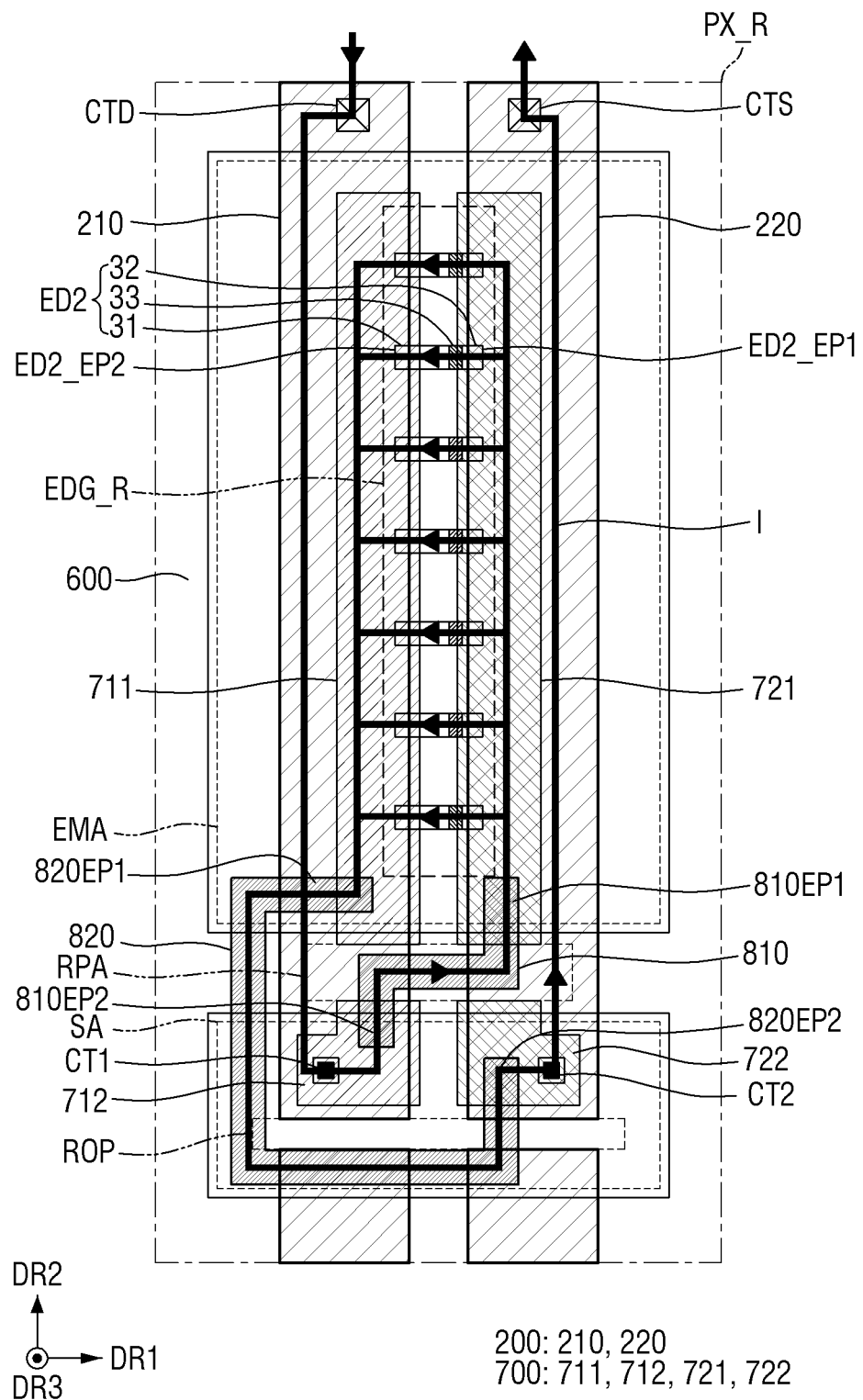
FIG. 17 is a schematic plan layout view illustrating the current flow in the repair pixels of FIG. 16.

FIG. 17 is a schematic plan layout view illustrating the current flow in the repair pixels of FIG. 16.

Referring to FIG. 17, the current I may flow between the first electrode 210 electrically connected to the circuit element layer CCL through the first contact hole CTD and the second electrode 220 electrically connected to the circuit element layer CCL through the second contact hole CTS. The current I may flow from the first electrode 210 to the second electrode 220.

The current I flowing through the repair pixel PX_R in response to the electrical signal applied to each of the first electrode 210 and the second electrode 220 may flow from the first electrode 210 along the first electrode contact portion 712, the first repair pattern 810, and the second contact electrode 721 through the third contact hole CT1. Since the first ends ED2_EP1 of the second light emitting elements ED2 contact the second contact electrode 721, the current I may flow from the first ends ED2_EP1 to the second ends ED2_EP2 of the second light emitting elements ED2. Since the second ends ED2_EP2 of the second light emitting elements ED2 contact the first contact electrode 711, the current I may flow along the first contact electrode 711, the second repair pattern 820, and the second electrode contact portion 722, and may flow to the second electrode 220 through the fourth contact hole CT2.

Therefore, by repairing the above-described defective pixel PX_D and changing the direction of the current, the second light emitting elements ED2 included in the repair light emitting element group EDG_R may emit light. Therefore, the display quality of the display device 10 may be improved by repairing the defective pixel PX_D where a dark spot occurs.

Hereinafter, other embodiments will be described. In the following embodiments, a repetitive description of the same components as those of the above-described embodiment will be omitted or simplified, and differences will be mainly described.

Figure 18:
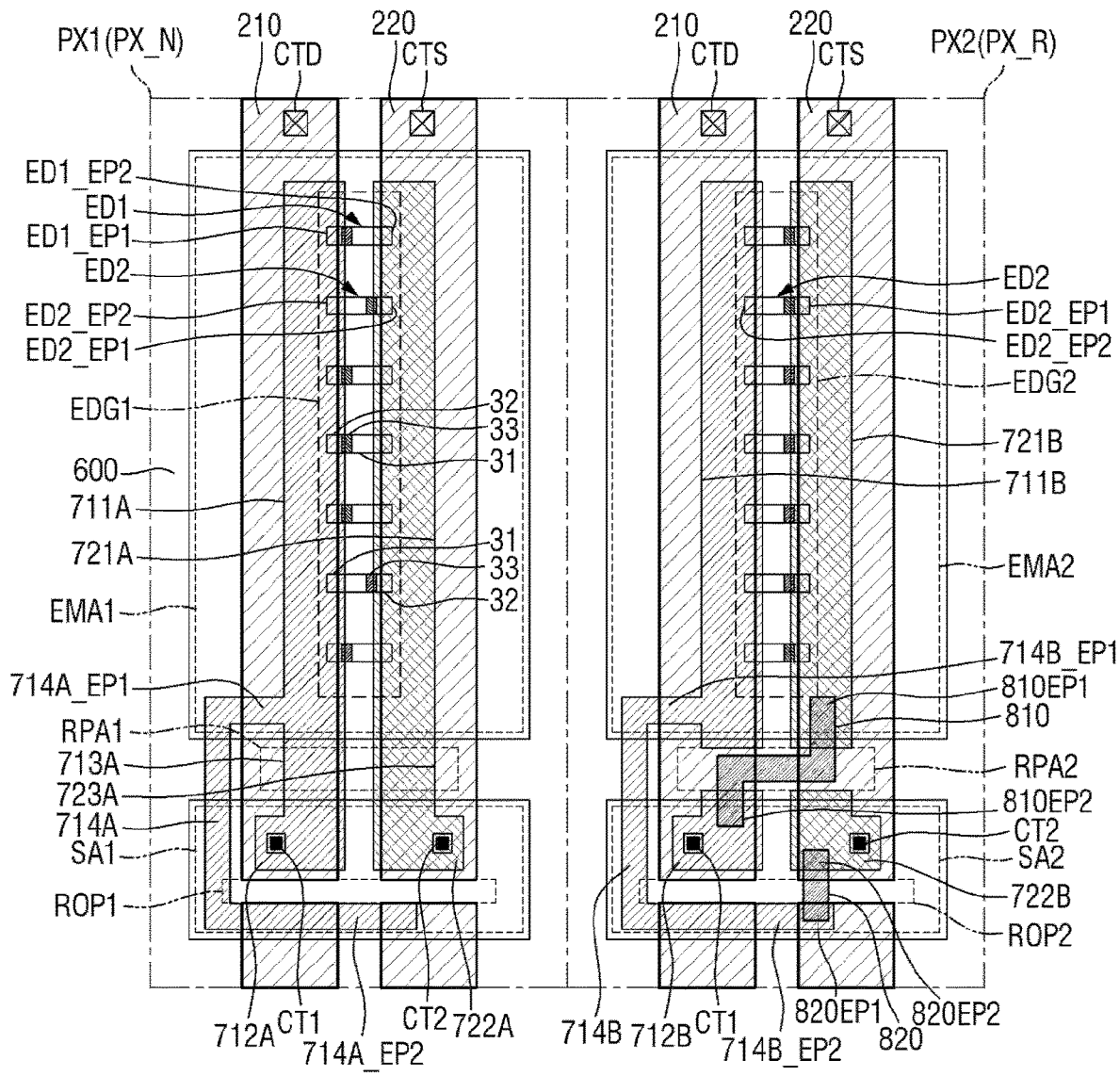
FIG. 18 is a schematic plan layout view illustrating a first pixel and a second pixel of a display device according to another embodiment.

FIG. 18 is a schematic plan layout view illustrating a first pixel and a second pixel of a display device according to an embodiment.

Referring to FIG. 18, each pixel PX of the display device 10 is different from the embodiment of FIG. 4 in that it further includes repair auxiliary patterns 714A and 714B formed as a fourth conductive layer 700_1.

A fourth conductive layer 700_1 may further include the repair auxiliary patterns 714A and 714B branched from the first contact electrode 711. The repair auxiliary patterns 714A and 714B may be branched from the first contact electrodes 711A and 711B. First ends 714A_EP1 and 714B_EP1 of the repair auxiliary patterns 714A and 714B may be electrically connected to the first contact electrodes 711A and 711B in the emission area EMA, and second ends 714A_EP2 and 714B_EP2 of the repair auxiliary patterns 714A and 714B may be spaced apart from the second electrode contact portions 722A and 722B in an area adjacent to the second electrode contact portions 722A and 722B in the sub-region SA. The repair auxiliary patterns 714A and 714B may be simultaneously formed together with the first contact electrode 711, the second contact electrode 721, and the like in the patterning process of forming the fourth conductive layer 700_1.

The repair auxiliary pattern 714A and the second electrode contact portion 722A included in the normal pixel PX_N may be spaced apart from each other. The second end 714A_EP2 of the repair auxiliary pattern 714A included in the normal pixel PX_N may not be physically and/or electrically connected to the second electrode contact portion 722A.

The first repair pattern 810 included in the repair pixel PX_R may electrically connect the first electrode contact portion 712B and the second contact electrode 721B. Further, the second repair pattern 820 included in the repair pixel PX_R may be disposed between the second electrode contact portion 722B and the repair auxiliary pattern 714B to electrically connect them. The first end 820EP1 of the second repair pattern 820 may contact the second end 714B_EP2 of the repair auxiliary pattern 714B, and the second end 820EP2 of the second repair pattern 820 may contact the second electrode contact portion 722B.

In the embodiment, the repair auxiliary patterns 714A and 714B that are branched from the first contact electrodes 711A and 711B and formed in the area adjacent to the second electrode contact portions 722A and 722B may be formed together in the patterning process of forming the fourth conductive layer 700_1. Therefore, since the repair auxiliary patterns 714A and 714B are further included, it is possible to reduce the gap between the patterns electrically connecting the first contact electrodes 711A and 711B and the second electrode contact portions 722A and 722B, respectively, in the repair pattern forming process during the repair process. For example, the gap between the patterns electrically connecting the first contact electrodes 711A and 711B and the second electrode contact portions 722A and 722B, respectively, may be reduced from the gap between the first contact electrodes 711A and 711B and the second electrode contact portions 722A and 722B to the gap between the repair auxiliary patterns 714A and 714B and the second electrode contact portions 722A and 722B. Therefore, since the patterning process of the second repair pattern 820 becomes easy, the efficiency of the repair step may be improved.

Figure 19:
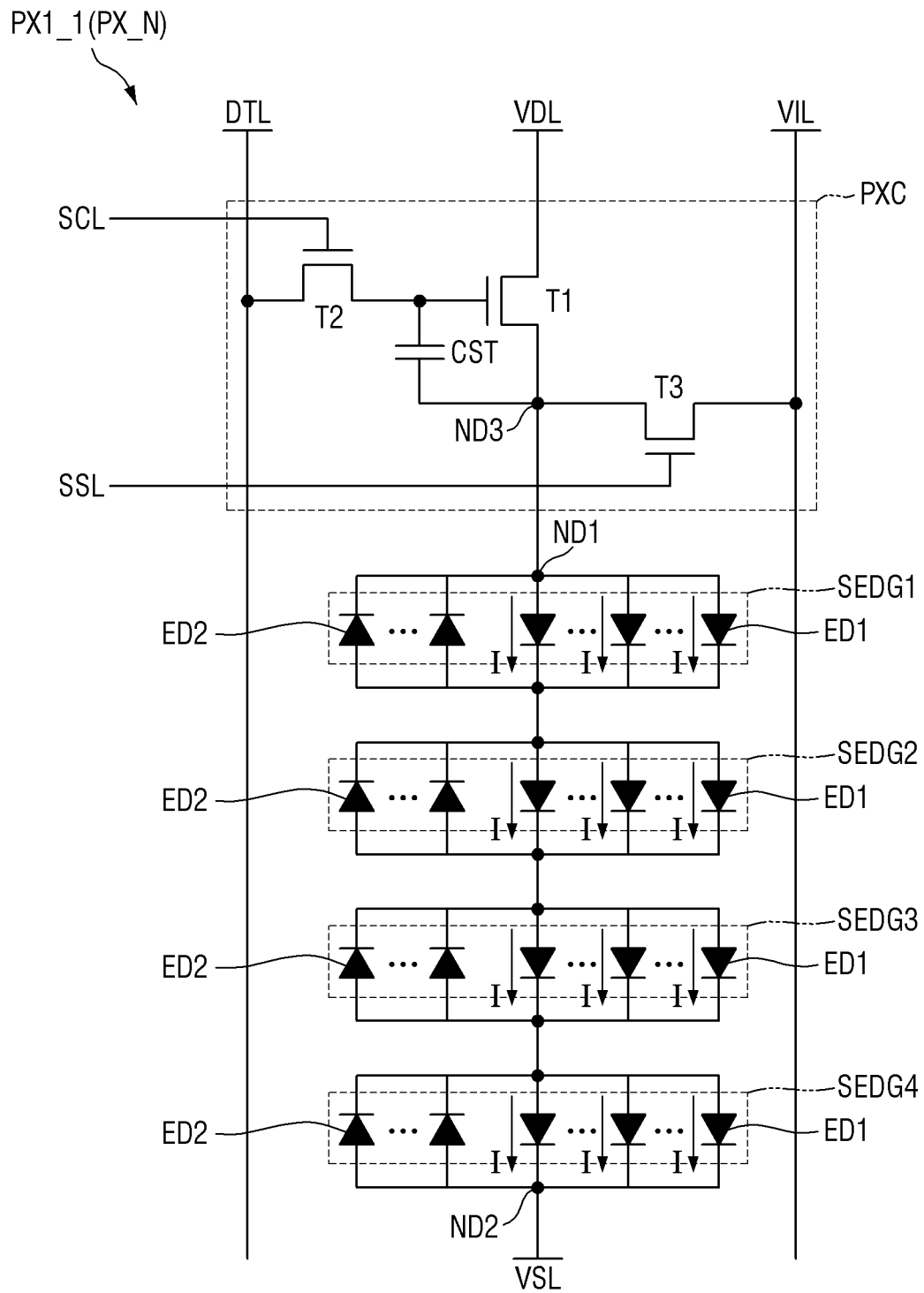
FIG. 19 is an equivalent circuit diagram of a first pixel of a display device according to another embodiment.

FIG. 19 is an equivalent circuit diagram of a first pixel of a display device according to an embodiment.

A first pixel PX1_1 of the display device 10 may include a first light emitting element group EDG1_1 including the light emitting elements ED and the pixel driving circuit PXC. The pixel driving circuit PXC may include the transistors T1, T2, and T3 and the storage capacitor CST. The transistors T1, T2, and T3 may include a first transistor T1, a second transistor T2, and a third transistor T3.

The first light emitting element group EDG1_1 may be disposed between the first node ND1 and the second node ND2. In the equivalent circuit diagram of the first pixel PX1_1, the first node ND1 may be electrically connected to the third node ND3 of the pixel driving circuit PXC, and the second node ND2 may be electrically connected to the second voltage line VSL. The first node ND1 may be understood as the first contact electrode 711A (see FIG. 21) to be described below with reference to FIG. 21, and the second node ND2 may be understood as the second contact electrode 721A (see FIG. 21).

The first light emitting element group EDG1_1 may include sub-light emitting element groups SEDG1, SEDG2, SEDG3, and SEDG4 arranged between the first node ND1 and the second node ND2 and be electrically connected in series to each other. In an embodiment, the first light emitting element group EDG1_1 may include the four sub-light emitting element groups SEDG1, SEDG2, SEDG3, and SEDG4 electrically connected in series to each other, e.g., a first sub-light emitting element group SEDG1, a second sub-light emitting element group SEDG2, a third sub-light emitting element group SEDG3, and a fourth sub-light emitting element group SEDG4. although an embodiment in which the sub-light emitting element groups are connected in series in four stages is illustrated in the drawing, the disclosure is not limited thereto. The sub-light emitting element groups may be electrically connected to each other in series in two stages, in three stages, or in five or more stages.

Each of the first to fourth sub-light emitting element groups SEDG1, SEDG2, SEDG3, and SEDG4 may include the first light emitting elements ED1 electrically connected in parallel to each other in the same direction. As described above, the first light emitting elements ED1 may be the light emitting elements ED having the first ends electrically connected to the first node ND1 and the second ends electrically connected to the second node ND2 between the first node ND1 and the second node ND2. Each of the first to fourth sub-light emitting element groups SEDG1, SEDG2, SEDG3, and SEDG4 may further include the second light emitting elements ED2 aligned in a direction opposite to the direction in which the first light emitting elements ED1 are aligned. The first light emitting elements ED1 and the second light emitting elements ED2 may be electrically connected to each other in parallel. However, the disclosure is not limited thereto, and at least one of the first to fourth sub-light emitting element groups SEDG1, SEDG2, SEDG3, and SEDG4 may not include the second light emitting element ED2.

A first end of the first sub-light emitting element group SEDG1 may be electrically connected to the first node ND1, a second end of the first sub-light emitting element group SEDG1 may be electrically connected to a first end of the second sub-light emitting element group SEDG2, and a second end of the second sub-light emitting element group SEDG2 may be electrically connected to a first end of the third sub-light emitting element group SEDG3. A first end of the fourth sub-light emitting element group SEDG4 may be electrically connected to a second end of the third sub-light emitting element group SEDG3, and a second end of the fourth sub-light emitting element group SEDG4 may be electrically connected to the second node ND2.

The first light emitting elements ED1 included in each of the first to fourth sub-light emitting element groups SEDG1, SEDG2, SEDG3, and SEDG4 of the first light emitting element group EDG1_1 may be electrically connected in parallel or in series to each other in the forward direction between the pixel driving circuit PXC and the second voltage line VSL. The first light emitting elements ED1 included in the same sub-light emitting element group (SEDG1, SEDG2, SEDG3, and SEDG4) may be electrically connected in parallel to each other, and the first light emitting elements ED1 included in different sub-light emitting element groups (SEDG1, SEDG2, SEDG3, and SEDG4) may be electrically connected in series to each other.

The second light emitting elements ED2 included in each of the first to fourth sub-light emitting element groups SEDG1, SEDG2, SEDG3, and SEDG4 of the first light emitting element group EDG1_1 may be electrically connected in parallel or in series to each other in the reverse direction between the pixel driving circuit PXC and the second voltage line VSL.

The first ends of the first light emitting elements ED1 included in the first sub-light emitting element group SEDG1 of the first light emitting element group EDG1_1 may be electrically connected to the first node ND1 and be electrically connected to the first voltage line VDL through the pixel driving circuit PXC, and the second ends of the first light emitting elements ED1 included in the fourth sub-light emitting element group SEDG4 of the first light emitting element group EDG1_1 may be electrically connected to the second node ND2 and be electrically connected to the second voltage line VSL. Therefore, the first light emitting elements ED1 included in each of the sub-light emitting element groups (SEDG1, SEDG2, SEDG3, and SEDG4) of the first light emitting element group EDG1_1 are aligned in the forward direction between the first voltage line VDL and the second voltage line VSL, so that the current I may flow through the first light emitting elements ED1 electrically connected in series to each other. The current I may flow from the first node ND1 to the second node ND2 through the first light emitting elements ED1 arranged between the first node ND1 and the second node ND2. The second light emitting elements ED2 included in each of the sub-light emitting element groups (SEDG1, SEDG2, SEDG3, and SEDG4) included in the first light emitting element group EDG1_1 are aligned in the reverse direction between the first voltage line VDL and the second voltage line VSL, so that there may be substantially no current flowing therethrough even if the electrical signal is applied to each of the first voltage line VDL and the second voltage line VSL.

Although at least one of the first to fourth sub-light emitting element groups SEDG1, SEDG2, SEDG3, and SEDG4 of the first light emitting element group EDG1_1 includes the second light emitting elements ED2 aligned in the reverse direction, since each of the first to fourth sub-light emitting element groups SEDG1, SEDG2, SEDG3, and SEDG4 includes at least one first light emitting element ED1, the current may flow through the first light emitting elements ED1, and the first light emitting elements ED1 may emit light.

Figure 20:
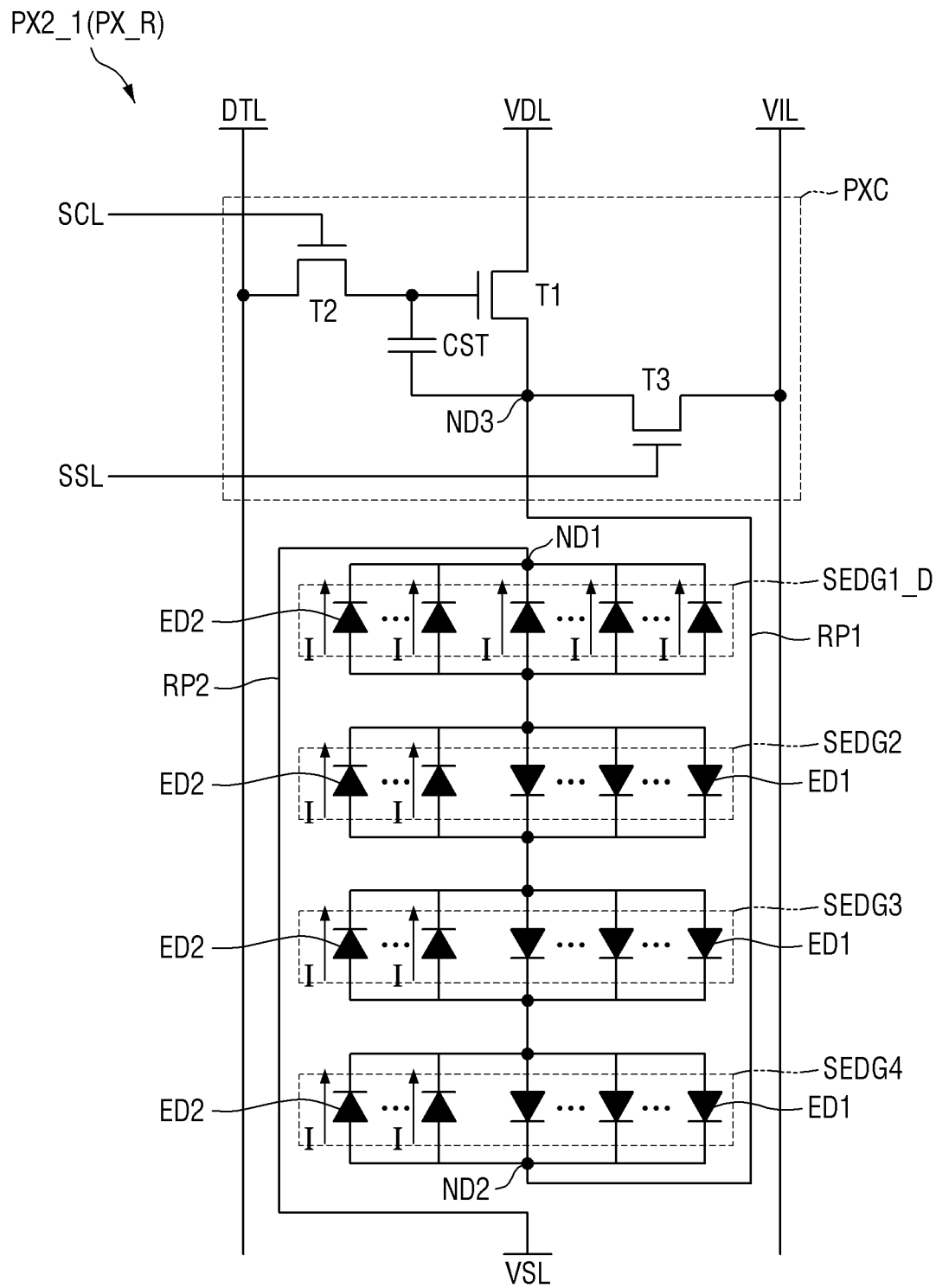
FIG. 20 is an equivalent circuit diagram of a second pixel of a display device according to another embodiment.

FIG. 20 is a schematic diagram of an equivalent circuit of a second pixel of a display device according to an embodiment.

A second pixel PX2_1 of the display device 10 may include a second light emitting element group EDG2_1 including the light emitting elements ED and the pixel driving circuit PXC. The pixel driving circuit PXC may include the transistors T1, T2, and T3 and the storage capacitor CST. The transistors T1, T2, and T3 may include a first transistor T1, a second transistor T2, and a third transistor T3.

The second light emitting element group EDG2 may be disposed between the first node ND1 and the second node ND2. In the equivalent circuit diagram of the second pixel PX2_1, the first node ND1 may be electrically connected to the second voltage line VSL, and the second node ND2 may be electrically connected to the third node ND3 of the pixel driving circuit PXC. The first node ND1 may be electrically connected to the second voltage line VSL through the second repair line RP2, and the second node ND2 may be electrically connected to the third node ND3 of the pixel driving circuit PXC through the first repair line RP1. The first node ND1 may be understood as the first contact electrode 711B (see FIG. 21) of the second pixel PX2_1 to be described below with reference to FIG. 21, and the second node ND2 may be understood as the second contact electrode 721B (see FIG. 21) of the second pixel PX2_1.

The second light emitting element group EDG2_1 may include sub-light emitting element groups SEDG1_D, SEDG2, SEDG3, and SEDG4 arranged between the first node ND1 and the second node ND2 and electrically connected in series to each other. In an embodiment, the second light emitting element group EDG2_1 may include the four sub-light emitting element groups SEDG1_D, SEDG2, SEDG3, and SEDG4 electrically connected in series to each other, e.g., a first sub-light emitting element group SEDG1_D, a second sub-light emitting element group SEDG2, a third sub-light emitting element group SEDG3, and a fourth sub-light emitting element group SEDG4.

In an embodiment, at least one of the sub-light emitting element groups SEDG1_D, SEDG2, SEDG3, and SEDG4 of the second light emitting element group EDG2_1 may include the second light emitting elements ED2 and may not include the first light emitting element ED1.

In an embodiment, the first sub-light emitting element group SEDG1_D included in the second light emitting element group EDG2_1 may be a defective sub-light emitting element group SEDG1_D including only the second light emitting elements ED2. For example, in the light emitting elements ED included in the first sub-light emitting element group SEDG1_D included in the second light emitting element group EDG2_1, the first ends may be aligned on the second node ND2 and the second ends may be aligned on the first node ND1 between the first node ND1 and the second node ND2.

Each of the second to fourth sub-light emitting element groups SEDG2, SEDG3, and SEDG4 included in the second light emitting element group EDG2_1 may include the first light emitting elements ED1 electrically connected in parallel to each other in the same direction. As described above, the first light emitting elements ED1 may be the light emitting elements ED having the first ends aligned on the first node ND1 and the second ends aligned on the second node ND2 between the first node ND1 and the second node ND2. Each of the second to fourth sub-light emitting element groups SEDG2, SEDG3, and SEDG4 may further include the second light emitting elements ED2 aligned in the direction opposite to the direction in which the first light emitting elements ED1 are aligned. The first light emitting elements ED1 and the second light emitting elements ED2 may be electrically connected in parallel.

A first end of the first sub-light emitting element group SEDG1_D may be electrically connected to the first node ND1, and a second end of the fourth sub-light emitting element group SEDG4 may be electrically connected to the second node ND2. Therefore, the second ends of the second light emitting elements ED2 included in the first sub-light emitting element group SEDG1_D and aligned on the first node ND1 may be electrically connected to the second voltage line VSL through the second repair line RP2. Further, the first ends of the second light emitting elements ED2 included in the fourth sub-light emitting element group SEDG4 and aligned on the second node ND2 may be electrically connected to the first voltage line VDL through the first repair line RP1 and the pixel driving circuit PXC.

Therefore, the second light emitting elements ED2 included in each of the first to fourth sub-light emitting element groups SEDG1_D, SEDG2, SEDG3, and SEDG4 of the second light emitting element group EDG2_1 may be electrically connected to each other in parallel or in series in the forward direction between the first voltage line VDL and the second voltage line VSL. The second light emitting elements ED2 included in the same sub-light emitting element group (SEDG1_D, SEDG2, SEDG3, and SEDG4) may be electrically connected in parallel to each other, and the second light emitting elements ED2 included in different sub-light emitting element groups (SEDG1_D, SEDG2, SEDG3, and SEDG4) may be electrically connected in series to each other.

The first light emitting elements ED1 included in each of the second to fourth sub-light emitting element groups SEDG2, SEDG3, and SEDG4 of the second light emitting element group EDG2_1 may be electrically connected to each other in parallel or in series to each other in the reverse directions between the pixel driving circuit PXC and the second voltage line VSL.

The first ends of the first light emitting elements ED1 included in the first sub-light emitting element group SEDG1_D may be electrically connected to the first node ND1 and be electrically connected to the first voltage line VLD through the pixel driving circuit PXC, and the second ends of the first light emitting elements ED1 included in the fourth sub-light emitting element group SEDG4 may be electrically connected to the second node ND2 and be electrically connected to the second voltage line VSL. Therefore, the current I may flow through the first light emitting elements ED1 included in each of the sub-light emitting element groups (SEDG1_D, SEDG2, SEDG3, and SEDG4) and aligned in the forward direction between the first voltage line VDL and the second voltage line VSL and electrically connected in series.

The second ends of the second light emitting elements ED2 included in the first sub-light emitting element group SEDG1_D of the second light emitting element group EDG2_1 may be electrically connected to the first node ND1 and be electrically connected to the second voltage line VSL through the second repair line RP2, and the first ends of the second light emitting elements ED2 included in the fourth sub-light emitting element group SEDG4 of the second light emitting element group EDG2_1 may be electrically connected to the second node ND2 and be electrically connected to the first voltage line VDL through the pixel driving circuit PXC. Therefore, the second light emitting elements ED2 included in each of the sub-light emitting element groups (SEDG1_D, SEDG2, SEDG3, and SEDG4) of the second light emitting element group EDG2_1 are aligned in the forward direction between the first voltage line VDL and the second voltage line VSL, so that the current I may flow through the second light emitting elements ED2 electrically connected in series to each other. The current I may flow from the second node ND2 to the first node ND1 through the second light emitting elements ED2 arranged between the first node ND1 and the second node ND2. Since the first light emitting elements ED1 included in each of the second to fourth sub-light emitting element groups SEDG2, SEDG3, and SEDG4 included in the second light emitting element group EDG2_1 are aligned in the reverse direction between the first voltage line VDL and the second voltage line VSL, there may be substantially no current flowing therethrough even if the electrical signal is applied to each of the first voltage line VDL and the second voltage line VSL.

Although at least one of the sub-light emitting element groups (SEDG1_D, SEDG2, SEDG3, and SEDG4) arranged between the first node ND1 and the second node ND2 and electrically connected in series is the defective sub-light emitting element group SEDG1_D including only the second light emitting elements ED2, the corresponding pixel may be repaired by changing the direction of the current I by electrically connecting the first node ND1 to the second voltage line VSL and electrically connecting the second node ND2 to the pixel driving circuit PXC by using the repair lines RP1 and RP2. Therefore, it is possible to change the direction of the current I flowing from the first node ND1 to the second node ND2 such that the current flows from the second node ND2 to the first node ND1. Since the current flows through the second light emitting elements ED2, the corresponding pixel may emit light.

FIG. 20 is a schematic plan layout view illustrating a first pixel and a second pixel of a display device according to an embodiment.

An electrode layer 200_1 may include a first electrode 210, a second electrode 220, and a third electrode 230 spaced apart from each other.

The first electrode 210 may further include a first electrode branch portion 211 that is branched from the first electrode 210 and connected to the circuit element layer, and overlaps the first contact hole CTD. The first electrode branch portion 211 may overlap the first bank 600. The first electrode 210 may be electrically connected to the circuit element layer through the first electrode branch portion 211 overlapping the first contact hole CTD, the second electrode 220 may be electrically connected to the circuit element layer through the second contact hole CTS, and the third electrode 230 may not be electrically connected to the circuit element layer.

The first electrode 210 and the third electrode 230 may be separated from the first electrode 210 and the third electrode 230 of the pixel PX adjacent in the second direction DR2 at a first sub-separation portion ROP11 and a second sub-separation portion ROP12 (collectively, sub-separation portion ROP1_1), respectively. Substantially identical or similar structures may be applied to the second pixel PX2_1 including a first sub-separation portion ROP21 and ROP22 (collectively, sub-separation portion ROP2_1). The second electrode 220 may not be separated from the second electrode 220 of the pixel PX adjacent in the second direction DR2. However, the disclosure is not limited thereto, and the second electrode 220 may be separated from the second electrode 220 of the pixel PX adjacent in the second direction DR2, similarly to the first electrode 210 and the third electrode 230.

The third electrode 230 may be spaced apart from the first electrode 210. The second electrode 220 may be disposed between the first electrode 210 and the third electrode 230. The second electrode 220 may include a first sub-electrode 221 and a second sub-electrode 222 spaced apart from each other in the emission area EMA. The first sub-electrode 221 may be disposed between the first electrode 210 and the third electrode 230 in the emission area EMA. The second sub-electrode 222 may be disposed between the first sub-electrode 221 and the third electrode 230 in the emission area EMA. The first sub-electrode 221 and the second sub-electrode 222 may be spaced apart from each other in the emission area EMA and may be integral with each other in the non-emission area. Therefore, the same signal may be applied to the first sub-electrode 221 and the second sub-electrode 222 through the second contact hole CTS.

In the embodiment, the pixels PX1_1 and PX2_1 may include the light emitting element groups EDG1_1 and EDG2_1, respectively, each including the light emitting elements ED arranged between the first electrode 210 and the second electrode 220 and/or between the second electrode 220 and the third electrode 230. The first pixel PX1_1 may include the first light emitting element group EDG1_1, and the second pixel PX2_1 may include the second light emitting element group EDG2_1.

Each of the light emitting element groups EDG1_1 and EDG2_1 may include the sub-light emitting element groups SEDG1 or SEDG1_D, SEDG2, SEDG3, and SEDG4.

The first light emitting element group EDG1_1 may include the first to fourth sub-light emitting element groups SEDG1, SEDG2, SEDG3, and SEDG4, and the second light emitting element group EDG2_1 may include the first to fourth sub-light emitting element groups SEDG1_D, SEDG2, SEDG3, and SEDG4.

The first sub-light emitting element groups SEDG1 and SEDG1_D may be arranged between the first electrode 210 and the first sub-electrode 221. The first sub-light emitting element groups SEDG1 and SEDG1_D may be arranged on a lower side between the first electrode 210 and the first sub-electrode 221 in a plan view.

The second sub-light emitting element group SEDG2 may be disposed between the first electrode 210 and the first sub-electrode 221. The second sub-light emitting element group SEDG2 may be disposed on an upper side between the first electrode 210 and the first sub-electrode 221 in a plan view.

The third sub-light emitting element group SEDG3 may be disposed between the third electrode 230 and the second sub-electrode 222. The third sub-light emitting element group SEDG3 may be disposed on an upper side between the third electrode 230 and the second sub-electrode 222 in a plan view.

The fourth sub-light emitting element group SEDG4 may be disposed between the third electrode 230 and the second sub-electrode 222. The fourth sub-light emitting element group SEDG4 may be disposed on a lower side between the third electrode 230 and the second sub-electrode 222 in a plan view.

Hereinafter, in this drawing, first ends of the light emitting elements ED will refer to ends disposed on the first electrode 210 or the third electrode 230, and second ends of the light emitting elements ED will refer to ends disposed on the second electrode 220 (the first sub-electrode 221 or the second sub-electrode 222). Further, the light emitting elements ED that are aligned such that the first ends are disposed on the first electrode 210 or the third electrode 230 and the second ends are disposed on the second electrode 220 (the first sub-electrode 221 or the second sub-electrode 222) are defined as the first light emitting elements ED1, and the light emitting elements ED that are aligned in the direction opposite to the direction in which the first light emitting elements ED1 are aligned are defined as the second light emitting elements ED2.

Each pixel PX of the display device 10 may further include third to fifth contact electrodes 730, 740, and 750. The first to fifth contact electrodes 711, 721, 730, 740, and 750 may be spaced apart from each other.

The first contact electrode 711 may be disposed on the first electrode 210 in the emission area EMA. The first contact electrode 711 may contact first ends of the light emitting elements ED of the first sub-light emitting element groups SEDG1 and SEDG1_D.

The second contact electrode 721 may be disposed on the second sub-electrode 222 of the second electrode 220 in the emission area EMA. The second contact electrode 721 may contact the other ends of the light emitting elements ED of the fourth sub-light emitting element group SEDG4.

The third contact electrode 730 may contact second ends of the light emitting elements ED of the first sub-light emitting element groups SEDG1 and SEDG1_D and first ends of the light emitting elements ED of the second sub-light emitting element group SEDG2.

The third contact electrode 730 may include a first region 731, a second region 732, and a third region 733. The first region 731 of the third contact electrode 730 may be disposed on the first sub-electrode 221 and may contact the second ends of the light emitting elements ED of the first sub-light emitting element groups SEDG1 and SEDG1_D. The second region 732 of the third contact electrode 730 may be disposed on the first electrode 210 and may contact the first ends of the light emitting elements ED of the second sub-light emitting element group SEDG2. The third region 733 of the third contact electrode 730 may electrically connect the first region 731 of the third contact electrode 730 and the second region 732 of the third contact electrode 730.

The fourth contact electrode 740 may contact the second ends of the light emitting elements ED of the second sub-light emitting element group SEDG2 and first ends of the light emitting elements ED of the third sub-light emitting element group SEDG3.

The fourth contact electrode 740 may include a first region 741, a second region 742, and a third region 743. The first region 741 of the fourth contact electrode 740 may be disposed on the first sub-electrode 221 and may contact the second ends of the light emitting elements ED of the second sub-light emitting element group SEDG2. The second region 742 of the fourth contact electrode 740 may be disposed on the third electrode 230 and may contact the first ends of the light emitting elements ED of the third sub-light emitting element group SEDG3. The third region 743 of the fourth contact electrode 740 may electrically connect the first region 741 of the fourth contact electrode 740 and the second region 742 of the fourth contact electrode 740.

The fifth contact electrode 750 may contact second ends of the light emitting elements ED of the third sub-light emitting element group SEDG3 and first ends of the light emitting elements ED of the fourth sub-light emitting element group SEDG4.

The fifth contact electrode 750 may include a first region 751, a second region 752, and a third region 753. The first region 751 of the fifth contact electrode 750 may be disposed on the second sub-electrode 222 and may contact the second ends of the light emitting elements ED of the third sub-light emitting element group SEDG3. The second region 752 of the fifth contact electrode 750 may be disposed on the third electrode 230 and may contact the first ends of the light emitting elements ED of the fourth sub-light emitting element group SEDG4. The third region 753 of the fifth contact electrode 750 may electrically connect the first region 751 of the fifth contact electrode 750 and the second region 752 of the fifth contact electrode 750.

The first electrode contact portion 712 may be disposed in the sub-region SA. The first electrode contact portion 712 may be spaced apart from the first contact electrode 711 and may be electrically connected to the first electrode branch portion 211 of the first electrode 210 through the third contact hole CT1. The second electrode contact portion 722 may be disposed in the sub-region SA. The second electrode contact portion 722 may be spaced apart from the second contact electrode 721 and may be electrically connected to the second electrode 220 through the fourth contact hole CT2.

The first pixel PX1_1 may further include a first connection pattern 713A disposed in the first repair area RPA1 and electrically connecting the first electrode contact portion 712A and the first contact electrode 711A. The first pixel PX1_1 may further include a second connection pattern 723A disposed in the first repair area RPA1 and electrically connecting the second electrode contact portion 722A and the second contact electrode 721A.

Therefore, the first sub-light emitting element group SEDG1 of the first pixel PX1_1 may be electrically connected to the first electrode 210 through the first contact electrode 711A, the first connection pattern 713A, and the first electrode contact portion 712A, and the fourth sub-light emitting element group SEDG4 of the first pixel PX1_1 may be electrically connected to the second electrode 220 through the second contact electrode 721A, the second connection pattern 723A, and the second electrode contact portion 722A. The first to fourth sub-light emitting element groups SEDG1, SEDG2, SEDG3, and SEDG4 may be electrically connected in series to each other between the first electrode 210 and the second electrode 220 through third to fifth contact electrodes 730A, 740A, and 750A. The third to fifth contact electrodes 730A, 740A, and 750A may include first to third sub-contact electrodes 731A to 733A, 741A to 743A, and 751A to 753A, respectively. Substantially identical or similar structures may be applied to the second pixel PX2_1 including first to third sub-contact electrodes 731B to 733B, 741B to 743B, and 751B to 753B. The current flowing through the first pixel PX1_1 may flow along the fourth sub-light emitting element group SEDG4 contacting the second contact electrode 721A electrically connected to the second electrode 220 through the first sub-light emitting element group SEDG1 contacting the first contact electrode 711A electrically connected to the first electrode 210.

In the second pixel PX2_1, the first electrode contact portion 712B and the first contact electrode 711B may be spaced apart from each other with the second repair area RPA2 interposed therebetween. In the second pixel PX2_1, the second electrode contact portion 722B and the second contact electrode 721B may be spaced apart from each other with the second repair area RPA2 interposed therebetween. Therefore, the first electrode contact portion 712B and the first contact electrode 711B may not be electrically connected, and the second electrode contact portion 722B and the second contact electrode 721B may not be electrically connected. Such a shape may be formed by the above-described defective pixel repair process.

The second pixel PX2_1 may further include the first repair pattern 810 disposed between the first electrode contact portion 712B and the second contact electrode 721B and the second repair pattern 820 disposed between the second electrode contact portion 722B and the first contact electrode 711B. The first repair pattern 810 may electrically connect the first electrode contact portion 712B and the second contact electrode 721B, and the second repair pattern 820 may electrically connect the second electrode contact portion 722B and the first contact electrode 711B.

A first end 810EP1 of the first repair pattern 810 may be disposed on the first electrode contact portion 712B and a second end 810EP2 may be disposed on the second contact electrode 721B. Since both ends 810EP1 and 810EP2 of the first repair pattern 810 contact the first electrode contact portion 712B and the second contact electrode 721B, respectively, the first electrode contact portion 712B and the second contact electrode 721B may be electrically connected.

A first end 820EP1 of the second repair pattern 820 may be disposed on the first contact electrode 711B, and a second end 820EP2 may be disposed on the second electrode contact portion 722B. Since both ends 820EP1 and 820EP2 of the second repair pattern 820 contact the second electrode contact portion 722B and the first contact electrode 711B, respectively, the second electrode contact portion 722B and the first contact electrode 711B may be electrically connected.

Therefore, the first sub-light emitting element group SEDG1_D of the second pixel PX2_1 may be electrically connected to the second electrode 220 through the first contact electrode 711B and the second repair pattern 820, and the fourth sub-light emitting element group SEDG4 of the second pixel PX2_1 may be electrically connected to the first electrode 210 through the second contact electrode 721B and the first repair pattern 810. Therefore, the first to fourth sub-light emitting element groups SEDG1_D, SEDG2, SEDG3, and SEDG4 of the second light emitting element group EDG2_1 may be electrically connected in series to each other through the third to fifth contact electrodes 730B, 740B, and 750B between the first electrode 210 and the second electrode 220. The current flowing through the second pixel PX2_1 may flow along the first sub-light emitting element group SEDG1_D contacting the first contact electrode 721B electrically connected to the second electrode 220 through the fourth sub-light emitting element group SEDG4 contacting the second contact electrode 721B electrically connected to the first electrode 210.

Figure 21:
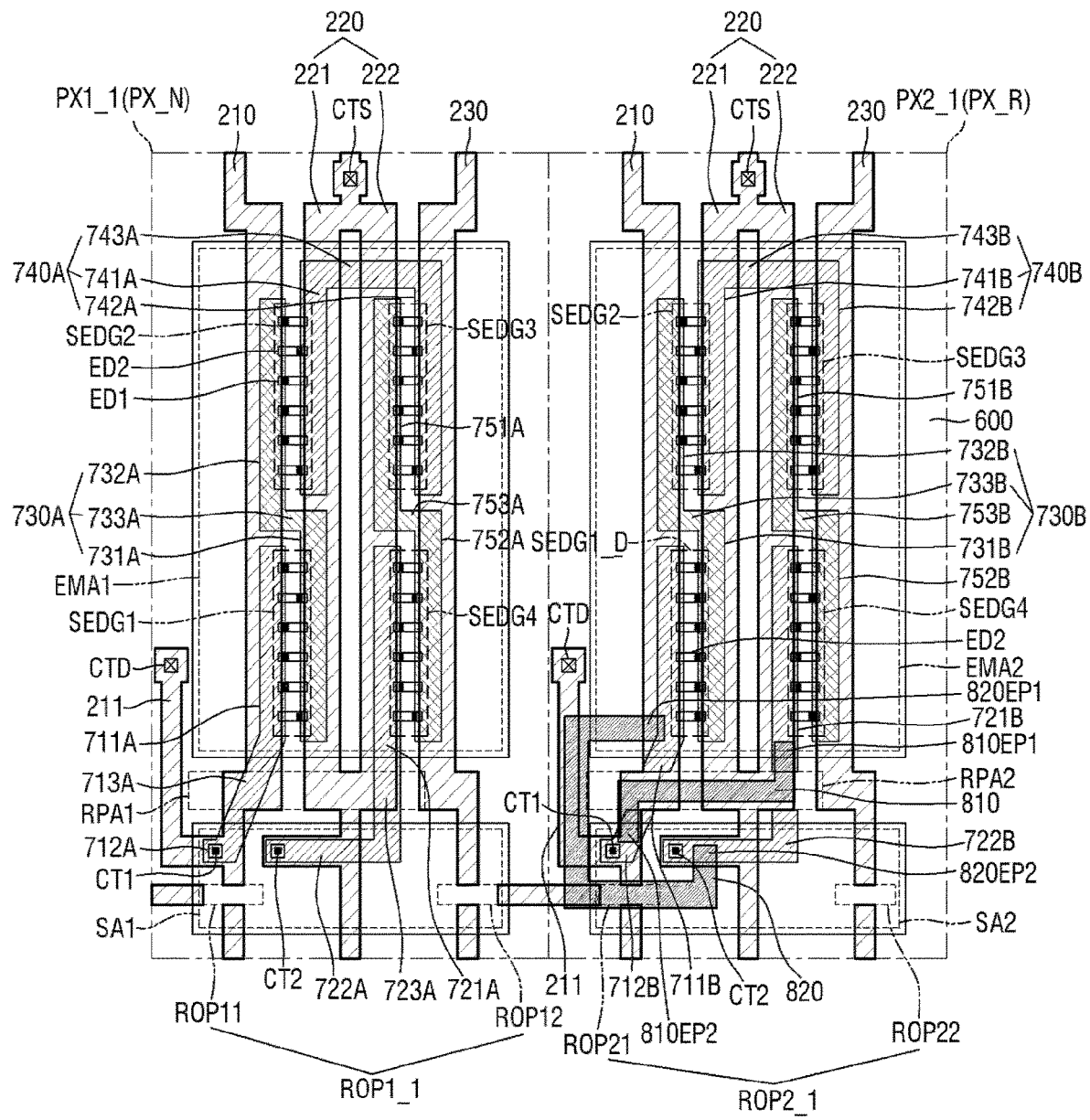
FIG. 21 is a schematic plan layout view illustrating a first pixel and a second pixel of a display device according to still another embodiment.
Figure 22:
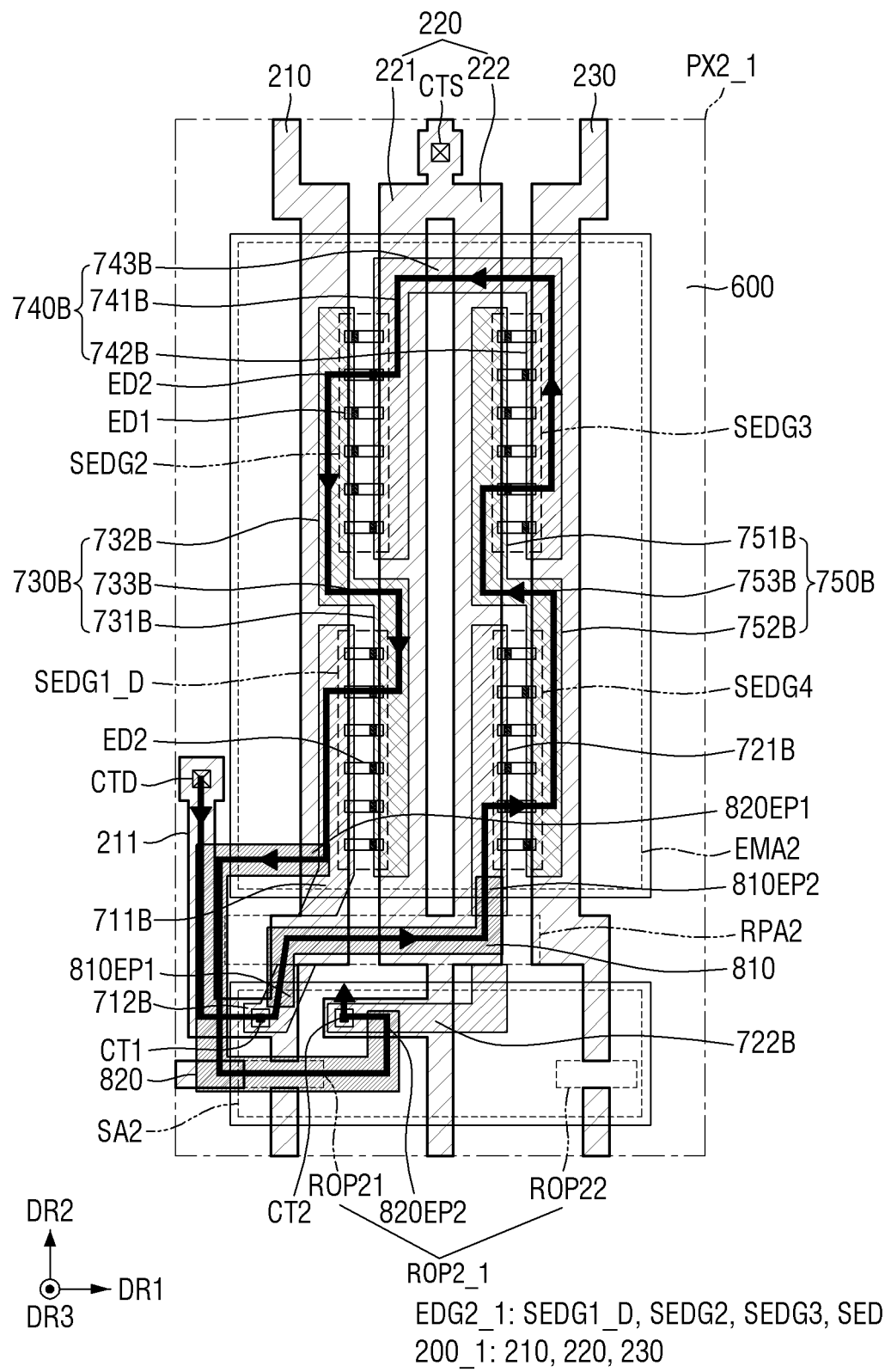
FIG. 22 is a schematic plan layout view illustrating the current flow in the second pixel (repair pixel) of FIG. 21.

FIG. 22 is a schematic plan layout view illustrating the current flow in the second pixel (repair pixel) of FIG. 21.

Referring to FIG. 22, the current may flow between the first electrode 210 electrically connected to the circuit element layer CCL through the first contact hole CTD and the second electrode 220 electrically connected to the circuit element layer CCL through the second contact hole CTS. The current may flow from the first electrode 210 to the second electrode 220.

The current flowing through the second pixel PX2_1 in response to the electrical signal applied to each of the first electrode 210 and the second electrode 220 may flow along the first electrode contact portion 712B, the first repair pattern 810, and the second contact electrode 721B through the third contact hole CT1. Since the first ends ED2_EP1 of the second light emitting elements ED2 included in the fourth sub-light emitting element group SEDG4 contact the second contact electrode 721B, the current may flow from the first ends ED2_EP1 to the second ends ED2_EP2 of the second light emitting elements ED2 included in the fourth sub-light emitting element group SEDG4. The current may not flow through the first light emitting elements ED1 included in the fourth sub-light emitting element group SEDG4.

Since the fifth contact electrode 750B contacts the second ends of the second light emitting elements ED2 included in the fourth sub-light emitting element group SEDG4 and the first ends of the second light emitting elements ED2 included in the third sub-light emitting element group SEDG3, the current may flow from the second ends of the second light emitting elements ED2 included in the fourth sub-light emitting element group SEDG4 to the first ends of the second light emitting elements ED2 included in the third sub-light emitting element group SEDG3 along the fifth contact electrode 750B. The current may flow from the first ends ED2_EP1 to the second ends ED2_EP2 of the second light emitting elements ED2 included in the third sub-light emitting element group SEDG3.

Since the fourth contact electrode 740B contacts the second ends of the second light emitting elements ED2 included in the third sub-light emitting element group SEDG3 and the first ends of the second light emitting elements ED2 included in the second sub-light emitting element group SEDG2, the current may flow from the second ends of the second light emitting elements ED2 included in the third sub-light emitting element group SEDG3 to the first ends of the second light emitting elements ED2 included in the second sub-light emitting element group SEDG2 along the fourth contact electrode 740B. The current may flow from the first ends ED2_EP1 to the second ends ED2_EP2 of the second light emitting elements ED2 included in the second sub-light emitting element group SEDG2.

Since the third contact electrode 730B contacts the second ends of the second light emitting elements ED2 included in the second sub-light emitting element group SEDG2 and the first ends of the second light emitting elements ED2 included in the first sub-light emitting element group SEDG1, the current may flow from the second ends of the second light emitting elements ED2 included in the second sub-light emitting element group SEDG2 to the first ends of the second light emitting elements ED2 included in the first sub-light emitting element group SEDG1 along the third contact electrode 730B. The current may flow from the first ends ED2_EP1 to the second ends ED2_EP2 of the second light emitting elements ED2 included in the first sub-light emitting element group SEDG1.

Since the second ends ED2_EP2 of the second light emitting elements ED2 included in the first sub-light emitting element group SEDG1 contact the first contact electrode 711B, the current may flow along the first contact electrode 711B, the second repair pattern 820, and the second electrode contact portion 722.

Therefore, as shown in FIG. 22, the second light emitting elements ED2 included in the second light emitting element group EDG2_1 may emit light by repairing the above-described defective pixel PX_D and changing the direction of the current. Therefore, the display quality of the display device 10 may be improved by repairing the defective pixel PX_D where a dark spot occurs.

Figure 23:
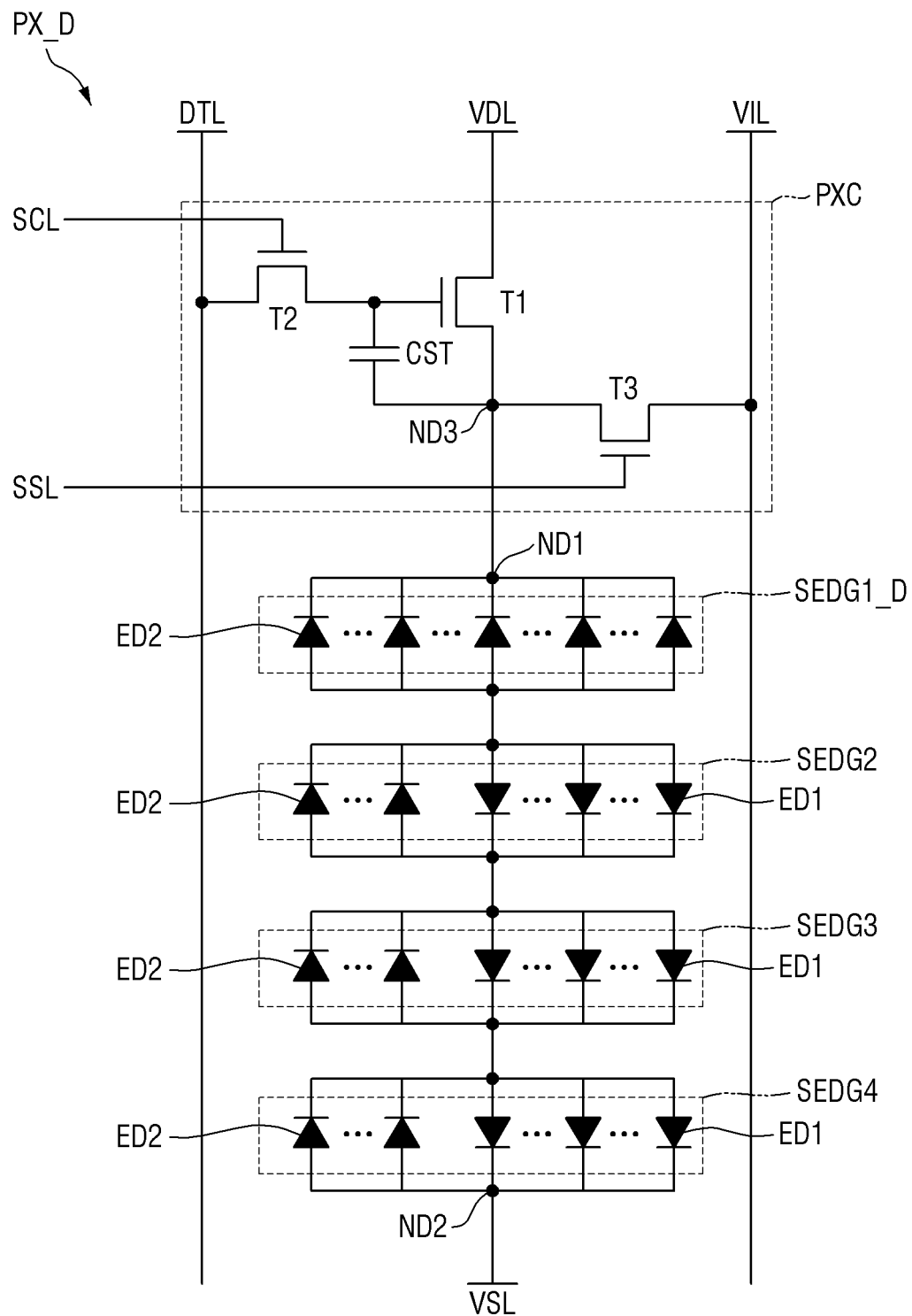
FIG. 23 is an equivalent circuit diagram of a defective pixel in which the alignment of light emitting elements included in a display device according to another embodiment is defective.
Figure 24:
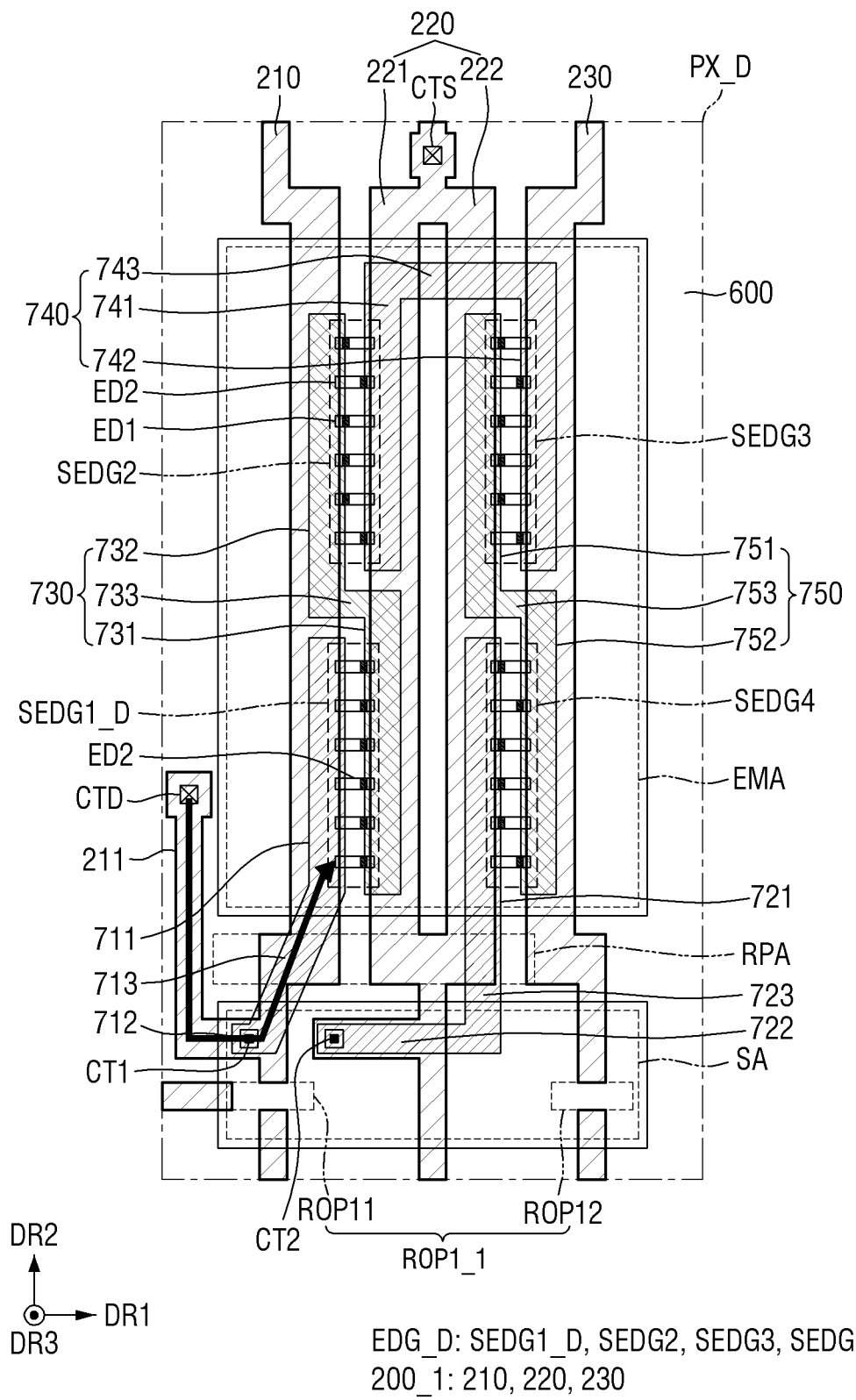
FIG. 24 is a schematic plan layout view of a defective pixel according to another embodiment.

FIG. 23 is an equivalent circuit diagram of a defective pixel in which the alignment of light emitting elements included in a display device according to another embodiment is defective. FIG. 24 is a schematic plan layout view of a defective pixel according to another embodiment.

Referring to FIG. 23, the defective pixel PX_D may include the defective light emitting element group EDG_D including the light emitting elements ED and the pixel driving circuit PXC. The defective light emitting element group EDG_D is electrically connected between the pixel driving circuit PXC and the second voltage line VSL.

The defective light emitting element group EDG_D may be disposed between the first node ND1 and the second node ND2. In the equivalent circuit diagram of the defective pixel PX_D, the first node ND1 may be electrically connected to the third node ND3 of the pixel driving circuit PXC, and the second node ND2 may be electrically connected to the second voltage line VSL. The first node ND1 may be understood as the first contact electrode 711 to be described below with reference to FIG. 24, and the second node ND2 may be understood as the second contact electrode 721 to be described below with reference to FIG. 24.

The defective light emitting element group EDG_D may include the sub-light emitting element groups SEDG1_D, SEDG2, SEDG3, and SEDG4 arranged between the first node ND1 and the second node ND2 and electrically connected in series to each other. The defective light emitting element group EDG_D may include the first to fourth sub-light emitting element groups SEDG1_D, SEDG2, SEDG3, and SEDG4. In an embodiment, the defective light emitting element group EDG_D may include at least one sub-defective light emitting element group. For example, the first sub-light emitting element group SEDG1_D of the defective light emitting element group EDG_D may be the defective sub-light emitting element group SEDG1_D that includes the second light emitting elements ED2 and does not include the first light emitting element ED1, and the second to fourth sub-light emitting element groups SEDG2, SEDG3, and SEDG4 may be normal sub-light emitting element groups.

A first end of the first sub-light emitting element group SEDG1_D may be electrically connected to the first node ND1, and a second end of the fourth sub-light emitting element group SEDG4 may be electrically connected to the second node ND2. Therefore, the second ends of the second light emitting elements ED2 included in the first sub-light emitting element group SEDG1_D and aligned on the first node ND1 may be electrically connected to the pixel driving circuit PXC, and the first ends of the second light emitting elements ED2 included in the first sub-light emitting element group SEDG1_D and aligned on the second node ND2 may be electrically connected to the second voltage line VSL. Therefore, the second light emitting elements ED2 included in the first sub-light emitting element group SEDG1_D may be aligned in the reverse direction between the first voltage line VDL and the second voltage line VSL. Therefore, the second light emitting elements ED2 included in the first sub-light emitting element group SEDG1_D are aligned in the reverse direction between the first voltage line VDL and the second voltage line VSL, so that there may be substantially no current flowing therethrough even if the electrical signal is applied to each of the first voltage line VDL and the second voltage line VSL. Therefore, since no current flows through the second light emitting elements ED2 included in the first sub-light emitting element group SEDG1_D, no current may flow through the light emitting elements ED included in the second to fourth sub-light emitting element groups SEDG2, SEDG3, and SEDG4 electrically connected in series with the first sub-light emitting element group SEDG1_D. Therefore, in case that the defective light emitting element group EDG_D includes at least one sub-light emitting element group including only the second light emitting elements ED2 aligned in the reverse direction, no current flows through the corresponding defective pixel PX_D, and the corresponding defective pixel PX_D may be displayed as a dark spot.

Referring to FIG. 24, the first ends ED2_EP1 of the second light emitting elements ED2 included in the first sub-light emitting element group SEDG1_D among the light emitting element groups EDG_D of the defective pixel PX_D may be disposed on the second electrode 220 (the first sub-electrode 221 of the second electrode 220), and the second ends ED2_EP2 of the second light emitting elements ED2 may be disposed the first electrode 210. For example, the first semiconductor layers 31 of the second light emitting elements ED2 may be disposed on the first electrode 210, and the second semiconductor layers 32 of the second light emitting elements ED2 may be disposed on the second electrode 220.

Therefore, since no current flows through the second light emitting elements ED2 included in the first sub-light emitting element group SEDG1_D, the corresponding defective pixel PX_D may be displayed as a dark spot.

Figure 25:
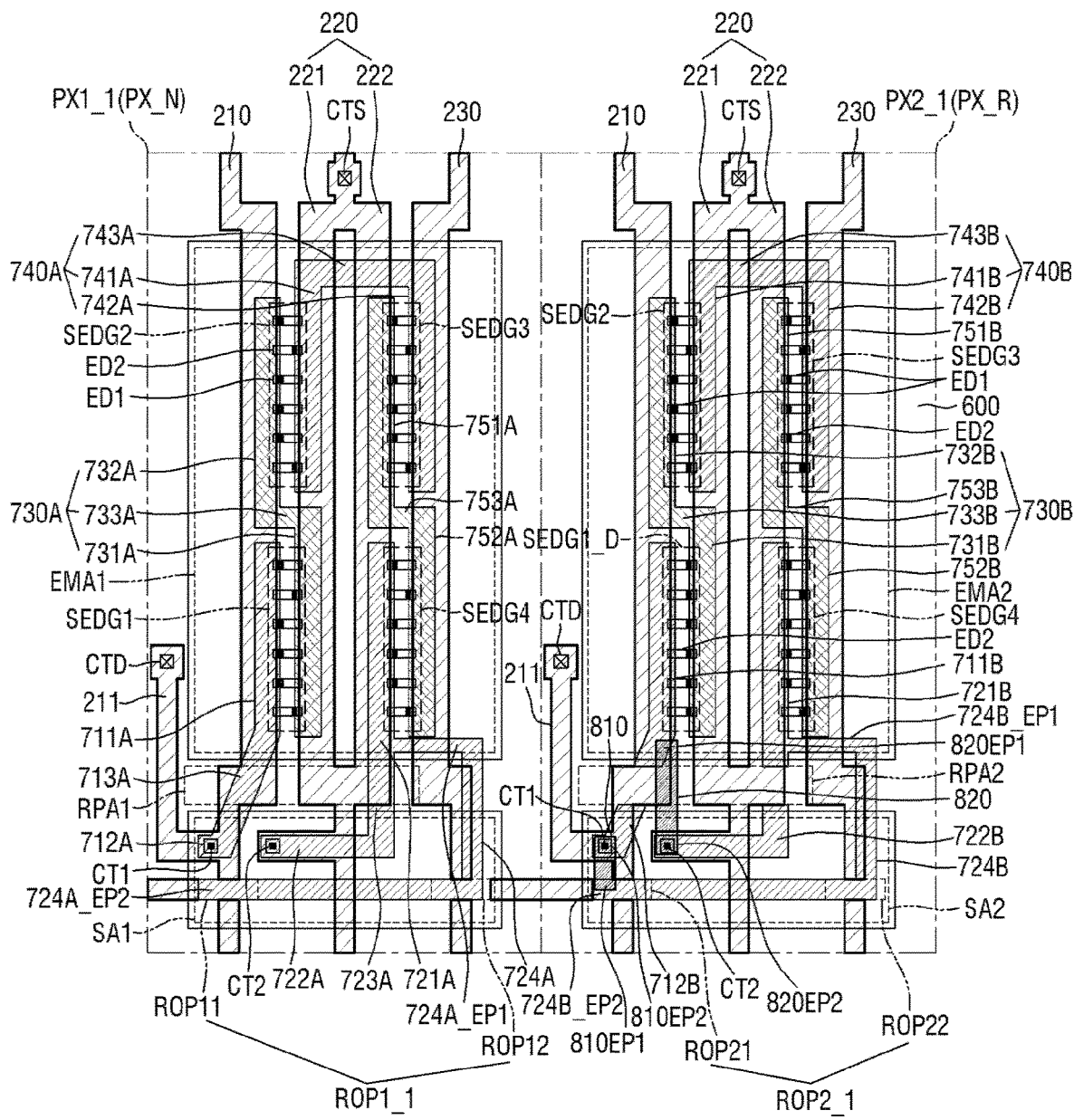
FIG. 25 is a schematic plan layout view illustrating a first pixel and a second pixel of a display device according to still another embodiment.

FIG. 25 is a schematic plan layout view illustrating a first pixel and a second pixel of a display device according to still another embodiment.

Referring to FIG. 25, the display device 10 is different from the embodiment of FIG. 21 in that it further includes repair auxiliary patterns 724A and 724B branched from the second contact electrodes 721A and 721B, respectively.

The repair auxiliary patterns 724A and 724B may be formed as a fourth conductive layer 700_1. First ends 724A_EP1 and 724B_EP1 of the repair auxiliary patterns 724A and 724B may be electrically connected to the second contact electrodes 721A and 721B, respectively, and second ends 724A_EP2 and 724B_EP2 of the repair auxiliary patterns 724A and 724B may be spaced apart from the first electrode contact portions 712A and 712B in the area adjacent to the first electrode contact portions 712A and 712B, respectively. In the embodiment, since the repair auxiliary patterns 724A and 724B are formed as the fourth conductive layer 700_1, the patterning process of forming the repair pattern in the repair process may become easy.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a substrate including a display area and a non-display area; and
   a first pixel disposed in the display area,
   wherein the first pixel includes:
      a first electrode and a second electrode disposed in the display area and spaced apart from each other;
      a first light emitting element group including a plurality of light emitting elements disposed between the first electrode and the second electrode;
      a first contact electrode disposed on the first electrode and electrically connected to an end of each of the plurality of light emitting elements;
      a second contact electrode disposed on the second electrode and electrically connected to another end of each of the plurality of light emitting elements;
      a first electrode contact portion disposed on the first electrode and electrically connected to the first electrode;
      a second electrode contact portion disposed on the second electrode and electrically connected to the second electrode;
      a first repair pattern electrically connecting the second contact electrode and the first electrode contact portion; and
      a second repair pattern electrically connecting the first contact electrode and the second electrode contact portion.

2. The display device of claim 1, wherein each of the plurality of light emitting elements of the first light emitting element group includes:
   a first semiconductor layer disposed at a first end of the each of the plurality of light emitting elements;

a second semiconductor layer spaced apart from the first semiconductor layer and disposed at a second end of the each of the plurality of light emitting elements; and an element active layer disposed between the first semiconductor layer and the second semiconductor layer.

3. The display device of claim 2, wherein the plurality of light emitting elements are aligned such that the first end of each of the plurality of light emitting elements is oriented in a same direction.

4. The display device of claim 2, further comprising:
a second pixel disposed in the display area,
wherein the second pixel includes:
  a third electrode and a fourth electrode disposed in the display area and spaced apart from each other;
  a second light emitting element group including a plurality of light emitting elements disposed between the third electrode and the fourth electrode;
  a third contact electrode disposed on the third electrode and electrically connected to an end of each of the plurality of light emitting elements of the second light emitting element group;
  a fourth contact electrode disposed on the fourth electrode and electrically connected to another end of each of the plurality of light emitting elements of the second light emitting element group;
  a third electrode contact portion disposed on the third electrode and electrically connected to the third electrode;
  a fourth electrode contact portion disposed on the fourth electrode and electrically connected to the fourth electrode;
  a first connection pattern electrically connecting the third contact electrode and the third electrode contact portion; and
  a second connection pattern electrically connecting the fourth contact electrode and the fourth electrode contact portion.

5. The display device of claim 4, wherein each of the plurality of light emitting elements of the second light emitting element group includes:
  a first semiconductor layer disposed at a first end of the each of the plurality of light emitting elements of the second light emitting element group;
  a second semiconductor layer disposed at a second end of the each of the plurality of light emitting elements of the second light emitting element group; and
  an element active layer disposed between the first semiconductor layer and the second semiconductor layer.

6. The display device of claim 5, wherein
the first end of each of the plurality of light emitting elements of the first light emitting element group is electrically connected to the first contact electrode, and
the first end of each of at least some of the plurality of light emitting elements of the second light emitting element group is electrically connected to the fourth contact electrode.

7. The display device of claim 1, further comprising:
a first power line to which a first power voltage is applied;
a transistor electrically connected to the first power line; and
a second power line to which a second power voltage lower than the first power voltage is applied, wherein
the first electrode is electrically connected to the transistor, and
the second electrode is electrically connected to the second power line.

8. The display device of claim 7, further comprising:
a first insulating layer disposed on the first electrode and the second electrode,
wherein the first insulating layer includes:
  a first opening exposing a part of the first electrode; and
  a second opening exposing a part of the second electrode.

9. The display device of claim 8, wherein
the first electrode contact portion electrically contacts a top surface of the first electrode exposed by the first opening; and
the second electrode contact portion electrically contacts a top surface of the second electrode exposed by the second opening.

10. The display device of claim 1, wherein
the first contact electrode electrically contacts the end of each of the plurality of the light emitting elements without contacting the first electrode, and
the second contact electrode electrically contacts another end of each of the plurality of the light emitting elements without contacting the second electrode.

11. The display device of claim 1, wherein the first contact electrode, the second contact electrode, the first electrode contact portion, and the second electrode contact portion are spaced apart from each other.

12. The display device of claim 1, wherein
the first contact electrode and the first electrode contact portion are disposed on a same layer, and
the second contact electrode and the second electrode contact portion are disposed on a same layer.

13. The display device of claim 12, wherein
the first repair pattern is disposed on the second contact electrode and the first electrode contact portion, and
the second repair pattern is disposed on the first contact electrode and the second electrode contact portion.

14. The display device of claim 12, further comprising:
a repair auxiliary pattern disposed between the second contact electrode and the first electrode contact portion,
wherein the repair auxiliary pattern is integral with the second contact electrode and is spaced apart from the first electrode contact portion.

15. The display device of claim 14, wherein the first repair pattern is disposed on the first electrode contact portion and the repair auxiliary pattern.

16. The display device of claim 1, wherein the first repair pattern and the second repair pattern are spaced apart from each other.

* * * * *